(12) United States Patent
Nosaka

(10) Patent No.: US 10,630,257 B2
(45) Date of Patent: Apr. 21, 2020

(54) ACOUSTIC WAVE FILTER DEVICE, MULTIPLEXER, RADIO-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/293,744

(22) Filed: Mar. 6, 2019

(65) Prior Publication Data

US 2019/0199321 A1 Jun. 27, 2019

Related U.S. Application Data

(63) Continuation of application No. PCT/JP2017/031951, filed on Sep. 5, 2017.

(30) Foreign Application Priority Data

Sep. 13, 2016 (JP) ................................ 2016-178690
Mar. 7, 2017 (JP) ................................ 2017-043211

(51) Int. Cl.
*H03H 9/145* (2006.01)
*H03H 9/54* (2006.01)
(Continued)

(52) U.S. Cl.
CPC .... *H03H 9/14544* (2013.01); *H03H 9/02637* (2013.01); *H03H 9/02866* (2013.01);
(Continued)

(58) Field of Classification Search
CPC .......... H03H 9/14544; H03H 9/02637; H03H 9/02866; H03H 9/25; H03H 9/6483; H03H 9/6489; H03H 9/72; H04B 1/44
(Continued)

(56) References Cited

U.S. PATENT DOCUMENTS

2004/0041243 A1\* 3/2004 Ogawa ................ H01L 23/3121
257/668
2007/0046395 A1\* 3/2007 Tsutsumi ............. H03H 9/0571
333/133
(Continued)

FOREIGN PATENT DOCUMENTS

JP 64-68114 A 3/1989
JP 2008-109413 A 5/2008
(Continued)

OTHER PUBLICATIONS

Official Communication issued in International Patent Application No. PCT/JP2017/031951, dated Nov. 28, 2017.

*Primary Examiner* — Michael R Neff
(74) *Attorney, Agent, or Firm* — Keating & Bennett, LLP

(57) ABSTRACT

A filter includes a parallel arm resonator and an interdigital capacitor. The parallel arm resonator has an IDT electrode defined by first electrode fingers. The interdigital capacitor is defined by second electrode fingers and is connected to the parallel arm resonator. The electrode finger pitch of the second electrode fingers is smaller than the electrode finger pitch of the first electrode fingers. The film thickness of the second electrode fingers is smaller than the film thickness of the first electrode fingers. A self-resonant frequency of the interdigital capacitor is higher than a pass band of the filter.

20 Claims, 30 Drawing Sheets

(51) Int. Cl.
    *H03H 9/72*     (2006.01)
    *H03H 9/64*     (2006.01)
    *H03H 9/02*     (2006.01)
    *H03H 9/25*     (2006.01)
    *H04B 1/44*     (2006.01)

(52) U.S. Cl.
    CPC .... *H03H 9/14541* (2013.01); *H03H 9/14582* (2013.01); *H03H 9/25* (2013.01); *H03H 9/542* (2013.01); *H03H 9/6403* (2013.01); *H03H 9/6483* (2013.01); *H03H 9/6489* (2013.01); *H03H 9/72* (2013.01); *H03H 9/725* (2013.01); *H04B 1/44* (2013.01)

(58) Field of Classification Search
    USPC ........................................................ 375/219
    See application file for complete search history.

(56) References Cited

U.S. PATENT DOCUMENTS

| | | | |
|---|---|---|---|
| 2008/0129418 A1 | 6/2008 | Miura et al. | |
| 2010/0194494 A1* | 8/2010 | Inoue | H03H 7/42 |
| | | | 333/133 |
| 2010/0291946 A1 | 11/2010 | Yamakawa et al. | |
| 2017/0005638 A1 | 1/2017 | Otagawa et al. | |
| 2017/0279432 A1 | 9/2017 | Murase | |
| 2018/0041194 A1* | 2/2018 | Ito | H03H 9/25 |

FOREIGN PATENT DOCUMENTS

| | | |
|---|---|---|
| WO | 2009/072251 A1 | 6/2009 |
| WO | 2014/034492 A1 | 3/2014 |
| WO | 2015/156232 A1 | 10/2015 |
| WO | 2016/111315 A1 | 7/2016 |

* cited by examiner

SELF-RESONANT FREQUENCY OF CAPACITOR

THICKNESS OF ELECTRODE FINGERS
= 0.020 × ELECTRODE FINGER PITCH
ELECTRODE FINGER PITCH OF SERIES
ARM RESONATOR s1=2.12 μm

----- ELECTRODE FINGER PITCH OF INTERDIGITAL CAPACITOR=0.75 μm
───── ELECTRODE FINGER PITCH OF INTERDIGITAL CAPACITOR=1.75 μm
─·─·─ ELECTRODE FINGER PITCH OF INTERDIGITAL CAPACITOR=2.50 μm
······· ELECTRODE FINGER PITCH OF INTERDIGITAL CAPACITOR=4.00 μm

ACOUSTIC WAVE FILTER DEVICE, MULTIPLEXER, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-178690 filed on Sep. 13, 2016 and Japanese Patent Application No. 2017-043211 filed on Mar. 7, 2017, and is a Continuation Application of PCT Application No. PCT/JP2017/031951 filed on Sep. 5, 2017. The entire contents of each of these applications are hereby incorporated herein by reference.

BACKGROUND OF THE INVENTION

1. Field of the Invention

The present invention relates to an acoustic wave filter device including an acoustic wave resonator, a multiplexer, a radio-frequency front-end circuit, and a communication apparatus.

2. Description of the Related Art

Hitherto, in an acoustic wave filter device including an interdigital capacitor and an acoustic wave resonator, it is known that the pitch of plural electrode fingers of the interdigital capacitor is set to be smaller than that of the acoustic wave resonator (see Japanese Unexamined Patent Application Publication No. 1-68114, for example). With this configuration, more pairs of electrode fingers of the interdigital capacitor can be disposed within a limited layout area, thus making it possible to increase the capacitance of the interdigital capacitor.

In an acoustic wave filter device including an interdigital capacitor and an acoustic wave resonator, in order to reduce the loss within the pass band and also to enhance the sharpness of an attenuation slope (sharpness at an edge of the pass band), it is desirable to achieve both of a required Q factor of the acoustic wave resonator and that of the interdigital capacitor (capacitor Q).

The self-resonant frequency of the interdigital capacitor at which the Q factor is locally decreased is shifted to the higher-frequency side by decreasing the pitch of the electrode fingers of the interdigital capacitor. As in the above-described configuration of the related art, by setting the pitch of the plural electrode fingers of the interdigital capacitor to be smaller than that of the acoustic wave resonator, it is likely to achieve both of the required Q factor of the acoustic wave resonator and that of the interdigital capacitor (capacitor Q).

In actuality, however, in the above-described configuration of the related art, if the film thickness of the electrode fingers of the interdigital capacitor is the same as or greater than that of the acoustic wave resonator, the following problems occur.

One problem is that, typically, the minimum pitch of conventional electrode fingers is restricted by the film thickness of the electrode fingers due to the manufacturing processes. There are thus limitations on shifting the self-resonant frequency of an interdigital capacitor to the higher-frequency side by decreasing the pitch of the electrode fingers of the interdigital capacitor. As a result, in a filter formed by a circuit including an acoustic wave resonator and an interdigital capacitor, the Q factor of the interdigital capacitor within the pass band of the filter is decreased.

Another problem is that the self-resonant frequency of a conventional interdigital capacitor is shifted to the higher-frequency side by decreasing the pitch of the electrode fingers of the interdigital capacitor. In this case, in order to shift the self-resonant frequency by a range in which it does not influence the filter characteristics, it is necessary to design the film thickness of the electrode fingers of the interdigital capacitor to be thin. However, if the film thickness of the electrode fingers of the interdigital capacitor is the same as or greater than that of the acoustic wave resonator, it is difficult to achieve a required Q factor of the acoustic wave resonator.

It is thus difficult to achieve both of a required Q factor of the acoustic wave resonator and that of the interdigital capacitor. This makes it hard to reduce the loss within the pass band and to enhance the sharpness of an attenuation slope.

SUMMARY OF THE INVENTION

Accordingly, preferred embodiments of the present invention provide acoustic wave filter devices, multiplexers, radio-frequency front-end circuits, and communication apparatuses that are each capable of reducing the loss within a pass band and enhancing the sharpness of an attenuation slope by achieving both of a required Q factor of an acoustic wave resonator and that of an interdigital capacitor.

An acoustic wave filter device according to a preferred embodiment of the present invention includes a first acoustic wave resonator and an interdigital capacitor. The first acoustic wave resonator includes an InterDigital Transducer (IDT) electrode defined by a plurality of first electrode fingers. The interdigital capacitor is defined by a plurality of second electrode fingers and is connected to the first acoustic wave resonator. The pitch of the plurality of second electrode fingers is smaller than the pitch of the plurality of first electrode fingers. The film thickness of the plurality of the second electrode fingers is smaller the pitch of the plurality of first electrode fingers. The self-resonant frequency of the interdigital capacitor is higher than a pass band of the acoustic wave filter device.

As the pitch of the second electrode fingers of the interdigital capacitor is smaller, the self-resonant frequency at which the Q factor (capacitor Q) of the interdigital capacitor is locally decreased shifts to a higher-frequency side. The pitch of the second electrode fingers of the interdigital capacitor is thus set to be smaller than the pitch of the first electrode fingers of the first acoustic wave resonator so as to shift the self-resonant frequency of the interdigital capacitor farther to the higher-frequency side than the pass band of the acoustic wave filter device, thus making it possible to increase the Q factor of the interdigital capacitor in the pass band. If the self-resonant frequency of the interdigital capacitor coincides with the resonant frequency or the anti-resonant frequency of the first acoustic wave resonator, the Q factor obtained by the combined characteristics of the first acoustic wave resonator and the interdigital capacitor at the resonant frequency or the anti-resonant frequency is decreased due to the decreased Q factor of the interdigital capacitor connected to the first acoustic wave resonator. Because of the above-described reason, the pitch of the second electrode fingers of the interdigital capacitor is decreased so as to shift the self-resonant frequency of the interdigital capacitor to the higher-frequency side than the resonant frequency or the anti-resonant frequency of the first acoustic wave resonator. This makes it less likely to reduce the Q factor of the combined characteristics of the first acoustic wave resonator and the interdigital capacitor. As a result, the required Q factor is able to be obtained. Because of the manufacturing requirements, however, the pitch of the first and second electrode fingers is restricted by the film thickness of the first and second electrode fingers. Accordingly, the film thickness of the second electrode fingers of the interdigital capacitor is made smaller than the film thickness of the first electrode fingers of the first acoustic wave resonator. This reduces the pitch of the second electrode fingers of the interdigital capacitor to be even smaller, thus making it easier to achieve both of the required Q factor of the acoustic wave resonator and that of the interdigital capacitor. As a result, in an acoustic wave filter device according to a preferred embodiment of the present invention, it is possible to reduce the loss in the pass band and also to enhance the sharpness of the attenuation slope by achieving both of the required Q factor of the acoustic wave resonator and that of the interdigital capacitor.

The interdigital capacitor may be connected to the first acoustic wave resonator without another acoustic wave resonator being interposed therebetween.

In such a first acoustic wave resonator, the combined characteristics of the first acoustic wave resonator and the interdigital capacitor are easily influenced by the characteristics of the interdigital capacitor, in particular, by the Q factor. Setting the pitch of the first and second electrode fingers and the film thickness of the first acoustic wave resonator and those of the interdigital capacitor to satisfy the above-described relationships is particularly effective in reducing the loss within the pass band and enhancing the sharpness of the attenuation slope.

The duty ratio of the interdigital capacitor may be greater than that of the first acoustic wave resonator. The duty ratio of the interdigital capacitor is a ratio of the width of each of the plurality of second electrode fingers of the interdigital capacitor to the pitch of the plurality of second electrode fingers. The duty ratio of the first acoustic wave resonator is a ratio of the width of each of the plurality of first electrode fingers of the first acoustic wave resonator to the pitch of the plurality of first electrode fingers.

This configuration is able to increase the capacitance per unit area of the interdigital capacitor, thus making it possible to reduce the size of the acoustic wave filter device and also to enhance space-saving characteristics.

The first acoustic wave resonator and the interdigital capacitor may define a first resonance circuit disposed on one of first and second paths. The first path connects first and second input-output terminals. The second path connects a ground and a node provided on the first path. The acoustic wave filter device may further include a second resonance circuit. The second resonance circuit may include one or more second acoustic wave resonators. The second resonance circuit may be disposed on the other one of the first and second paths and determine the pass band together with the first resonance circuit.

A band pass filter is defined by using the first resonance circuit that achieves both of the required Q factor of the first acoustic wave resonator and that of the interdigital capacitor. It is thus possible to implement a band pass filter exhibiting high filter characteristics. Additionally, with the combined characteristics of the first acoustic wave resonator and the interdigital capacitor, the difference between the resonant frequency and the anti-resonant frequency can be made smaller than with the characteristics of the acoustic wave resonator alone. This makes it possible to obtain sharp (high selectivity) attenuation characteristics.

The first resonance circuit may be disposed on the second path. The second resonance circuit may be disposed on the first path. The first resonance circuit may further include a switch element. The switch element may be connected in parallel with the interdigital capacitor to define a variable frequency circuit together with the interdigital capacitor. The variable frequency circuit is used in varying the frequency of the first acoustic wave resonator. The variable frequency circuit may be connected in series with the first acoustic wave resonator between the node and the ground.

With this configuration, it is possible to shift the frequency of the attenuation pole on at least one of the low-frequency side and the high-frequency side of the pass band as a result of the switch element being switched between ON and OFF, thus implementing a tunable filter that switches the pass band.

The first resonance circuit may further include a third acoustic wave resonator. The third acoustic wave resonator may be connected in parallel with a series circuit of the first acoustic wave resonator and the variable frequency circuit. The resonant frequency of the third acoustic wave resonator may be different from that of the first acoustic wave resonator. The anti-resonant frequency of the third acoustic wave resonator may be different from that of the first acoustic wave resonator.

It is thus possible to implement a tunable filter that is able to shift the frequency of at least one of the attenuation pole on the low-frequency side and that on the high-frequency side of the pass band.

The resonant frequency of the third acoustic wave resonator may be lower than that of the first acoustic wave resonator. The anti-resonant frequency of the third acoustic wave resonator may be lower than that of the first acoustic wave resonator. The variable frequency circuit may be connected in series with only the first acoustic wave resonator of the first and third acoustic wave resonators.

With this configuration, it is possible to implement a tunable filter that is able to shift the frequency of the attenuation pole on the high-frequency side of the pass band to a higher-frequency range and to shift the pass band to a higher-frequency range without increasing the insertion loss at the low edge of the pass band.

The resonant frequency of the third acoustic wave resonator may be higher than that of the first acoustic wave resonator. The anti-resonant frequency of the third acoustic wave resonator may be higher than that of the first acoustic wave resonator. The variable frequency circuit may be connected in series with only the first acoustic wave resonator of the first and third acoustic wave resonators.

With this configuration, it is possible to implement a tunable filter that is able to shift the frequency of the attenuation pole on the low-frequency side of the pass band to a higher-frequency range and to shift the pass band to a higher-frequency range without increasing the insertion loss at the low edge of the pass band.

The variable frequency circuit may be connected in series with a parallel circuit of the first and third acoustic wave resonators.

With this configuration, it is possible to implement a tunable filter that is able to shift the frequencies of the attenuation poles on both sides of the pass band to a higher-frequency range.

The first resonance circuit may further include a third acoustic wave resonator and a different variable frequency circuit connected in series with the third acoustic wave resonator. A series circuit of the third acoustic wave resonator and the different variable frequency circuit may be connected in parallel with a series circuit of the first acoustic wave resonator and the variable frequency circuit.

With this configuration, it is possible to shift the frequency of the attenuation pole on the high-frequency side and that on the low-frequency side of the pass band to a higher-frequency range and to shift the pass band to a higher-frequency range without increasing the insertion loss on the high-frequency side and the low edge of the pass band. It is thus possible to implement a tunable filter that is able to shift the center frequency while maintaining the bandwidth, for example.

The variable frequency circuit may further include an inductor connected in series with the switch element. A series circuit of the switch element and the inductor may be connected in parallel with the interdigital capacitor.

This configuration provides a tunable filter that is able to vary the frequency of the pass band by a wide range.

The first resonance circuit may be disposed on the first path. The second resonance circuit may be disposed on the second path. The first acoustic wave resonator and the interdigital capacitor may be connected in parallel with each other.

This configuration enhances the sharpness on the high-frequency side of the pass band without increasing the loss within the pass band.

The first resonance circuit may further include a switch element. The switch element may be connected in series with the interdigital capacitor to define a variable frequency circuit together with the interdigital capacitor. The variable frequency circuit may be connected in parallel with the first acoustic wave resonator.

This configuration makes it possible to implement a tunable filter that is able to shift the frequency of the attenuation pole on the high-frequency side of the pass band to a higher-frequency range.

The film thickness of the plurality of electrode fingers of the interdigital capacitor may be about 40% or smaller than the pitch of the plurality of electrode fingers of the interdigital capacitor.

Because of the manufacturing requirements, the maximum value of the film thickness of the electrode fingers is restricted by the pitch of the electrode fingers. By containing the film thickness of the electrode fingers of the interdigital capacitor within an appropriate range, an interdigital capacitor that achieves the required Q factor can be fabricated, and a tunable filter including such an interdigital capacitor can be implemented.

The pitch of the plurality of electrode fingers of the interdigital capacitor may be about 80% or smaller than that of the first acoustic wave resonator.

The inventors of preferred embodiments of the present invention discovered that increasing the pitch of the second electrode fingers to be close to the pitch of the first electrode fingers may cause the following problem. The self-resonant frequency of the interdigital capacitor approaches the anti-resonant frequency of the first acoustic wave resonator. This may reduce the Q factor obtained by the combined characteristics of the first acoustic wave resonator and the interdigital capacitor at the anti-resonant frequency due to the decreased capacitor Q of the interdigital capacitor at the self-resonant frequency. Containing the pitch of the second electrode fingers within an appropriate range makes it more likely to achieve the required Q factor obtained by the combined characteristics of the first acoustic wave resonator and the interdigital capacitor.

A multiplexer according to a preferred embodiment of the present invention includes a common terminal, a first filter that is the acoustic wave filter device according to the above-discussed preferred embodiments of the present invention, and at least one second filter. The first input-output terminal of the first filter is directly or indirectly connected to the common terminal. One of input-output terminals of the at least one second filter is directly or indirectly connected to the common terminal. The center frequency of a pass band of each of the at least one second filter is higher than that of the first filter. The first filter includes at least one resonance circuit disposed on the first path. The at least one resonance circuit includes the first resonance circuit. In the first filter, the first resonance circuit is connected to the first input-output terminal without another resonance circuit being interposed therebetween.

A bulk wave loss occurs in an acoustic wave resonator in a frequency range higher than the anti-resonant frequency, thus decreasing the Q factor of the capacitance components in this frequency range. In terms of such properties of an acoustic wave resonator, the interdigital capacitor is connected in parallel with the first acoustic wave resonator, which is a series arm resonator. With this configuration, an input signal (power) is distributed between the first acoustic wave resonator and the interdigital capacitor, thus reducing the bulk wave loss in the first acoustic wave resonator, which is a series arm resonance circuit, as a whole. In the first filter, the first resonance circuit is connected to the first input-output terminal without another resonance circuit interposed therebetween, that is, the first resonance circuit is connected and positioned most closely to the first input-output terminal. This makes it less likely to increase the loss within the pass band of the second filter.

A multiplexer according to a preferred embodiment of the present invention includes a common terminal, a first filter that is the acoustic wave filter device according to the above-described preferred embodiments of the present invention, and at least one second filter. The first input-output terminal of the first filter is directly or indirectly connected to the common terminal. One of input-output terminals of the at least one second filter is directly or indirectly connected to the common terminal. The center frequency of a pass band of each of the at least one second filter is higher than that of the first filter. The first filter includes at least one resonance circuit disposed on the first path. The at least one resonance circuit includes the first resonance circuit. In the first filter, the first resonance circuit is connected to the first input-output terminal without another resonance circuit interposed therebetween.

With this configuration, as a result of the switch element being switched between ON and OFF, it is possible to vary the frequency of the attenuation pole on the high-frequency side of the pass band of the first filter.

The multiplexer may further include a switch circuit including a switch common terminal and first and second selection terminals. The first selection terminal is connected to the second input-output terminal. The second selection terminal is connected to the other one of the input-output terminals of the second filter. The switch circuit switches between connection of the switch common terminal to the first selection terminal and connection of the switch common terminal to the second selection terminal. When the switch common terminal and the second selection terminal are connected to each other, the switch element may be in the ON state.

With this configuration, when the switch common terminal and the second selection terminal are connected to each other, that is, when the second filter is selected by the switch circuit, the bulk wave loss caused by the first filter can be reduced. As a result, the loss within the pass band of the second filter can be reduced when the second filter is selected.

A radio-frequency front-end circuit according to a preferred embodiment of the present invention includes one of the above-described acoustic wave filter devices and an amplifier circuit connected to the acoustic wave filter device.

It is thus possible to provide a radio-frequency front-end circuit that achieves small-loss, high-selectivity characteristics.

A communication apparatus according to a preferred embodiment of the present invention includes an RF signal processing circuit and the above-described radio-frequency front-end circuit. The RF signal processing circuit processes a radio-frequency signal received by an antenna device and a radio-frequency signal to be transmitted by the antenna device. The radio-frequency front-end circuit transfers the radio-frequency signals between the antenna device and the RF signal processing circuit.

It is thus possible to provide a communication apparatus that achieves small-loss, high-selectivity characteristics. In acoustic wave filter devices, multiplexers, radio-frequency front-end circuits, and communication apparatuses according to preferred embodiments of the present invention, it is possible to reduce the loss within a pass band and to enhance the sharpness of an attenuation slope by achieving both of a required Q factor of an acoustic wave resonator and that of an interdigital capacitor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
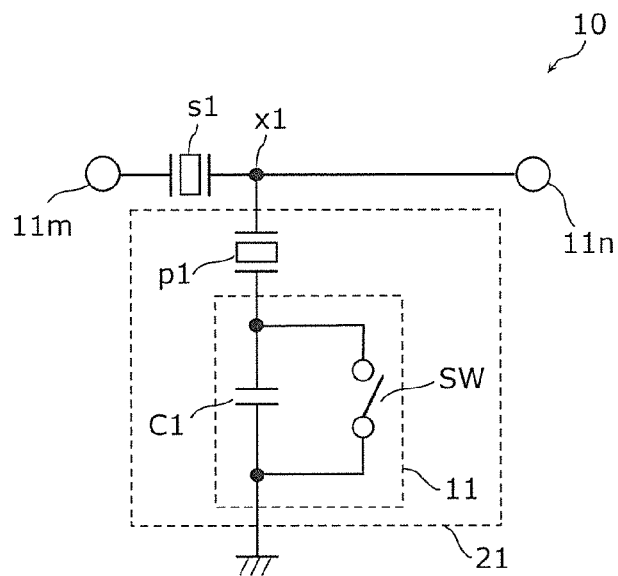
FIG. 1A is a circuit diagram of a filter according to a first preferred embodiment of the present invention.

Preferred embodiments of the present invention will be described below in detail by using examples and the drawings. All of the preferred embodiments described below illustrate general or specific examples. Numeric values, configurations, materials, components, and positions and connection states of the components illustrated in the following preferred embodiments are only examples, and are not described for limiting the present invention. Among the components illustrated in the following preferred embodiments, the components that are not recited in the independent claims will be described as optional components. The sizes and dimensional ratios of the components in the drawings are not necessarily illustrated as actual sizes and ratios. In the individual drawings, substantially the same configurations are designated by the same reference numeral, and an explanation thereof may not be repeated or may be simplified from the second time. In the following description, each switch will be explained as an ideal switch in which, when the switch is OFF (that is, in the non-conducting state), capacitance components are zero (that is, impedance is infinite), and when the switch is ON (that is, in the conducting state), resistance components are zero (that is, impedance is zero).

First Preferred Embodiment

FIG. 1A is a circuit diagram of a filter 10 according to a first preferred embodiment of the present invention.

The filter 10 is a radio-frequency filter circuit disposed in a front-end portion of a multimode/multiband-support cellular phone, for example. The filter 10 is a band pass filter which is integrated in a multiband-support cellular phone compliant with the communication standards, such as 3GPP (Third Generation Partnership Project), and causes radio-frequency signals of a predetermined band to selectively pass through the filter 10. The filter 10 is an acoustic wave filter device that causes radio-frequency signals to selectively pass therethrough by using acoustic waves.

As shown in FIG. 1A, the filter 10 includes a series arm resonator s1, a parallel arm resonator p1, an interdigital capacitor C1, and a switch SW.

The series arm resonator s1 is connected between an input-output terminal 11m (first input-output terminal) and an input-output terminal 11n (second input-output terminal). That is, the series arm resonator s1 is a resonance circuit (second resonance circuit) disposed on a path connecting the input-output terminals 11m and 11n. An element disposed on this path is not restricted to the series arm resonator s1, and any series arm resonance circuit constituted by at least one acoustic wave resonator may be disposed on the path. In this preferred embodiment, the series arm resonance circuit is preferably defined by one acoustic wave resonator. However, it may be defined by plural acoustic wave resonators. Examples of the series arm resonance circuit defined by plural acoustic wave resonators are a longitudinally coupled resonator defined by plural acoustic wave resonators or plural series-connected resonators divided from one acoustic wave resonator. Using a longitudinally coupled resonator, for example, as the series arm resonance circuit, can respond to the required filter characteristics, such as enhanced attenuation.

The parallel arm resonator p1 is a first parallel arm resonator connected between a ground (reference terminal) and a node (node x1 in FIG. 1A) provided on the path connecting the input-output terminals 11m and 11n. That is, the parallel arm resonator p1 is a resonator disposed on a path connecting the ground and the node x1 provided on the path connecting the input-output terminals 11m and 11n.

This parallel arm resonator p1 has a resonant frequency on the lower-frequency side than the pass band of the filter 10 and has an anti-resonant frequency within the pass band.

In this preferred embodiment, the resonant frequency of the parallel arm resonator p1 is lower than that of the series arm resonator s1, and the anti-resonant frequency of the parallel arm resonator p1 is lower than that of the series arm resonator s1.

The resonant frequency of a resonator is the frequency of a "resonance point", which is the singularity point at which the impedance of this resonator is reduced or minimized (ideally zero). The anti-resonant frequency of a resonator is the frequency of an "anti-resonance point", which is the singularity point at which the impedance of this resonator is increased or maximized (ideally infinite). For the sake of convenience, in the following description, concerning a circuit defined by plural resonators or impedance elements, as well as concerning a single resonator, the singularity point at which the impedance is minimized (ideally zero) will be called the "resonance point" and the frequency of the resonance point will be called the "resonant frequency". The singularity point at which the impedance is maximized (ideally infinite) will be called the "anti-resonance point" and the frequency of the anti-resonance point will be called the "anti-resonant frequency".

In this preferred embodiment, the parallel arm resonator p1 is preferably defined by one acoustic wave resonator. However, the parallel arm resonator p1 may be defined by plural series-connected or parallel-connected resonators divided from one acoustic wave resonator.

The interdigital capacitor C1 is connected between a ground (reference terminal) and a node (node x1 in FIG. 1A) provided on the path connecting the input-output terminals 11m and 11n. The interdigital capacitor C1 is defined by an interdigital electrode, which will be discussed later. The interdigital capacitor C1 has a self-resonance point at which the impedance is locally increased (that is, the capacitance is locally decreased) on the higher-frequency side than the pass band of the filter 10. The frequency of this self-resonance point is called the "self-resonant frequency". The self-resonant frequency of the interdigital capacitor C1 is dependent on the structure of the interdigital electrode, for example, which will be discussed later.

In this preferred embodiment, the parallel arm resonator p1 and the interdigital capacitor C1 are connected in series with each other and are connected between the node x1 and the ground. In this preferred embodiment, the parallel arm resonator p1 is connected at one terminal to the node x1 and at the other terminal to one terminal of the interdigital capacitor C1. The interdigital capacitor C1 is connected at one terminal to the other terminal of the parallel arm resonator p1 and at the other terminal to the ground. The connection order of the parallel arm resonator p1 and the interdigital capacitor C1 is not restricted to the above-described order and may be reversed.

In this preferred embodiment, the switch SW is a switch element connected in parallel with the interdigital capacitor C1 and provides a variable frequency circuit 11 together with the interdigital capacitor C1. The switch SW is switched between ON (conduction state) and OFF (non-conduction state) in accordance with a control signal from a controller, such as an RF signal processing circuit (RFIC: Radio Frequency Integrated Circuit). The variable frequency circuit 11 changes the frequency of a first acoustic wave resonator (resonant frequency of the parallel arm resonator p1 in this preferred embodiment) to which the variable frequency circuit 11 is connected.

To reduce the size of the switch SW, a FET (Field Effect Transistor) switch made of GaAs or CMOS (Complementary Metal Oxide Semiconductor) or a diode switch is preferably used as the switch SW.

In this preferred embodiment, the variable frequency circuit 11 is connected in series with the first acoustic wave resonator (parallel arm resonator p1 in this preferred embodiment) between the node x1 and the ground. By including the variable frequency circuit 11, the filter 10 implements a tunable filter that can change the pass band as a result of the switch SW being switched between ON and OFF.

The parallel arm resonator p1 and the interdigital capacitor C1 (and the switch SW in this preferred embodiment) provide a parallel arm resonance circuit 21 which is disposed on a second path connecting the ground and the node x1 provided on a first path connecting the input-output terminals 11m and 11n. That is, the parallel arm resonance circuit 21 is preferably disposed on one parallel arm connecting the series arm and the ground. With this configuration, the filter 10 includes a one-stage ladder filter structure including the series arm resonator s1 and the parallel arm resonance circuit.

That is, the parallel arm resonance circuit 21 disposed on the second path determines the pass band of the filter 10, together with the series arm resonator s1 provided on the first path.

Filter characteristics of the filter 10 according to this preferred embodiment will be discussed below.

Figure 1B:
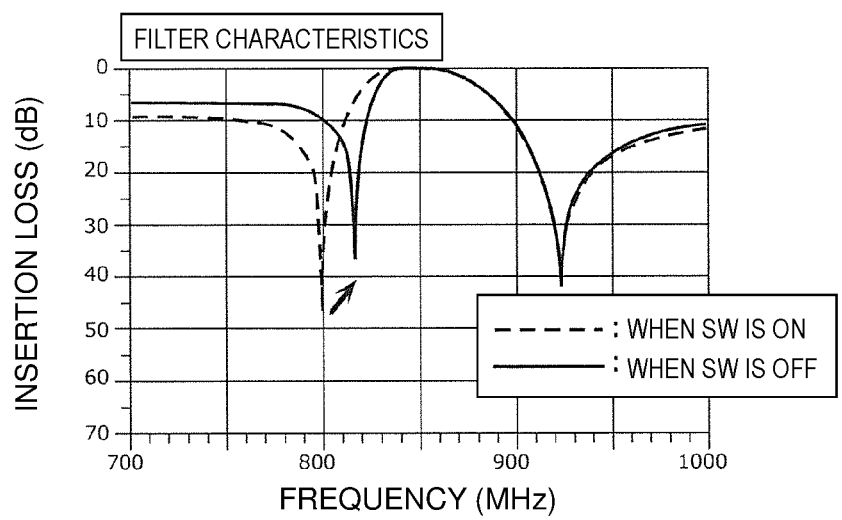
FIG. 1B is a graph illustrating filter characteristics of the filter according to the first preferred embodiment of the present invention.

FIG. 1B is a graph illustrating the filter characteristics (i.e., bandpass characteristics) of the filter 10 according to the first preferred embodiment. More specifically, FIG. 1B is a graph illustrating the comparison result between the filter characteristics when the switch SW is ON and those when the switch SW is OFF. The filter characteristics when the switch SW is ON are indicated by the broken line, while the filter characteristics when the switch SW is OFF are indicated by the solid line. The other graphs illustrating the filter characteristics in this preferred embodiment are also represented in a similar manner.

In the filter 10, the pass band is generated by causing the anti-resonant frequency of the parallel arm resonance circuit 21 and the resonant frequency of the series arm resonance circuit (series arm resonator s1 in this preferred embodiment) to be close to each other.

In this preferred embodiment, the interdigital capacitor C1 is added to the parallel arm resonator p1 only when the switch SW is OFF. With this arrangement, when the switch SW is OFF, the resonant frequency of the parallel arm resonance circuit 21 shifts to the higher-frequency side and becomes greater than that of the single parallel arm resonator p1. The attenuation pole on the low-frequency side of the pass band of the filter 10 is determined by the resonant frequency of the parallel arm resonance circuit 21. Hence, as shown in FIG. 1B, as a result of the switch SW being changed from ON to OFF, the filter 10 can shift the frequency of the attenuation pole on the low-frequency side of the pass band to a higher-frequency range. That is, the filter 10 is able to change the pass band as a result of the switch SW being switched between ON and OFF.

The range by which the frequency of the pass band of the filter 10 is variable (hereinafter referred to as the variable frequency range) is determined by the constant of the interdigital capacitor C1. For example, as the constant of the interdigital capacitor C1 is smaller, the variable frequency range becomes wider. The constant (capacitance) of the interdigital capacitor C1 is thus suitably determined in accordance with the frequency specifications demanded for the filter 10.

The structure of the filter 10 will now be described below.

Figure 2:
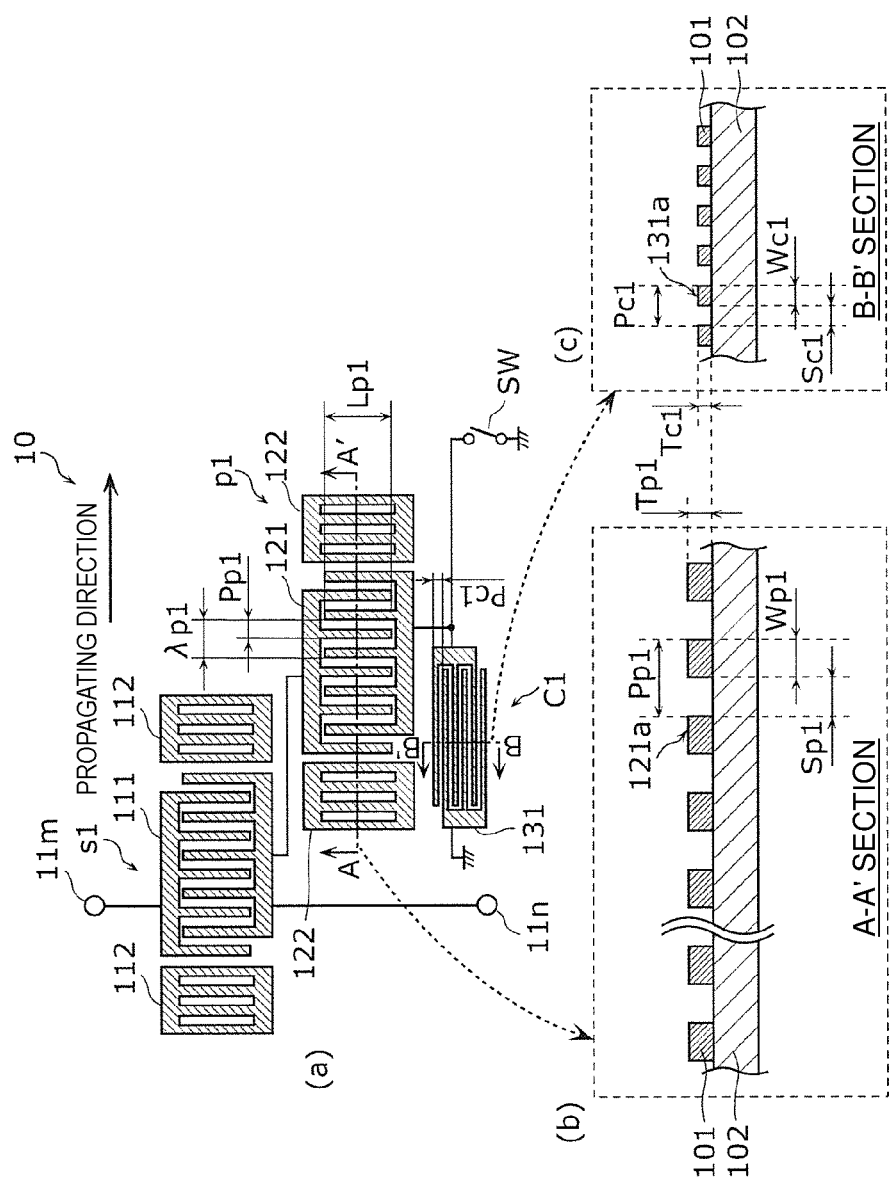
FIG. 2 schematically illustrates the electrode structure of the filter according to the first preferred embodiment of the present invention.

FIG. 2 schematically illustrates the electrode structure of the filter 10 according to the first preferred embodiment. More specifically, (a) of FIG. 2 is a plan view of the electrode structure, (b) of FIG. 2 is a sectional view taken along line A-A' of (a) of FIG. 2, and (c) of FIG. 2 is a sectional view taken along line B-B' of (a) of FIG. 2. The electrode structure shown in FIG. 2 is illustrated to explain the typical structure of each of the resonators and the interdigital capacitor C1 defining the filter 10. The number and the length of electrode fingers defining the IDT electrode of each of the resonators and those of the interdigital capacitor C1 of the filter 10 are not restricted to those shown in (a) to (c) of FIG. 2. The switch SW is also schematically illustrated in (a) of FIG. 2. However, the position and structure of the switch SW are not particularly restricted. For example, the switch SW may be formed on a different chip from that on which the resonators and the interdigital capacitor C1 are provided.

The structure of each of the resonators will first be described.

As shown in FIG. 2, each of the resonators defining the filter 10 is preferably an acoustic wave resonator using acoustic waves. The filter 10 is thus able to be defined by an IDT electrode on a piezoelectric substrate. This makes it possible to implement a small-size, low-height filter circuit exhibiting bandpass characteristics having the improved sharpness.

Each of the series arm resonator s1 and the parallel arm resonator p1 includes a substrate having piezoelectric properties (piezoelectric substrate in this preferred embodiment) and an IDT electrode. The IDT electrode excites acoustic waves. Each of the series arm resonator s1 and the parallel arm resonator p1 may also include a pair of reflectors which sandwich the IDT electrode from the two sides in the propagating direction of acoustic waves. The IDT electrode is defined by plural electrode fingers disposed side by side in the propagating direction of acoustic waves. More specifically, the series arm resonator s1 includes an IDT electrode 111 and a pair of reflectors 112. The parallel arm resonator p1 includes an IDT electrode 121 defined by plural electrode fingers 121a and a pair of reflectors 122. The substrate having piezoelectric properties is preferably a substrate having piezoelectric properties at least on its surface. For example, the substrate may be defined by a multilayer body including a piezoelectric thin film on the surface, a film having an acoustic velocity different from that of the piezoelectric thin film, and a support substrate. The substrate may be defined by a multilayer body including a high acoustic velocity support substrate and a piezoelectric thin film provided on the high acoustic velocity support substrate, or a multilayer body including a high acoustic velocity support substrate, a low acoustic velocity film provided on the high acoustic velocity support substrate, and a piezoelectric thin film provided on the low acoustic velocity film. The substrate may alternatively be defined by a multilayer body including a support substrate, a high acoustic velocity film provided on the support substrate, a low acoustic velocity film provided on the high acoustic velocity film, and a piezoelectric thin film provided on the low acoustic velocity film. The entirety of the substrate may have piezoelectric properties.

The structure of each of the resonators defining the filter 10 will be discussed in greater details by using the parallel arm resonator p1. The other resonators preferably have substantially the same structure as the parallel arm resonator p1, and a detailed explanation will thus be omitted.

As shown in (a) and (b) of FIG. 2, the IDT electrode 121 of the parallel arm resonator p1 is preferably defined by an electrode film 101 and a piezoelectric substrate 102 on which the electrode film 101 is provided. The specific structures of the electrode film 101 and the piezoelectric substrate 102, for example, will be discussed later.

The IDT electrode 121 is provided as follows. The IDT electrode 121 includes plural electrode fingers 121a and a pair of busbar electrodes which oppose each other with the plural electrode fingers 121a therebetween. The plural electrode fingers 121a are alternately connected to one and the other busbar electrodes. The plural electrode fingers 121a are provided along the direction perpendicular to the propagating direction of acoustic waves and are regularly arranged along the propagating direction.

In the parallel arm resonator p1 configured as described above, the wavelength of acoustic waves to be excited is determined by the design parameters of the IDT electrode 121, for example. The design parameters of the IDT electrode 121 will be discussed below.

The wavelength of acoustic waves is determined by the repeating period $\lambda p1$ of the electrode fingers 121a connected to one busbar electrode among the electrode fingers 121a defining the IDT electrode 121 shown in FIG. 2. The electrode finger pitch (pitch of the plural electrode fingers 121a, that is, the electrode finger period) Pp1 is ½ of the repeating period $\lambda p1$. The electrode finger pitch Pp1 is also defined by Pp1=(Wp1+Sp1) where Wp1 indicates the line width of the electrode fingers 121a and Sp1 indicates the space width between adjacent electrode fingers 121a. The interdigital width Lp1 of the IDT electrode 121 is the length of the electrode fingers by which the electrode finger 121a connected to one of the pair of busbars and the electrode finger 121a connected to the other busbar overlap each other as viewed from the propagating direction of acoustic waves. The electrode duty (duty ratio) is the ratio of the line width of each of the plural electrode fingers 121a, and is defined by the ratio of the line width to the total of the line width and the space width of the plural electrode fingers 121a, that is, the electrode duty is defined by Wp1/(Wp1+Sp1). In other words, the electrode duty is defined by the ratio of the width of each of the plural electrode fingers 121a to the electrode finger pitch (pitch of the plural electrode fingers 121a), that is, by Wp1/Pp1. The number of pairs is the number of pairs of electrode fingers 121a, and is roughly half the total number of electrode fingers 121a. For example, Mp1=2Np1+1 is satisfied where Np1 is the number of pairs of electrode fingers 121a and Mp1 is the total number of electrode fingers 121a. The film thickness of the electrode fingers 121a is the thickness Tp1 of the electrode film 101 defining the electrode fingers 121a.

The structure of the interdigital capacitor C1 will now be discussed below.

The interdigital capacitor C1 includes an interdigital electrode 131 defined by plural electrode fingers 131a.

As shown in (a) and (c) of FIG. 2, the interdigital electrode 131 is defined by the electrode film 101, as in the IDT electrode 121. That is, the interdigital electrode 131 defining the interdigital capacitor C1 is provided on the same piezoelectric substrate 102 as the IDT electrode 121 defining the parallel arm resonator p1. However, the interdigital electrode 131 and the IDT electrode 121 may be provided on different piezoelectric substrates if so desired.

The interdigital electrode 131 is preferably provided as follows. The interdigital electrode 131 includes plural electrode fingers 131a and a pair of busbar electrodes which oppose each other with the plural electrode fingers 131a therebetween. The plural electrode fingers 131a are alternately connected to one and the other busbar electrodes. The plural electrode fingers 131a are provided in the propagating direction of acoustic waves and are regularly arranged in the direction perpendicular to the propagating direction.

In the interdigital capacitor C1 configured as described above, the characteristics, such as the capacitance and the Q factor, are determined by the desired parameters of the interdigital electrode 131, for example. The desired parameters of the interdigital electrode 131 will be discussed below.

The electrode finger pitch (pitch of the electrode fingers, that is, the electrode finger period) Pc1 is defined by Pc1=(Wc1+Sc1) where Wc1 is the line width of each of the electrode fingers 131a and Sc1 is the space width between adjacent electrode fingers 131a. The interdigital width Lc1 of the interdigital electrode 131 is the length of the electrode fingers by which the electrode finger 131a connected to one of the pair of busbars and the electrode finger 131a connected to the other busbar overlap each other as viewed from the propagating direction of acoustic waves. The electrode duty (duty ratio) is the ratio of the line width of each of the plural electrode fingers 131a, and is defined by the ratio of the line width to the total of the line width and the space width of the plural electrode fingers 131a, that is, the electrode duty is defined by Wc1/(Wc1+Sc1). In other words, the electrode duty is defined by the ratio of the width of each of the plural electrode fingers 131a to the pitch of the plural electrode fingers 131a, that is, by Wc1/Pc1. The number of pairs is the number of pairs of electrode fingers 131a, and is roughly half the total number of electrode fingers 131a. For example, Mc1=2Nc1+1 is satisfied where Nc1 is the number of pairs of electrode fingers 131a and Mc1 is the total number of electrode fingers 131a. The film thickness of the electrode fingers 131a is the thickness Tc1 of the electrode film 101 defining the electrode fingers 131a.

The desired parameters of the interdigital electrode 131 defining the interdigital capacitor C1 and those of the IDT electrode of the first acoustic wave resonator (IDT electrode 121 defining the parallel arm resonator p1 in this preferred embodiment) connected to the interdigital capacitor C1 will be discussed below in comparison with each other.

The electrode finger pitch of the interdigital capacitor C1 is narrower than that of the parallel arm resonator p1. That is, Pc1<Pp1 is satisfied. The pitch of the plural electrode fingers 131a of the interdigital capacitor C1 is preferably about 80% or smaller of the pitch of the plural electrode fingers 121a of the parallel arm resonator p1 (first acoustic wave resonator) (that is, Pc1≤0.8×Pp1=0.4×λ·p1).

The film thickness of the plural electrode fingers 131a of the interdigital capacitor C1 is smaller than that of the plural electrode fingers 121a of the parallel arm resonator p1. That is, Tc1<Tp1 is satisfied. Because of the manufacturing requirements, the film thickness Tc1 of the plural electrode fingers 131a is preferably about 40% or smaller of the electrode finger pitch Pc1 of the interdigital capacitor C1 (that is, Tc1≤0.40×Pc1). For a similar reason, the film thickness Tp1 of the electrode fingers 121a is preferably about 40% or smaller of the electrode finger pitch Pp1 of the parallel arm resonator p1 (that is, Tp1≤0.40×Pp1). Although the minimum value of the film thickness Tc1 of the electrode fingers 131a is not particularly restricted, it may be about 15% or greater of the electrode finger pitch Pc1 (that is, 0.15×Pc1≤Tc1). Likewise, although the minimum value of the film thickness Tp1 of the electrode fingers 121a is not particularly restricted, it may be about 15% or greater of the electrode finger pitch Pp1 (that is, 0.15×Pp1≤Tp1).

The electrode duty of the interdigital capacitor C1 is preferably greater than that of the parallel arm resonator p1. That is, the interdigital capacitor C1 and the parallel arm resonator p1 preferably satisfy Wc1/Pc1>Wp1>Pp1. With this configuration, the capacitance per unit area of the interdigital capacitor C1 is increased, thus making it possible to reduce the size of the filter and also to enhance space-saving characteristics.

In each of the elements (such as series arm resonator s1, parallel arm resonator p1, and interdigital capacitor C1), each of the electrode finger pitch, film thickness, electrode duty is not necessarily uniform due to variations in the manufacturing process or adjustments made to the characteristics, for example. The interdigital electrode 131 defining the interdigital capacitor C1 and the IDT electrode 121 defining the parallel arm resonator p1 may not entirely satisfy the above-described relationships regarding the electrode finger pitch, film thickness, and electrode duty. However, it is sufficient if the above-described relationships regarding the electrode finger pitch, film thickness, and electrode duty between the interdigital capacitor C1 and the parallel arm resonator p1 are substantially satisfied. For example, it is sufficient if the above-described relationships between the average of each of the electrode finger pitch, film thickness, and electrode duty of the interdigital capacitor C1 and that of the parallel arm resonator p1 are satisfied.

An example of the structure of the electrode fingers 121a of the IDT electrode 121 and the electrode fingers 131a of the interdigital electrode 131 will be discussed below while also referring to the configuration of the piezoelectric substrate 102 on which the electrode fingers 121a and 131a are defined and the configuration of a protection layer (which will be discussed later). In this preferred embodiment, the electrode fingers 121a of the IDT electrode and the electrode fingers 131a of the interdigital electrode 131 are defined by the same electrode film 101, except that the film thickness is different. However, the electrode fingers 121a and the electrode fingers 131a may be defined by electrode films having different structures or compositions, for example.

Figure 3A:
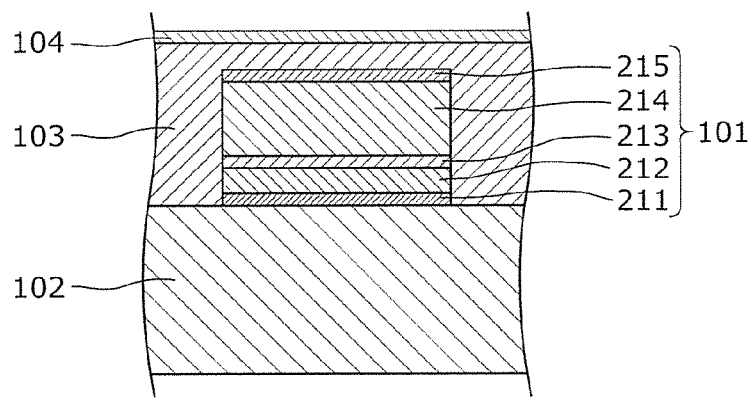
FIG. 3A is a sectional view of the electrode film and its surrounding portions in the first preferred embodiment of the present invention.

FIG. 3A is a sectional view of the electrode film 101 defining the electrode fingers 121a of the IDT electrode 121 and the electrode fingers 131a of the interdigital electrode 131 and its surrounding portions in this preferred embodiment.

As shown in FIG. 3A, in this preferred embodiment, the electrode film 101 is preferably defined by a metal film 211 made of NiCr, a metal film 212 made of Pt, a metal film 213 made of Ti, a metal film 214 made of AlCu, and a metal film 215 made of Ti, which are stacked on each other in this order from the piezoelectric substrate 102.

The piezoelectric substrate 102 is preferably made of a LiNbO$_3$ piezoelectric single crystal.

The electrode film 101 is covered with a protection layer which protects the electrode film 101 from external environments and which also adjusts the frequency-temperature characteristics and enhances the moisture resistance. In this preferred embodiment, the protection layer is defined by a protection layer 103 made of SiO$_2$ and a protection layer 104 made of SiN stacked on each other in this order from the piezoelectric substrate 102.

Details of the film thicknesses are shown in Table 1.

TABLE 1

|  |  | Electrode fingers 121a of IDT | (Unit: nm) Electrode fingers 131a of interdigital capacitor |
|---|---|---|---|
| Protection layer | Protection layer 104 (SiN) | 40.0 | 40.0 |
|  | Protection layer 103 (SiO$_2$) | 1100.0 | 1100.0 |

TABLE 1-continued

|  |  | Electrode fingers 121a of IDT | (Unit: nm) Electrode fingers 131a of interdigital capacitor |
|---|---|---|---|
| Electrode film 101 | Metal film 215 (Ti) | 10.0 | 10.0 |
|  | Metal film 214 (AlCu having 10% Cu concentration) | 165.0 | 70.0 |
|  | Metal film 213 (Ti) | 22.0 | 10.0 |
|  | Metal film 212 (Pt) | 110.0 | 10.0 |
|  | Metal film 211 (NiCr) | 10.0 | 10.0 |
| Film thickness of electrode fingers (Film thickness of electrode film 101) |  | 317.0 | 110.0 |

Figure 3B:
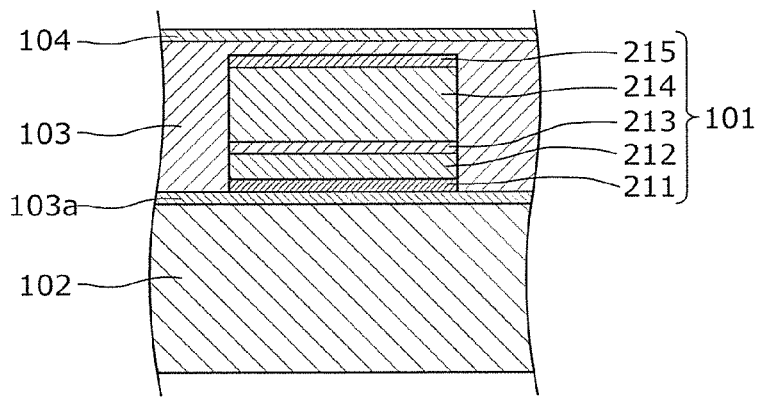
FIG. 3B is a sectional view of another example of the electrode film and its surrounding portions in the first preferred embodiment of the present invention.

As shown in FIG. 3B, an adjusting film 103a that adjusts the electromechanical coupling coefficient may be disposed between the electrode film 101 and the piezoelectric substrate 102. The adjusting film 103a is preferably made of $SiO_2$. In the interdigital capacitor C1, however, if the adjusting film 103a is disposed between the electrode film 101 and the piezoelectric substrate 102, the dielectric constant of the piezoelectric substrate 102 under the interdigital electrode 131 of the interdigital capacitor C1 is decreased, thus reducing the capacitance per unit area of the interdigital capacitor C1. This leads to an increase in the size of the interdigital capacitor C1. To reduce the size of the interdigital capacitor C1, it is desirable that the adjusting film 103a be not disposed in the interdigital capacitor C1.

Figure 3C:
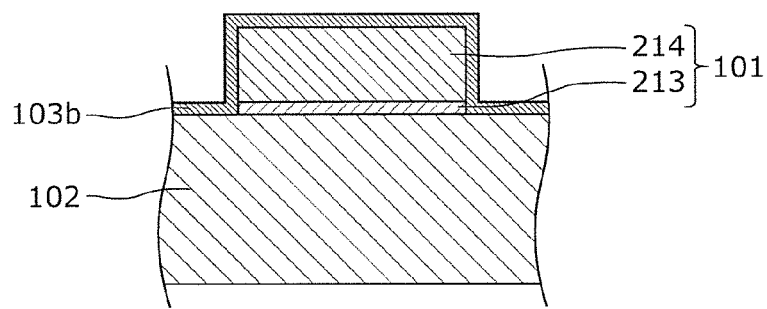
FIG. 3C is a sectional view of still another example of the electrode film and its surrounding portions in the first preferred embodiment of the present invention.

The structure of the electrode film 101 is not limited to that shown in FIG. 3A or 3B, and may be the structure shown in FIG. 3C. The electrode film 101 shown in FIG. 3C is defined by the above-described metal films 213 and 214.

In this case, the piezoelectric substrate 102 is preferably made of a $LiTaO_3$ piezoelectric single crystal. A protection film 103b thinner than the above-described protection film 103 is provided.

The above-described configurations are only examples, and the configuration of the electrode film 101 defining the electrode fingers 121a of the IDT electrode 121 and the electrode fingers 131a of the interdigital electrode 131 is not restricted thereto. The electrode film 101 may be defined by a single layer of a metal film, instead of a multilayer structure of metal films. The materials defining the metal films and the protection layers are not limited to those described above. The electrode film 101 may be made of a metal, such as, for example, Ti, Al, Cu, Pt, Au, Ag, or Pd, or an alloy thereof, or may be defined by plural multilayer bodies made of the above-described metals and alloys, for example. The stacking order of metals and alloys of the multilayer body defining the electrode film 101 is not particularly restricted and may not necessarily be the above-described order. The piezoelectric substrate 102 may be made of a $KNbO_3$ piezoelectric single crystal, quartz, or piezoelectric ceramics, for example. The protection layer and the adjusting film that adjusts the electromechanical coupling coefficient are not limited to the above-described configurations, and may be made of a dielectric member or an insulator made of $SiO_2$, SiN, AlN, or polyimide, or a multilayer body thereof. The protection layers 103 and 104 may be omitted if so desired.

It is however desirable that the electrode fingers 131a of the interdigital capacitor C1 do not contain a high-density metal, such as Au, Pt, Ta, Mo, and W, and instead preferably be made of a low-density metal, such as Al, Cu, NiCr, and Ti, for example. This will be explained more specifically. A high-density metal has a small conductance. If a high-density metal is used for the electrode fingers 131a of the interdigital capacitor C1, the equivalent series resistance of the interdigital capacitor C1 is increased, thus decreasing the Q factor. Additionally, the self-resonant frequency of the interdigital capacitor C1 shifts to the lower-frequency side. Thus, even if the electrode finger pitch of the interdigital capacitor C1 is decreased, which will be discussed later, it will be difficult to shift the self-resonant frequency to a range where it does not influence the filter characteristics. Because of the above-described reasons, it is desirable that the electrode fingers 131a of the interdigital capacitor C1 do not contain a high-density metal.

In the filter 10 of this preferred embodiment, the electrode finger pitch and the film thickness of the parallel arm resonator p1 and those of the interdigital capacitor C1 satisfy the above-described relationships. It is thus possible to achieve both of the required Q factor of the parallel arm resonator p1 and that of the interdigital capacitor C1.

This is due to the fact that the characteristics of the interdigital capacitor C1 are determined by the desired parameters. The reason why the above-described advantage is achieved will be explained below by using a typical example of an interdigital capacitor. The configuration of this typical interdigital capacitor is similar to that of the interdigital capacitor C1, except that the ranges of numerical values of the desired parameters are not limited to those of the interdigital capacitor C1.

The relation between the electrode finger pitch and the characteristics of a typical interdigital capacitor will first be discussed. The desired parameters other than the electrode finger pitch are fixed. The electrode duty is preferably about 0.60 (that is, Wc1/Pc1=0.60), and the ratio of the film thickness to the electrode finger pitch is preferably about 0.20 (that is, Tc1=0.20×Pc1), for example.

Figure 4A:
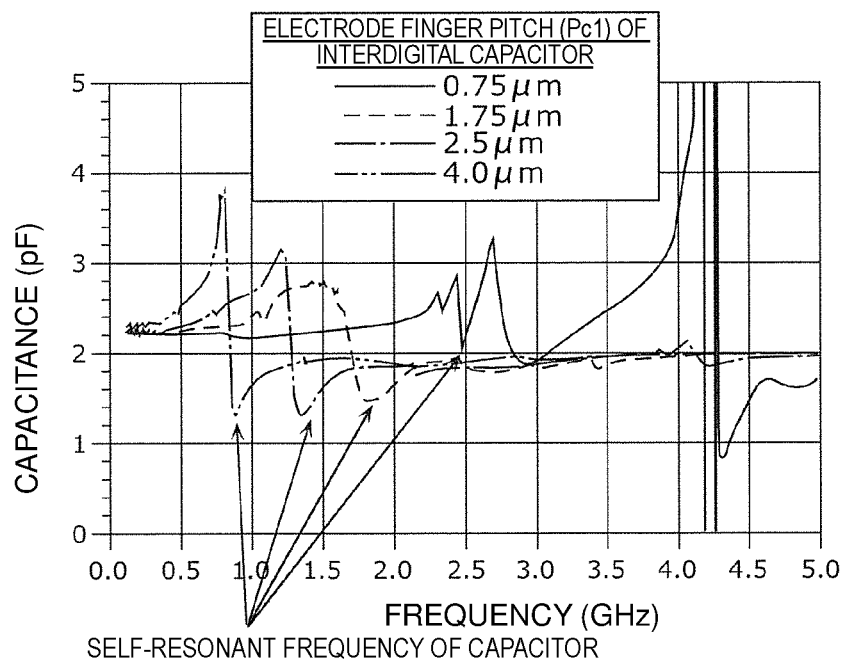
FIG. 4A is a graph illustrating the relation between the electrode finger pitch and the capacitance of a typical example of an interdigital capacitor.
Figure 4B:
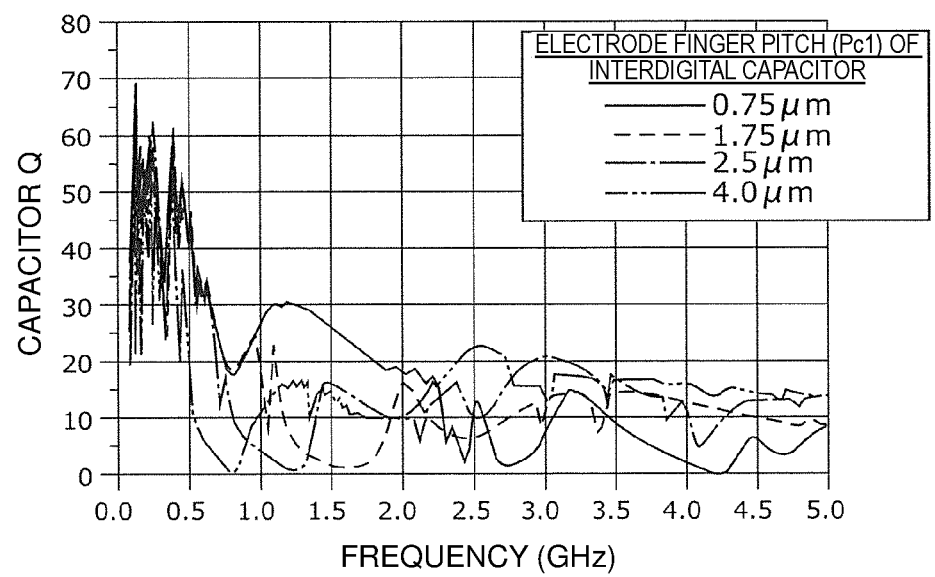
FIG. 4B is a graph illustrating the relation between the electrode finger pitch and the capacitor Q of a typical example of an interdigital capacitor.

FIG. 4A is a graph illustrating the relation between the electrode finger pitch Pc1 and the capacitance of the typical interdigital capacitor. FIG. 4B is a graph illustrating the relation between the electrode finger pitch Pc1 and the Q factor (capacitor Q) of the typical interdigital capacitor. More specifically, FIGS. 4A and 4B illustrate the frequency characteristics when the electrode finger pitch Pc1 is varied among about 0.75, about 1.75, about 2.50, and about 4.00 (unit is μm), for example.

As shown in FIG. 4A, the capacitance remains almost the same even though the electrode finger pitch Pc1 is varied. In this case, the capacitance is the capacitance (electrostatic capacity) in a low-frequency range where influences caused by the self-resonance of the interdigital capacitor are almost negligible. The capacitance is expressed by the following equation 1.

$$\text{Electrostatic capacity } C_0 = \frac{\varepsilon_0 \cdot \varepsilon_r \cdot \text{Number of pairs of electrode fingers} \cdot \text{Interdigital width}}{2 \cdot (1 - \text{Electrode duty})} \quad \text{Equation 1}$$

$\varepsilon_0$ is a dielectric constant in a vacuum, and $\varepsilon_r$ is a dielectric constant of the piezoelectric substrate 102.

As shown in FIG. 4A, the self-resonant frequency of the interdigital capacitor shifts to the higher-frequency side as the electrode finger pitch Pc1 is smaller. As shown in FIG. 4B, although the Q factor (capacitor Q) of the interdigital capacitor is roughly progressively decreased as the frequency becomes greater, it is locally decreased at the self-resonant frequency. Accordingly, if the electrode finger pitch Pc1 is set to be small to shift the self-resonant frequency of the interdigital capacitor to the higher-frequency side than the pass band of the filter 10, the Q factor of the interdigital capacitor in the pass band is able to be increased.

In other words, as the electrode finger pitch Pc1 becomes wider, the self-resonant frequency of the interdigital capacitor shifts to the lower-frequency side. This may cause the self-resonant frequency to coincide with the resonant frequency or the anti-resonant frequency of the first acoustic wave resonator (parallel arm resonator p1 in this preferred embodiment) which is connected to the interdigital capacitor without another acoustic wave resonator interposed therebetween. That is, the resonant frequency or the anti-resonant frequency of the first acoustic wave resonator may coincide with the frequency at which the capacitor Q is locally decreased. In this case, the Q factor obtained by the combined characteristics of the first acoustic wave resonator and the interdigital capacitor at the resonant frequency or the anti-resonant frequency is decreased due to the locally decreased Q factor of the interdigital capacitor. This makes it difficult to achieve the required Q factor. Because of the above-described reason, the electrode finger pitch Pc1 is decreased to shift the self-resonant frequency of the interdigital capacitor to the higher-frequency side than the resonant frequency or the anti-resonant frequency of the first acoustic wave resonator. This makes it less likely to reduce the Q factor of the combined characteristics of the first acoustic wave resonator and the interdigital capacitor. As a result, the required Q factor is able to be obtained.

For example, in the case of the filter 10 (preferably a filter in the approximately 800 MHz to 900 MHz band) of the first preferred embodiment, the electrode finger pitch Pp1 of the parallel arm resonator p1 connected to the interdigital capacitor C1 is about 2.2 μm, for example. In the first preferred embodiment, by setting the electrode finger pitch Pc1 of the interdigital capacitor C1 to be smaller than about 2.2 μm, the self-resonant frequency of the interdigital capacitor C1 can be shifted to a range sufficiently higher than the approximately 800 MHz band, for example. It is thus possible to achieve both of the required Q factor of the parallel arm resonator p1 and that of the interdigital capacitor C1.

As the electrode finger pitch Pc1 is smaller, the size of the interdigital capacitor can be reduced while maintaining the capacitance. It is thus possible to reduce the size of a filter, for example, including this interdigital capacitor and also to enhance the space-saving characteristics.

The relation between the film thickness of the electrode fingers and the characteristics of the typical interdigital capacitor will now be discussed. The desired parameters other than the film thickness of the electrode fingers are fixed. The electrode duty is about 0.60 (that is, Wc1/Pc1=0.60), and the electrode finger pitch Pc1 is about 2.50 μm, for example.

Figure 5A:
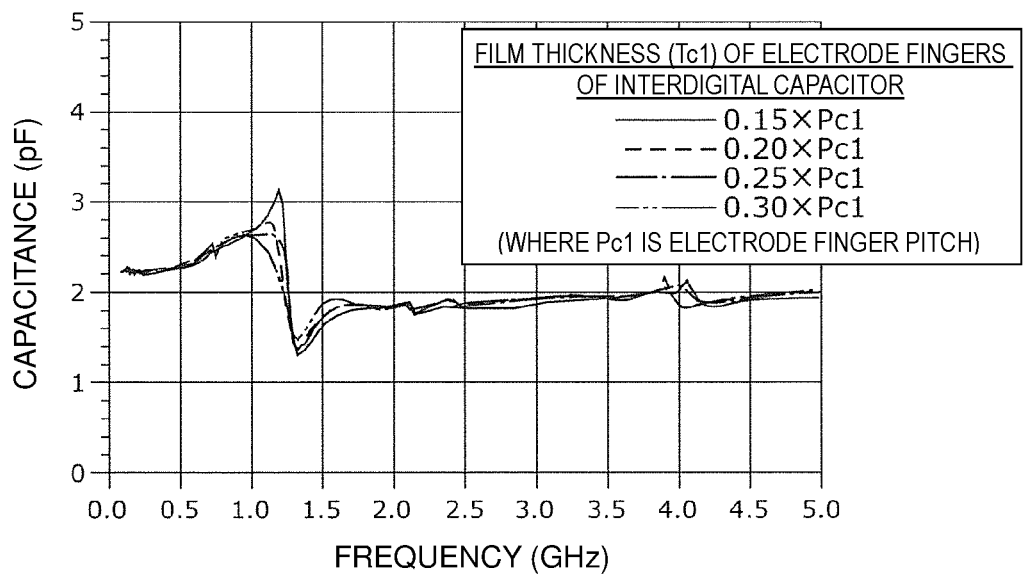
FIG. 5A is a graph illustrating the relation between the film thickness of the electrode fingers and the capacitance of a typical example of an interdigital capacitor.
Figure 5B:
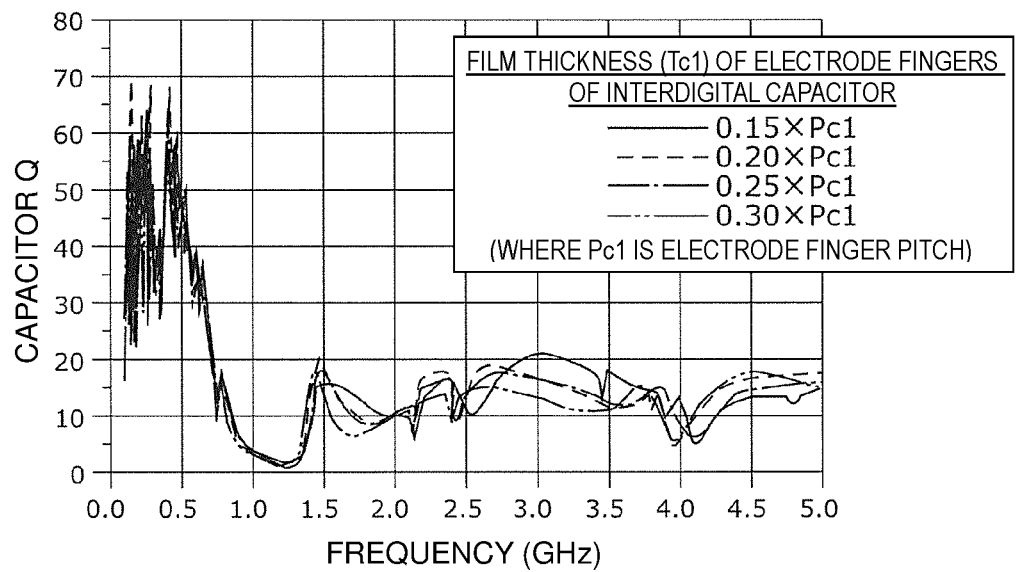
FIG. 5B is a graph illustrating the relation between the film thickness of the electrode fingers and the capacitor Q of a typical example of an interdigital capacitor.

FIG. 5A is a graph illustrating the relation between the film thickness Tc1 of the electrode fingers and the capacitance of the typical interdigital capacitor. FIG. 5B is a graph illustrating the relation between the film thickness Tc1 of the electrode fingers and the capacitor Q of the typical interdigital capacitor. More specifically, FIGS. 5A and 5B illustrate the frequency characteristics when the ratio of the film thickness Tc1 to the electrode finger pitch Pc1 is varied among about 0.15, about 0.20, about 0.25, and about 0.30, for example.

As shown in FIGS. 5A and 5B, the capacitance and the capacitor Q do not noticeably change even though the film thickness Tc1 of the electrode fingers is varied. The film thickness Tc1 of the electrode fingers is thus suitably determined from the manufacturing point of view.

Because of the manufacturing requirements, the maximum value of the film thickness Tc1 of the electrode fingers is determined by the electrode finger pitch Pc1, and more specifically, it is required to be set to be about 40% or smaller of the electrode finger pitch Pc1. An excessively large thickness Tc1 increases variations in the line width Wc1 of the electrode fingers, while an excessively small thickness Tc1 increases the resistance of the electrode fingers. The film thickness Tc1 is thus preferably about 20% of the electrode finger pitch Pc1. "About 20%" includes, not only exactly 20%, but also 20% with an allowance of about several percent, which is also true for the other numerical examples described herein.

The relation between the electrode duty (duty ratio) and the characteristics of the typical interdigital capacitor will now be discussed. The desired parameters other than the electrode duty are fixed. The electrode finger pitch Pc1 is about 2.50 μm, and the ratio of the film thickness to the electrode finger pitch is about 0.20 (that is, Tc1=0.20×Pc1), for example.

Figure 6A:
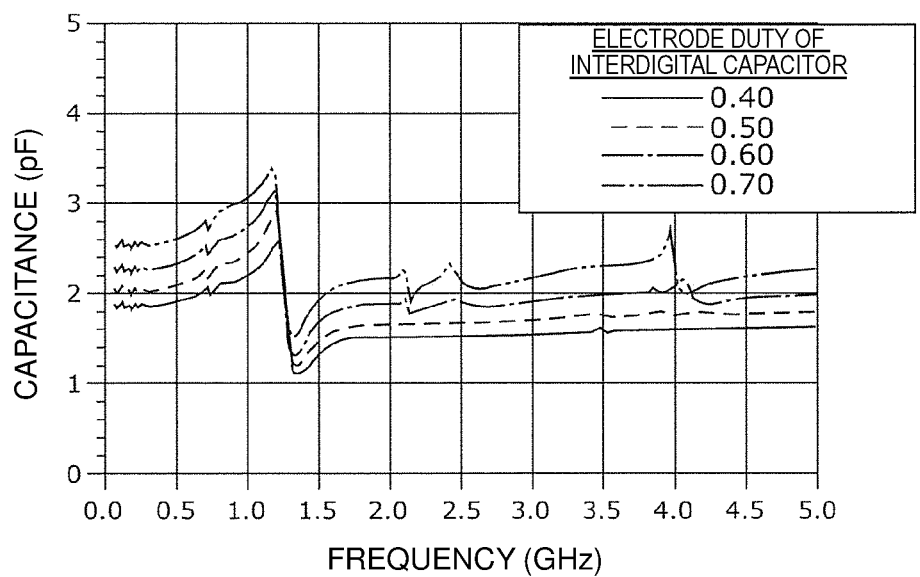
FIG. 6A is a graph illustrating the relation between the electrode duty and the capacitance of a typical example of an interdigital capacitor.
Figure 6B:
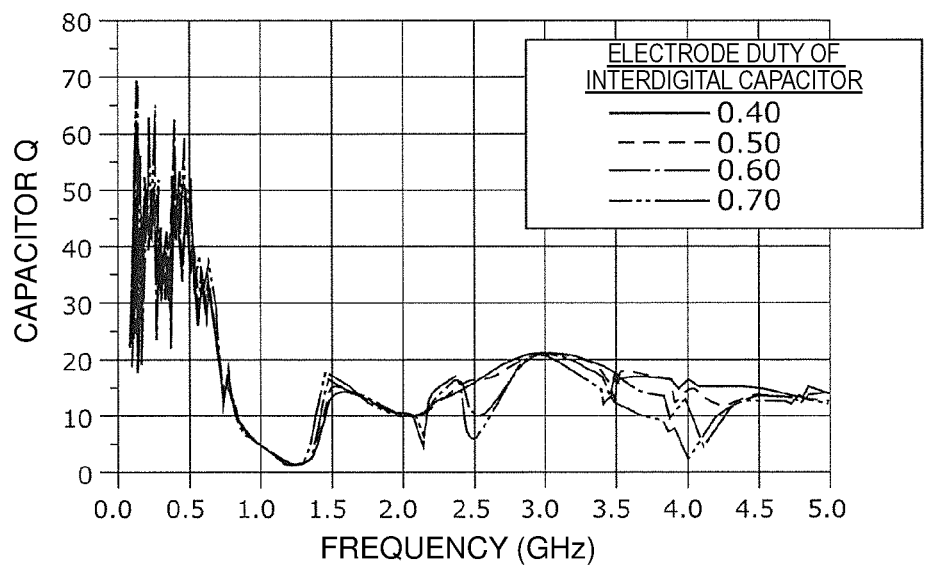
FIG. 6B is a graph illustrating the relation between the electrode duty and the capacitor Q of a typical example of an interdigital capacitor.

FIG. 6A is a graph illustrating the relation between the film thickness Tc1 of the electrode fingers and the capacitance of the typical interdigital capacitor. FIG. 6B is a graph illustrating the relation between the electrode duty of the electrode fingers and the capacitor Q of the typical interdigital capacitor. More specifically, FIGS. 6A and 6B illustrate the frequency characteristics when the electrode duty is varied among about 0.40, about 0.50, about 0.60, and about 0.70, for example.

As shown in FIG. 6A, as the electrode duty is greater, the capacitance is increased. As shown in FIG. 6B, the capacitor Q does not noticeably change even though the electrode duty is varied.

By raising the electrode duty, the capacitance per unit area of the interdigital capacitor can be increased, thus reducing the size of the filter and also enhancing space-saving characteristics.

As described above, in the filter 10 according to this preferred embodiment, the electrode finger pitch Pc1 of the plural electrode fingers 131a of the interdigital capacitor C1 is smaller than the electrode finger pitch Pp1 of the plural electrode fingers 121a of the parallel arm resonator p1. The film thickness Tc1 of the plural electrode fingers 131a of the interdigital capacitor C1 is smaller than the film thickness Tp1 of the plural electrode fingers 121a of the parallel arm resonator p1.

As the electrode finger pitch Pc1 is smaller, the self-resonant frequency at which the Q factor (capacitor Q) of the interdigital capacitor C1 is locally decreased shifts to the higher-frequency side. The electrode finger pitch Pc1 of the interdigital capacitor C1 is thus set to be smaller than the electrode finger pitch Pp1 of the parallel arm resonator p1 so as to shift the self-resonant frequency of the interdigital capacitor C1 to the higher-frequency side than the pass band of the filter 10, thus increasing the Q factor of the interdigital capacitor C1 in the pass band. If the self-resonant frequency of the interdigital capacitor C1 coincides with the resonant frequency or the anti-resonant frequency of the parallel arm resonator p1, the Q factor obtained by the combined characteristics of the parallel arm resonator p1 and the interdigital capacitor C1 at the resonant frequency or the anti-resonant frequency is decreased due to the decreased capacitor Q of the interdigital capacitor C1 connected to the parallel arm resonator p1. Because of the above-described reason, the electrode finger pitch Pc1 is decreased so as to shift the self-resonant frequency of the interdigital capacitor to the higher-frequency side than the resonant frequency or the anti-resonant frequency of the parallel arm resonator p1. This makes it less likely to reduce the Q factor of the combined characteristics of the parallel arm resonator p1 and the interdigital capacitor C1. As a result, the required Q factor is able to be obtained. Because of the manufacturing requirements, however, the electrode finger pitch is restricted by the film thickness of the electrode fingers. Accordingly, the film thickness Tc1 of the electrode fingers 131a of the interdigital capacitor C1 is made smaller than the film thickness Tp1 of the electrode fingers 121a of the parallel arm resonator p1. This can reduce the electrode finger pitch Pc1 of the interdigital capacitor C1 to be even smaller, thus making it easier to achieve both of the required Q factor of the parallel arm resonator p1 and that of the interdigital capacitor C1. As a result, in the filter 10 according to this preferred embodiment, it is possible to reduce the loss in the pass band and also to enhance the sharpness of the attenuation slope by achieving both of the required Q factor of the parallel arm resonator p1 and that of the interdigital capacitor C1.

In the filter 10 according to this preferred embodiment, the interdigital capacitor C1 is connected to the parallel arm resonator p1 (first acoustic wave resonator) without another acoustic wave resonator being interposed therebetween. In such a parallel arm resonator p1, the combined characteristics of the parallel arm resonator p1 and the interdigital capacitor C1 are easily influenced by the characteristics of the interdigital capacitor C1, in particular, by the Q factor. Setting the electrode finger pitch and the film thickness of the parallel arm resonator p1 and those of the interdigital capacitor C1 to satisfy the above-described relationships (Pc1<Pp1 and Tc1<Tp1) is particularly effective in reducing the loss within the pass band and enhancing the sharpness of the attenuation slope.

In the filter 10 according to this preferred embodiment, the film thickness Tc1 of the electrode fingers 131a of the interdigital capacitor C1 is preferably about 40% or smaller of the electrode finger pitch Pc1 (pitch of the electrode fingers 131a) of the interdigital capacitor C1. Because of the manufacturing requirements, the maximum value of the film thickness Tc1 of the electrode fingers 131a is restricted by the electrode finger pitch Pc1. By containing the film thickness Tc1 of the electrode fingers 131a of the interdigital capacitor C1 within an appropriate range, the interdigital capacitor C1 that achieves the required Q factor can be fabricated.

In the filter 10 according to this preferred embodiment, the electrode finger pitch Pc1 of the interdigital capacitor C1 is preferably about 80% or smaller of the electrode finger pitch Pp1 of the parallel arm resonator p1. Increasing the electrode finger pitch Pc1 of the interdigital capacitor C1 to be close to the electrode finger pitch Pp1 of the parallel arm resonator p1 may cause the following problem. The self-resonant frequency of the interdigital capacitor C1 approaches the anti-resonant frequency of the parallel arm resonator p1. This may reduce the Q factor obtained by the combined characteristics of the parallel arm resonator p1 and the interdigital capacitor C1 at the anti-resonant frequency due to the decreased capacitor Q of the interdigital capacitor C1 at the self-resonant frequency. Containing the electrode finger pitch Pc1 of the interdigital capacitor C1 within an appropriate range makes it more likely to achieve the required Q factor obtained by the combined characteristics of the parallel arm resonator p1 and the interdigital capacitor.

In the filter 10 according to this preferred embodiment, the parallel arm resonator p1 (first acoustic wave resonator) and the interdigital capacitor C1 form the parallel arm resonance circuit 21 (first resonance circuit) disposed on one of the first path connecting the input-output terminal 11m (first input-output terminal) and the input-output terminal 11n (second input-output terminal) and the second path connecting the ground and the node x1 provided on the first path. In this preferred embodiment, the parallel arm resonance circuit 21 is disposed on the second path. The filter 10 includes a second resonance circuit defined by one or more second acoustic wave resonators. The second resonance circuit is disposed on the other one of the first path and the second path and determines the pass band together with the parallel arm resonance circuit 21. In this preferred embodiment, the second resonance circuit is disposed on the first path and is a series arm resonance circuit including one series arm resonator s1.

A band pass filter is provided by using the parallel arm resonance circuit 21 that achieves both of the required Q factor of the parallel arm resonator p1 and that of the interdigital capacitor C1. It is thus possible to implement a band pass filter exhibiting high filter characteristics. Additionally, with the combined characteristics of the parallel arm resonator p1 and the interdigital capacitor C1, the difference between the resonant frequency and the anti-resonant frequency can be made smaller than with the characteristics of the parallel arm resonator p1 alone. This makes it possible to obtain the sharp (high selectivity) attenuation characteristics.

In the filter 10 according to this preferred embodiment, the parallel arm resonance circuit 21 (first resonance circuit) is disposed on the second path connecting the ground and the node x1 provided on the first path which connects the input-output terminal 11m (first input-output terminal) and the input-output terminal 11n (second input-output terminal). The filter 10 includes the switch SW (switch element) which forms the variable frequency circuit 11 together with the interdigital capacitor C1. The variable frequency circuit 11 is connected in series with the parallel arm resonator p1 (first acoustic wave resonator).

With this configuration, it is possible to shift the frequency of the attenuation pole on at least one of the low-frequency side and the high-frequency side of the pass band as a result of the switch SW being switched between ON and OFF, thus implementing a tunable filter that switches the pass band. More specifically, in this preferred embodiment, the parallel arm resonator p1 (first acoustic wave resonator) has a resonant frequency on the lower-frequency side than the pass band and an anti-resonant frequency within the pass band. It is thus possible to shift the frequency of the attenuation pole on the low-frequency side of the pass band as a result of the switch SW being switched between ON and OFF.

The configuration of the filter 10 according to this preferred embodiment is applicable to the configuration of another tunable filter. As modified examples of this preferred embodiment, the configurations and filter characteristics of other tunable filters will be described below.

First Modified Example of First Preferred Embodiment

In the above-described first preferred embodiment, as the variable frequency circuit 11, a parallel circuit of the switch SW, and the interdigital capacitor C1 has been discussed by way of example. However, the variable frequency circuit is not restricted to this configuration.

Figure 7A:
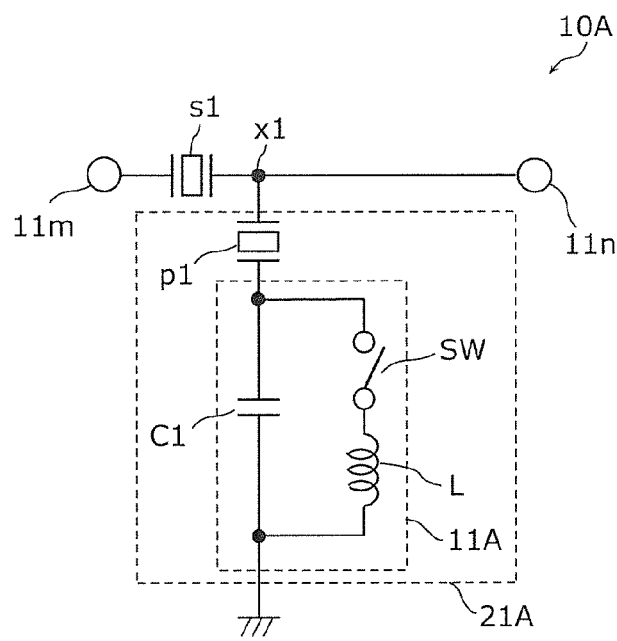
FIG. 7A is a circuit diagram of a filter according to a first modified example of the first preferred embodiment of the present invention.

FIG. 7A is a circuit diagram of a filter 10A according to a first modified example of the first preferred embodiment.

The filter 10A shown in FIG. 7A is different from the filter 10 in FIG. 1A in that it also includes an inductor L connected in series with the switch SW. That is, in this modified example, a series circuit of the switch SW and the inductor L is preferably connected in parallel with the interdigital capacitor C1, thus providing a variable frequency circuit 11A. The variable frequency circuit 11A is connected to a parallel arm resonator p1 (first acoustic wave resonator) so as to provide a parallel arm resonance circuit 21A (first resonance circuit).

The connection order of the switch SW and the inductor L is not particularly restricted to that shown in FIG. 7A, and may be reversed if so desired.

Figure 7B:
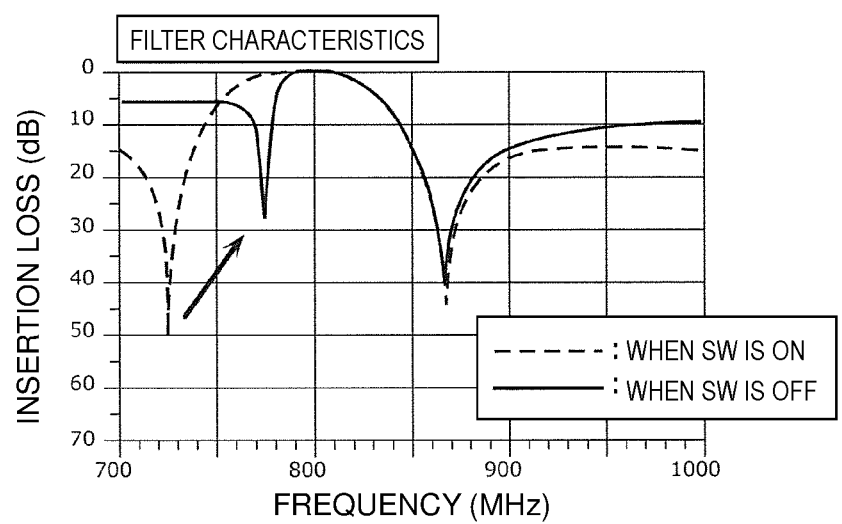
FIG. 7B is a graph illustrating filter characteristics of the filter according to the first modified example of the first preferred embodiment of the present invention.

FIG. 7B is a graph illustrating the filter characteristics (bandpass characteristics) of the filter 10A according to the first modified example of the first preferred embodiment. More specifically, FIG. 7B is a graph illustrating the comparison result between the filter characteristics when the switch SW is ON and those when the switch SW is OFF.

In the filter 10A, the pass band is provided by causing the anti-resonant frequency of the parallel arm resonance circuit 21A and the resonant frequency of the series arm resonance circuit (series arm resonator s1 in this modified example) to be close to each other.

In this modified example, when the switch SW is ON, the inductor L is added to the parallel arm resonator p1, while, when the switch SW is OFF, the interdigital capacitor C1 is added to the parallel arm resonator p1. With this arrangement, when the switch SW is ON, the resonant frequency of the parallel arm resonance circuit 21A shifts to the lower-frequency side and becomes lower than that of the single parallel arm resonator p1. When the switch SW is OFF, the resonant frequency of the parallel arm resonance circuit 21A shifts to the higher-frequency side and becomes greater than that of the single parallel arm resonator p1. Hence, as shown in FIG. 7B, the filter 10A according to this modified example can increase the variable frequency range of the pass band to be wider than the filter 10 of the first preferred embodiment.

The variable frequency range of the pass band of the filter 10A is determined by the constant of the interdigital capacitor C1 and that of the inductor L. For example, as the constant of the inductor L becomes greater, the variable frequency range becomes wider. The constant of the inductor L is thus suitably determined in accordance with the frequency specifications demanded for the filter 10A. The inductor may be a variable inductor defined by using MEMS (Micro Electro Mechanical Systems). This can adjust the variable frequency range more precisely.

The arrangement of the interdigital capacitor C1 and the inductor L shown in FIG. 7A may be reversed if so desired. That is, a series circuit of the switch SW and the interdigital capacitor C1 may be connected in parallel with the inductor L. With this configuration, the shifting direction of the attenuation slope as a result of the switch SW being shifted between ON and OFF in the filter 10A of the first modified example is reversed.

Second Modified Example of First Preferred Embodiment

In the first preferred embodiment and the first modified example thereof, one parallel arm resonator p1 (first acoustic wave resonator) is disposed between the node x1 and the ground. However, a parallel arm resonator (third acoustic wave resonator) different from the parallel arm resonator p1 may be disposed between a node x1 and a ground.

Figure 8A:
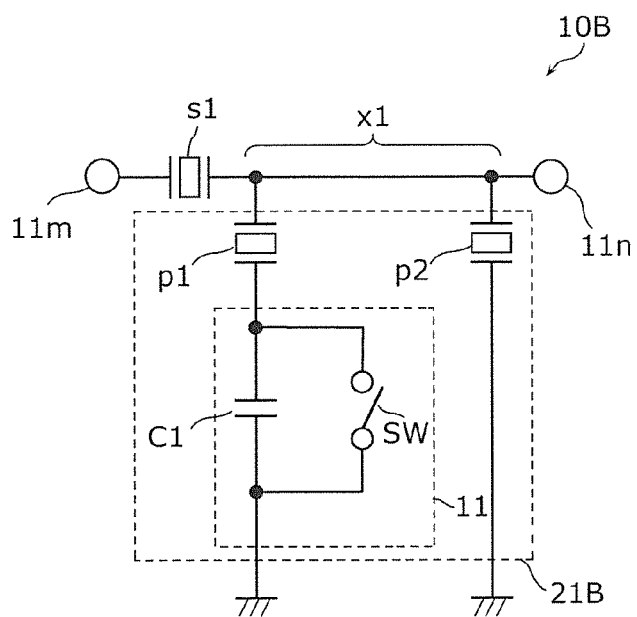
FIG. 8A is a circuit diagram of a filter according to a second modified example of the first preferred embodiment of the present invention.

FIG. 8A is a circuit diagram of a filter 10B according to a second modified example of the first preferred embodiment.

The filter 10B shown in FIG. 8A includes a parallel arm resonance circuit 21B (first resonance circuit), instead of the parallel arm resonance circuit 21 of the filter 10 shown in FIG. 1A. The parallel arm resonance circuit 21B is different from the parallel arm resonance circuit 21 in that it also preferably includes a parallel arm resonator p2 (third acoustic wave resonator) between a node x1 and a ground. The parallel arm resonator p2 is connected in parallel with the parallel arm resonator p1 (first acoustic wave resonator). The resonant frequency and the anti-resonant frequency of the parallel arm resonator p2 are different from those of the parallel arm resonator p1. That is, the parallel arm resonators p1 and p2 are each connected to one node x1 provided on the series arm connecting the input-output terminals 11m and 11n. In other words, the parallel arm resonator p2 is connected in parallel with a series circuit of the parallel arm resonator p1 and the variable frequency circuit 11. With this configuration, the filter 10B is able to shift the frequency of at least one of the attenuation pole on the low-frequency side and that on the high-frequency side of the pass band. "One node" is not necessarily one point on a transmission line, but may be two different nodes positioned on one transmission line without a resonator or an impedance element being interposed therebetween.

More specifically, the resonant frequency and the anti-resonant frequency of the parallel arm resonator p2 are preferably higher than those of the parallel arm resonator p1. The variable frequency circuit 11 is connected in series with only the parallel arm resonator p1 of the parallel arm resonators p1 and p2. That is, the parallel arm resonator p2 is connected in parallel with the series circuit of the parallel arm resonator p1 and the variable frequency circuit 11.

In the parallel arm resonance circuit 21B configured as described above, the impedance is minimized at each of the resonant frequency of the parallel arm resonator p1 and that of the parallel arm resonator p2. That is, the parallel arm resonance circuit 21B has two resonant frequencies. In the parallel arm resonance circuit 21B, the impedance is maximized in a frequency band between the two resonant frequencies and in a frequency band higher than the two resonant frequencies. That is, the parallel arm resonance circuit 21B has two anti-resonant frequencies.

Figure 8B:
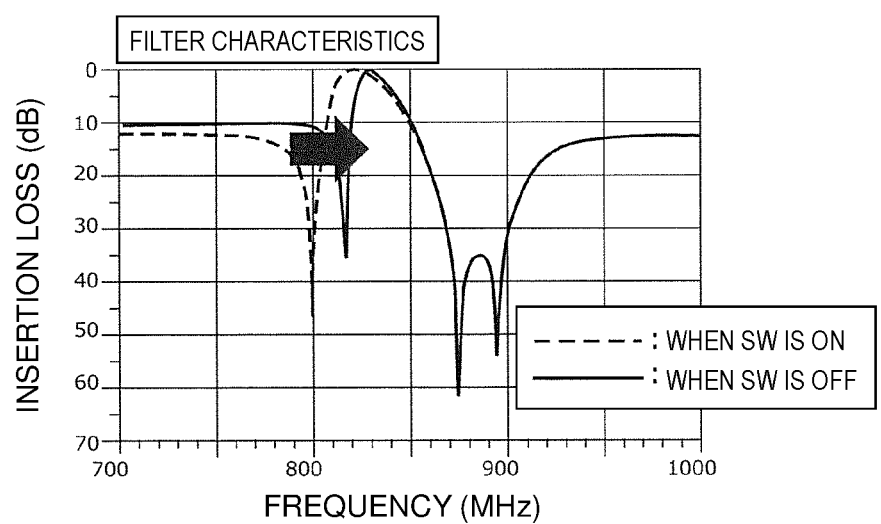
FIG. 8B is a graph illustrating filter characteristics of the filter according to the second modified example of the first preferred embodiment of the present invention.

FIG. 8B is a graph illustrating the filter characteristics (bandpass characteristics) of the filter 10B according to the second modified example of the first preferred embodiment. More specifically, FIG. 8B is a graph illustrating the comparison result between the filter characteristics when the switch SW is ON and those when the switch SW is OFF.

In the filter 10B, the pass band is provided by causing the lower anti-resonant frequency of the two anti-resonant frequencies of the parallel arm resonance circuit 21B and the resonant frequency of the series arm resonance circuit (preferably a series arm resonator s1 in this modified example) to be close to each other.

In this modified example, the interdigital capacitor C1 is added to the parallel arm resonator p1 only when the switch SW is OFF. With this arrangement, when the switch SW is OFF, the lower resonant frequency of the two resonant frequencies of the parallel arm resonance circuit 21B shifts to the higher-frequency side and becomes greater than the resonant frequency of the single parallel arm resonator p1. When the switch SW is OFF, the lower anti-resonant frequency of the two anti-resonant frequencies of the parallel arm resonance circuit 21B shifts to the higher-frequency side and becomes greater than that when the switch SW is ON. The attenuation pole on the low-frequency side of the pass band of the filter 10B is determined by the lower anti-resonant frequency of the parallel arm resonance circuit 21B. The sharpness of the attenuation slope on the low-frequency side of the pass band is determined by the difference between the lower resonant frequency and the lower anti-resonant frequency of the parallel arm resonance circuit 21B. Hence, as shown in FIG. 8B, as a result of the switch SW being changed from ON to OFF, the filter 10B is able to shift the frequency of the attenuation pole on the low-frequency side of the pass band to a higher-frequency range and to shift the pass band to a higher-frequency range without increasing the insertion loss at the low edge of the pass band.

Third Modified Example of First Preferred Embodiment

In the second modified example of the first preferred embodiment, the variable frequency circuit 11 is connected in series with only the parallel arm resonator p1 of the parallel arm resonators p1 and p2. However, the variable frequency circuit 11 may be connected in series with only the parallel arm resonator p2 of the parallel arm resonators p1 and p2.

That is, in the first preferred embodiment and the first and second modified examples thereof, as the first acoustic wave resonator connected to the interdigital capacitor C1 without another acoustic wave resonator being interposed therebetween, the use of the parallel arm resonator p1 having a resonant frequency on the lower side than the pass band of the filter has been discussed by way of example. In contrast, in this modified example, as the first acoustic wave resonator, the use of the parallel arm resonator p2 having a resonant frequency on the higher side than the pass band of the filter will be discussed by way of example.

In this modified example, the electrode finger pitch of the interdigital capacitor C1 is preferably smaller than that of the parallel arm resonator p2. The film thickness of the plural electrode fingers 131a of the interdigital capacitor C1 is smaller than that of the plural electrode fingers of the parallel arm resonator p2.

Figure 9A:
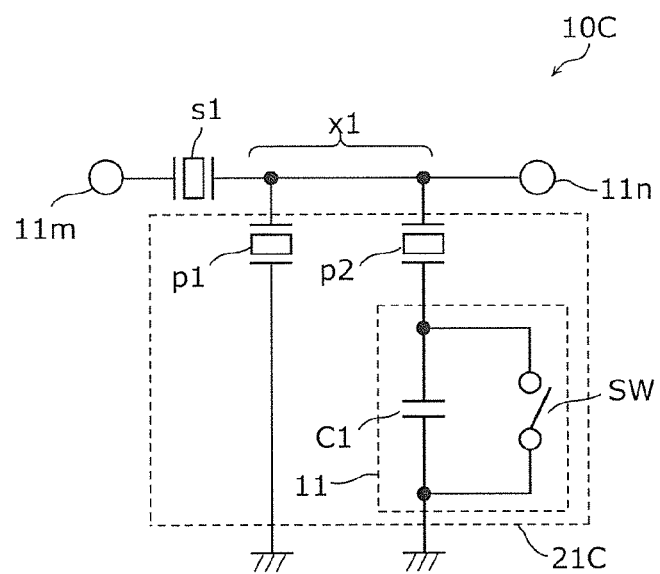
FIG. 9A is a circuit diagram of a filter according to a third modified example of the first preferred embodiment of the present invention.

FIG. 9A is a circuit diagram of a filter 10C according to a third modified example of the first preferred embodiment.

The filter 10C shown in FIG. 9A includes a parallel arm resonance circuit 21C instead of the parallel arm resonance circuit 21B of the filter 10B shown in FIG. 8A. In the parallel arm resonance circuit 21C, the variable frequency circuit 11 is connected in series with only the parallel arm resonator p2 of the parallel arm resonators p1 and p2.

That is, in this modified example, the parallel arm resonator p1 having a resonant frequency and an anti-resonant frequency lower than those of the parallel arm resonator p2 is preferably connected in parallel with the parallel arm resonator p2. The parallel arm resonator p1 corresponds to a third acoustic wave resonator having a resonant frequency and an anti-resonant frequency different from those of the parallel arm resonator p2.

Figure 9B:
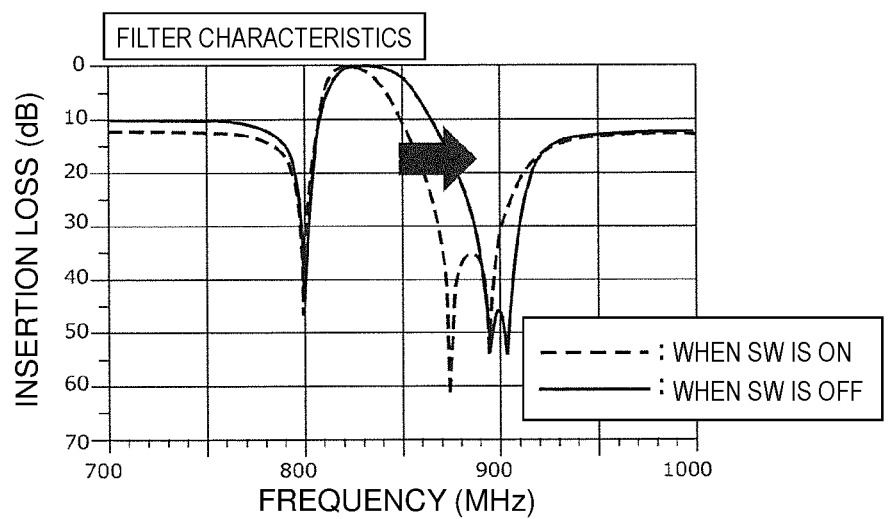
FIG. 9B is a graph illustrating filter characteristics of the filter according to the third modified example of the first preferred embodiment of the present invention.

FIG. 9B is a graph illustrating the filter characteristics (bandpass characteristics) of the filter 10C according to the third modified example of the first preferred embodiment. More specifically, FIG. 9B is a graph illustrating the comparison result between the filter characteristics when the switch SW is ON and those when the switch SW is OFF.

In the filter 10C as well as in the filter 10B, the pass band is generated by causing the lower anti-resonant frequency of the two anti-resonant frequencies of the parallel arm resonance circuit 21C and the resonant frequency of the series arm resonance circuit (preferably a series arm resonator s1 in this modified example) to be close to each other.

In this modified example, the interdigital capacitor C1 is added to the parallel arm resonator p2 only when the switch SW is OFF. With this arrangement, when the switch SW is OFF, the higher resonant frequency of the two resonant frequencies of the parallel arm resonance circuit 21C shifts to the higher-frequency side and becomes greater than the resonant frequency of the single parallel arm resonator p2. When the switch SW is OFF, the lower anti-resonant frequency of the two anti-resonant frequencies of the parallel arm resonance circuit 21C shifts to the higher-frequency side and becomes greater than that when the switch SW is ON. The attenuation pole on the high-frequency side of the pass band of the filter 10C is determined by the higher anti-resonant frequency of the parallel arm resonance circuit 21C. The sharpness of the attenuation slope on the high-frequency side of the pass band is determined by the difference between the higher resonant frequency and the lower anti-resonant frequency of the parallel arm resonance circuit 21C. Hence, as shown in FIG. 9B, as a result of the switch SW being changed from ON to OFF, the filter 10C is able to shift the frequency of the attenuation pole on the high-frequency side of the pass band to a higher-frequency range and to shift the pass band to a higher-frequency range without increasing the insertion loss at the low edge of the pass band.

Fourth Modified Example of First Preferred Embodiment

In the second modified example of the first preferred embodiment, the filter 10B includes the variable frequency circuit 11 connected in series with only the parallel arm resonator p1 of the parallel arm resonators p1 and p2. In the third modified example of the first preferred embodiment, the filter 10C includes the variable frequency circuit 11 connected in series with only the parallel arm resonator p2 of the parallel arm resonators p1 and p2. However, a filter may include both of the variable frequency circuit 11 in the second modified example and that in the third modified example.

Figure 10A:
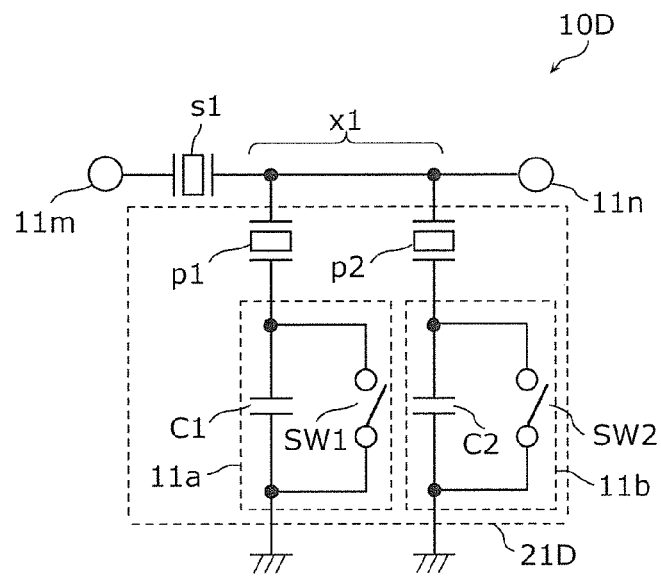
FIG. 10A is a circuit diagram of a filter according to a fourth modified example of the first preferred embodiment of the present invention.

FIG. 10A is a circuit diagram of a filter 10D according to a fourth modified example of the first preferred embodiment.

The filter 10D shown in FIG. 10A preferably includes both of a variable frequency circuit 11a corresponding to the variable frequency circuit 11 of the filter 10B shown in FIG. 8A and a variable frequency circuit 11b corresponding to the variable frequency circuit 11 of the filter 10C shown in FIG. 9A. That is, a parallel arm resonance circuit 21D of this modified example includes the variable frequency circuit 11a connected in series with only one of the parallel arm resonators p1 and p2 and the variable frequency circuit 11b connected in series with only the other one of the parallel arm resonators p1 and p2. In other words, the parallel arm resonance circuit 21D of this modified example preferably includes the variable frequency circuit 11b connected in series with the parallel arm resonator p2, in addition to the configuration of the parallel arm resonance circuit 21B of the second modified example. The series circuit of the parallel arm resonator p2 and the variable frequency circuit 11b is connected in parallel with the series circuit of the parallel arm resonator p1 and the variable frequency circuit 11a.

Figure 10B:
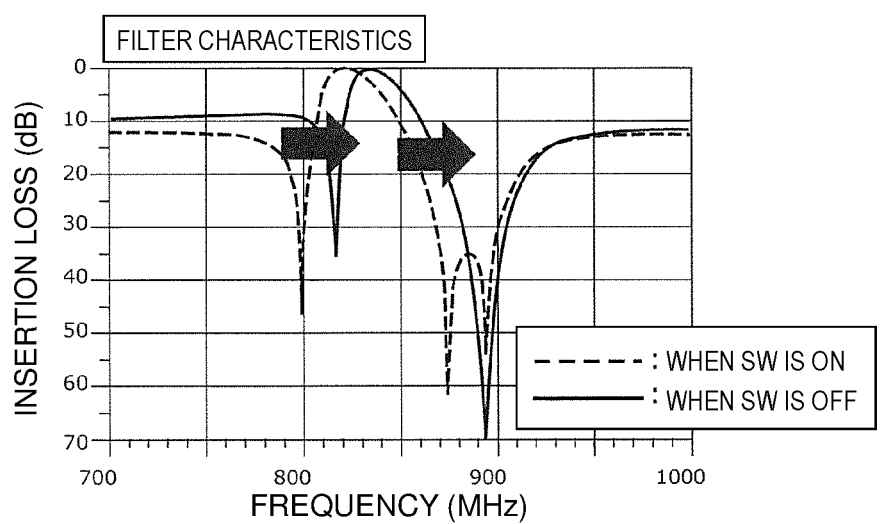
FIG. 10B is a graph illustrating filter characteristics of the filter according to the fourth modified example of the first preferred embodiment of the present invention.

FIG. 10B is a graph illustrating the filter characteristics (bandpass characteristics) of the filter 10D according to the fourth modified example of the first preferred embodiment. More specifically, FIG. 10B is a graph illustrating the comparison result between the filter characteristics when both switches SW1 and SW2 are ON and those when both switches SW1 and SW2 are OFF.

In this modified example, an interdigital capacitor C1 is preferably added to the parallel arm resonator p1 only when the switch SW1 is OFF, and an interdigital capacitor C2 is added to the parallel arm resonator p2 only when the switch SW2 is OFF. With this arrangement, when the switch SW1 is OFF, the lower resonant frequency of the two resonant frequencies of the parallel arm resonance circuit 21D shifts to the higher-frequency side and becomes greater than the resonant frequency of the single parallel arm resonator p1. When the switch SW2 is OFF, the higher resonant frequency of the two resonant frequencies of the parallel arm resonance circuit 21D shifts to the higher-frequency side and becomes greater than the resonant frequency of the single parallel arm resonator p2. When at least one of the switches SW1 and SW2 is OFF, the lower anti-resonant frequency of the parallel arm resonance circuit 21D shifts to the higher-frequency side and becomes greater than that when both of the switches SW1 and SW2 are ON.

Hence, as shown in FIG. 10B, as a result of both of the switches SW1 and SW2 being changed from ON to OFF, the filter 10D is able to shift the frequency of the attenuation pole on the high-frequency side and that on the low-frequency side of the pass band to a higher-frequency range and to shift the pass band to a higher-frequency range without increasing the insertion loss on the high-frequency side and the low edge of the pass band. The filter 10D is thus able to shift the center frequency while maintaining the bandwidth.

In terms of the filter characteristics, it is preferable that the variable frequency circuits 11a and 11b include the interdigital capacitors C1 and C2, respectively. However, in accordance with the required filter characteristics and size of the filter 10D, one of the variable frequency circuits 11a and 11b may have a capacitor provided on the piezoelectric substrate 102 or a variable capacitor, such as, for example, a varicap or a DTC (Digitally Tunable Capacitor), instead of an interdigital capacitor.

In the filter 10D, the switches SW1 and SW2 may not necessarily be switched from ON to OFF or from OFF to ON together, and may be switched individually. However, if the switches SW1 and SW2 are switched from ON to OFF or from OFF to ON together, fewer control lines are required for controlling the switches SW1 and SW2, thus making it possible to simplify the configuration of the filter 10D.

On the other hand, if the switches SW1 and SW2 are switched between ON and OFF individually, variations in the bandwidths that can be switched by the filter 10D can be increased.

More specifically, the high edge of the pass band can be changed as a result of the switch SW2 connected in series with the parallel arm resonator p2 being switched between ON and OFF. The low edge of the pass band can be changed as a result of the switch SW1 connected in series with the parallel arm resonator p1 being switched between ON and OFF.

Switching both of the switches SW1 and SW2 to be ON or OFF can shift both of the high and low edges of the pass band to the lower-frequency side or the higher-frequency side. That is, the center frequency of the pass band can be shifted to the lower-frequency side or the higher-frequency side. Additionally, by switching one of the switches SW1 and SW2 from ON to OFF and the other one of the switches SW1 and SW2 from OFF to ON, the high and low edges of the pass band can be shifted to increase or decrease the frequency difference therebetween. That is, it is possible to vary the pass band width while fixing the center frequency of the pass band at substantially the same position. By setting one of the switches SW1 and SW2 to be ON or OFF and by switching the other one of the switches SW1 and SW2 between ON and OFF, one of the high and low edges of the pass band is fixed and the other one of the high and low edges can be shifted to the lower-frequency side or the higher-frequency side. That is, it is possible to vary the low edge or the high edge of the pass band.

In this manner, the filter 10D includes the variable frequency circuit 11a connected in series with only the parallel arm resonator p1 of the parallel arm resonators p1 and p2 and the variable frequency circuit 11b connected in series with only the parallel arm resonator p2 of the parallel arm resonators p1 and p2, thus making it possible to increase the flexibility in varying the pass band.

Fifth Modified Example of First Preferred Embodiment

In the second modified example of the first preferred embodiment, the variable frequency circuit 11 is connected in series with only the parallel arm resonator p1 of the parallel arm resonators p1 and p2. In the third modified example of the first preferred embodiment, the variable frequency circuit 11 is connected in series with only the parallel arm resonator p2 of the parallel arm resonators p1 and p2. However, the variable frequency circuit 11 may be connected in series with a parallel circuit of the parallel arm resonators p1 and p2.

Figure 11A:
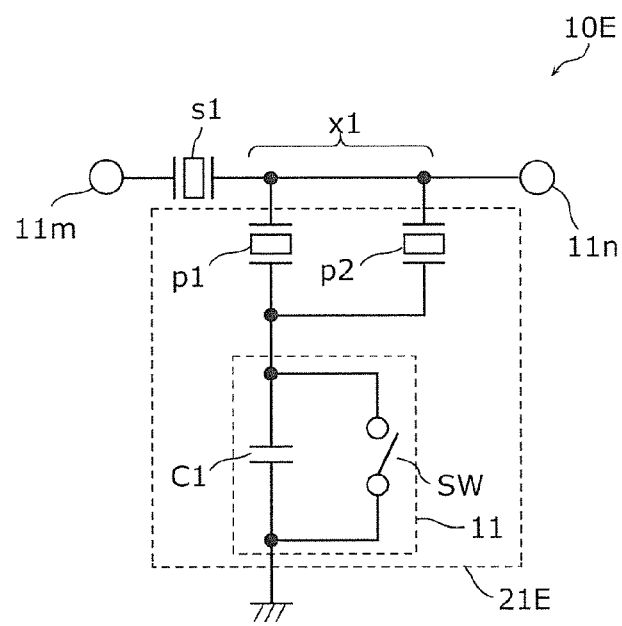
FIG. 11A is a circuit diagram of a filter according to a fifth modified example of the first preferred embodiment of the present invention.

FIG. 11A is a circuit diagram of a filter 10E according to a fifth modified example of the first preferred embodiment.

The filter 10E shown in FIG. 11A preferably includes a parallel arm resonance circuit 21E including a variable frequency circuit 11 connected in series with a parallel circuit of the parallel arm resonators p1 and p2.

In this modified example, the electrode finger pitch of the interdigital capacitor C1 is smaller than that of the parallel arm resonator p1 and is also smaller than that of the parallel arm resonator p2. The film thickness of the plural electrode fingers 131a of the interdigital capacitor C1 is smaller than that of the plural electrode fingers 121a of the parallel arm resonator p1 and is also smaller than that of the parallel arm resonator p2. This makes it possible to achieve a required Q factor for both of the parallel arm resonators p1 and p2.

The electrode finger pitch of the interdigital capacitor C1 is preferably smaller than that of one of the parallel arm resonators p1 and p2 and is preferably greater than the other one of the parallel arm resonators. The film thickness of the plural electrode fingers 131a of the interdigital capacitor C1 is preferably smaller than that of the parallel arm resonator having an electrode finger pitch greater than that of the interdigital capacitor C1, and is preferably greater than that of the parallel arm resonator having an electrode finger pitch smaller than that of the interdigital capacitor C1.

Figure 11B:
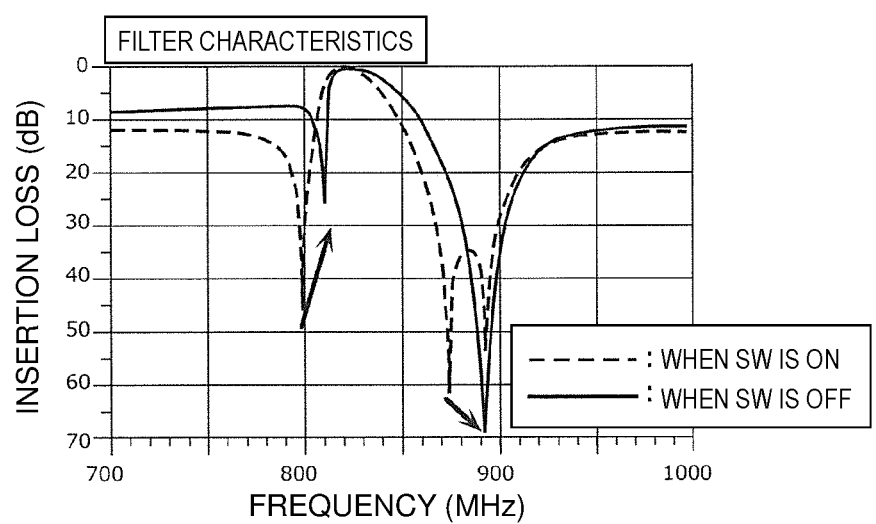
FIG. 11B is a graph illustrating filter characteristics of the filter according to the fifth modified example of the first preferred embodiment of the present invention.

FIG. 11B is a graph illustrating the filter characteristics (bandpass characteristics) of the filter 10E according to the fifth modified example of the first preferred embodiment. More specifically, FIG. 11B is a graph illustrating the comparison result between the filter characteristics when the switch SW is ON and those when the switch SW is OFF.

In the filter 10E as well as in the filter 10B, the pass band is provided by causing the lower anti-resonant frequency of the two anti-resonant frequencies of the parallel arm resonance circuit 21E and the resonant frequency of the series arm resonance circuit (series arm resonator s1 in this modified example) to be close to each other.

In this modified example, the interdigital capacitor C1 is added to both of the parallel arm resonators p1 and p2 only when the switch SW is OFF. With this arrangement, when the switch SW is OFF, the lower resonant frequency of the two resonant frequencies of the parallel arm resonance circuit 21E shifts to the higher-frequency side and becomes greater than the resonant frequency of the single parallel arm resonator p1. When the switch SW is OFF, the higher resonant frequency of the two resonant frequencies of the parallel arm resonance circuit 21E shifts to the higher-frequency side and becomes greater than the resonant frequency of the single parallel arm resonator p2. However, when the switch SW is OFF, the lower anti-resonant frequency of the parallel arm resonance circuit 21E does not shift because the variable frequency circuit 11 is connected in series with the parallel circuit of the parallel arm resonators p1 and p2. Hence, as shown in FIG. 11B, as a result of the switch SW being changed from ON to OFF, the filter 10E is able to shift the frequencies of the attenuation poles on both sides of the pass band to the higher-frequency side.

Sixth Modified Example of First Preferred Embodiment

Example configurations of filters (tunable filters) each including a variable frequency circuit disposed in a parallel arm resonance circuit have been discussed above. That is, as the first acoustic wave resonator connected to the interdigital capacitor C1 without another acoustic wave resonator interposed therebetween, a parallel arm resonator has been discussed by way of example. As the first resonance circuit defined by the first acoustic wave resonator and the interdigital capacitor C1, a parallel arm resonance circuit has been discussed by way of example. As the second resonance circuit defined by one or more second acoustic wave resonators and determining the pass band together with the first resonance circuit, a series arm resonance circuit has been discussed by way of example.

However, a variable frequency circuit may be disposed in a series arm resonance circuit. In this modified example, as the first acoustic wave resonator, a series arm resonator s1 will be discussed by way of example, as the first resonance circuit, a series arm resonance circuit will be described as an example, and as the second resonance circuit, a parallel arm resonance circuit (parallel arm resonator p1 in this modified example) will be described as an example.

In this modified example, the electrode finger pitch of the interdigital capacitor C1 is preferably smaller than that of the series arm resonator s1. The film thickness of the plural electrode fingers 131a of the interdigital capacitor C1 is smaller than that of the plural electrode fingers of the series arm resonator s1.

Figure 12A:
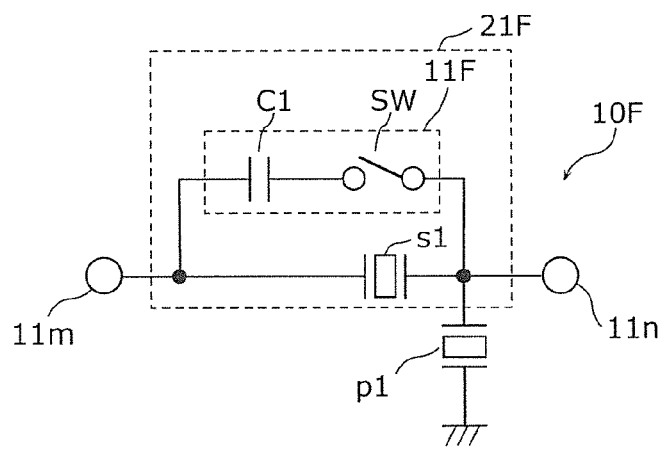
FIG. 12A is a circuit diagram of a filter according to a sixth modified example of the first preferred embodiment of the present invention.

FIG. 12A is a circuit diagram of a filter 10F according to a sixth modified example of the first preferred embodiment.

In the filter 10F shown in FIG. 12A, a switch SW is connected in series with an interdigital capacitor C1 and provides a variable frequency circuit 11F together with the interdigital capacitor C1. The variable frequency circuit 11F is connected in parallel with the series arm resonator s1. That is, the filter 10F is different from the filter 10 shown in FIG. 1A in that the variable frequency circuit 11F defined by the interdigital capacitor C1 and the switch SW connected in series with each other is connected in parallel with the series arm resonator s1.

Figure 12B:
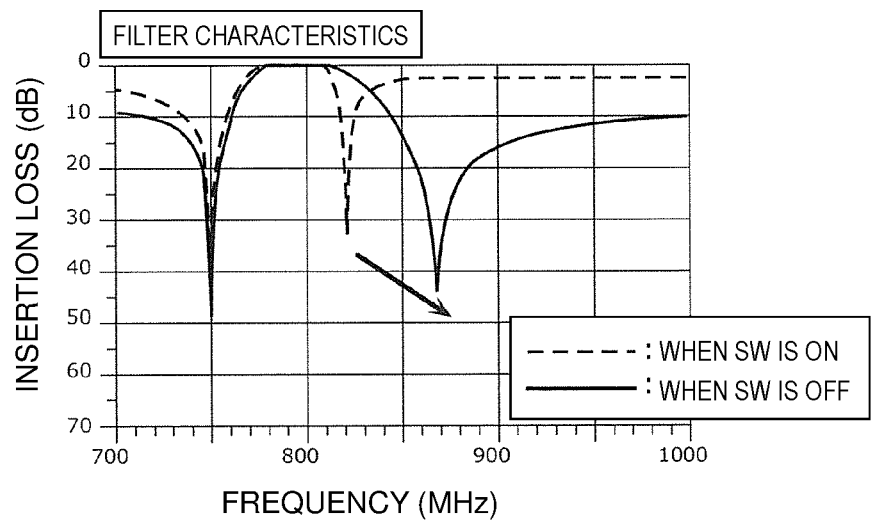
FIG. 12B is a graph illustrating filter characteristics of the filter according to the sixth modified example of the first preferred embodiment of the present invention.

FIG. 12B is a graph illustrating the filter characteristics (bandpass characteristics) of the filter 10F according to the sixth modified example of the first preferred embodiment. More specifically, FIG. 12B is a graph illustrating the comparison result between the filter characteristics when the switch SW is ON and those when the switch SW is OFF.

As in the filter 10, in the filter 10F, the pass band is preferably provided by causing the anti-resonant frequency of the parallel arm resonance circuit (parallel arm resonator p1 in this modified example) and the resonant frequency of the series arm resonance circuit 21F to be close to each other.

In this modified example, the interdigital capacitor C1 is added to the series arm resonator s1 only when the switch SW is ON. With this arrangement, when the switch SW is ON, the anti-resonant frequency of the series arm resonance circuit 21F shifts to the lower-frequency side and becomes lower than that of the series arm resonator s1. Hence, as shown in FIG. 12B, as a result of the switch SW being changed from ON to OFF, the filter 10F is able to shift the frequency of the attenuation pole on the high-frequency side of the pass band to a higher-frequency range.

Resonance Analysis Concerning First Preferred Embodiment and Modified Examples Thereof The principle that the above-described resonant frequencies and anti-resonant frequencies are obtained will be explained based on analysis (resonance analysis) of the impedance characteristics (resonance characteristics) conducted by using equivalent circuit models of resonators.

The resonance characteristics of a single resonator will first be discussed below.

Figure 13A:
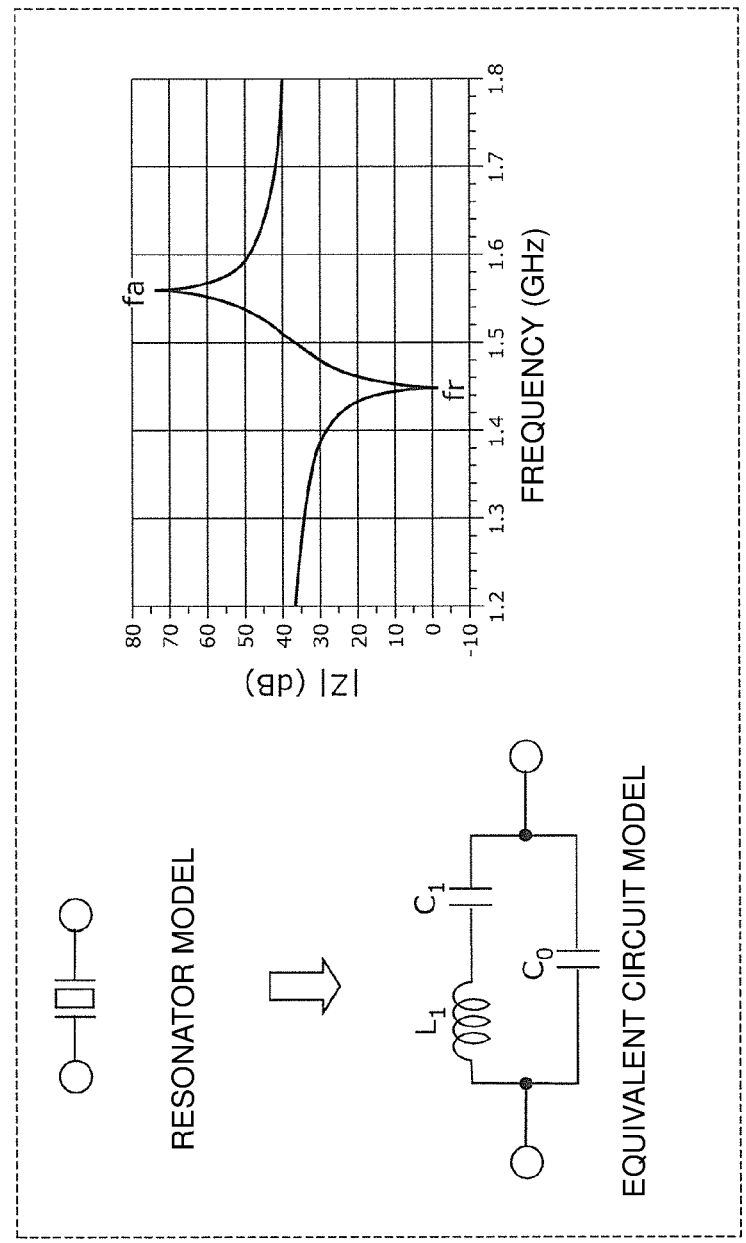
FIG. 13A illustrates an equivalent circuit model of a single resonator and resonance characteristics thereof.

FIG. 13A illustrates an equivalent circuit model of a single resonator and the resonance characteristics thereof. As shown in FIG. 13A, the resonator can be represented by a series circuit of a capacitor $C_1$ and an inductor $L_1$ and a circuit including a capacitor $C_0$ connected in parallel with this series circuit.

In the above-described equivalent circuit, the resonant frequency fr of the resonator is determined by the series circuit of the capacitor $C_1$ and the inductor $L_1$. The resonant frequency fr is the frequency at which the impedance of the equivalent circuit is 0. Accordingly, the resonant frequency fr is expressed by equation 3 as a result of solving equation 2.

$$Z = 0 = j\omega L_1 + \frac{1}{j\omega C_1} \qquad \text{Equation 2}$$

$$f_r = \frac{1}{2\pi\sqrt{L_1 C_1}} \qquad \text{Equation 3}$$

The anti-resonant frequency fa of the resonator is the frequency at which the admittance Y of the above-described equivalent circuit is 0. Accordingly, the anti-resonant frequency fa is expressed by equation 5 as a result of solving equation 4.

$$Y = \frac{1}{Z} = 0 = \frac{1}{\frac{1}{j\omega C_0}} + \frac{1}{j\omega L_1 + \frac{1}{j\omega C_1}} \quad \text{Equation 4}$$

$$f_a = \frac{\sqrt{1 + \frac{C_1}{C_0}}}{2\pi\sqrt{L_1 C_1}} = f_r \sqrt{1 + \frac{C_1}{C_0}} \quad \text{Equation 5}$$

The graph on the right side of FIG. 13A shows that the anti-resonant frequency fa determined by equation 5 is positioned on the higher-frequency side than the resonant frequency fr determined by equation 3.

That is, the resonator has one resonant frequency and one anti-resonant frequency which is positioned on the higher-frequency side than the resonant frequency.

The resonance characteristics of a resonator when an impedance element is connected in series with the resonator will now be explained below by using an equivalent circuit model.

Figure 13B:
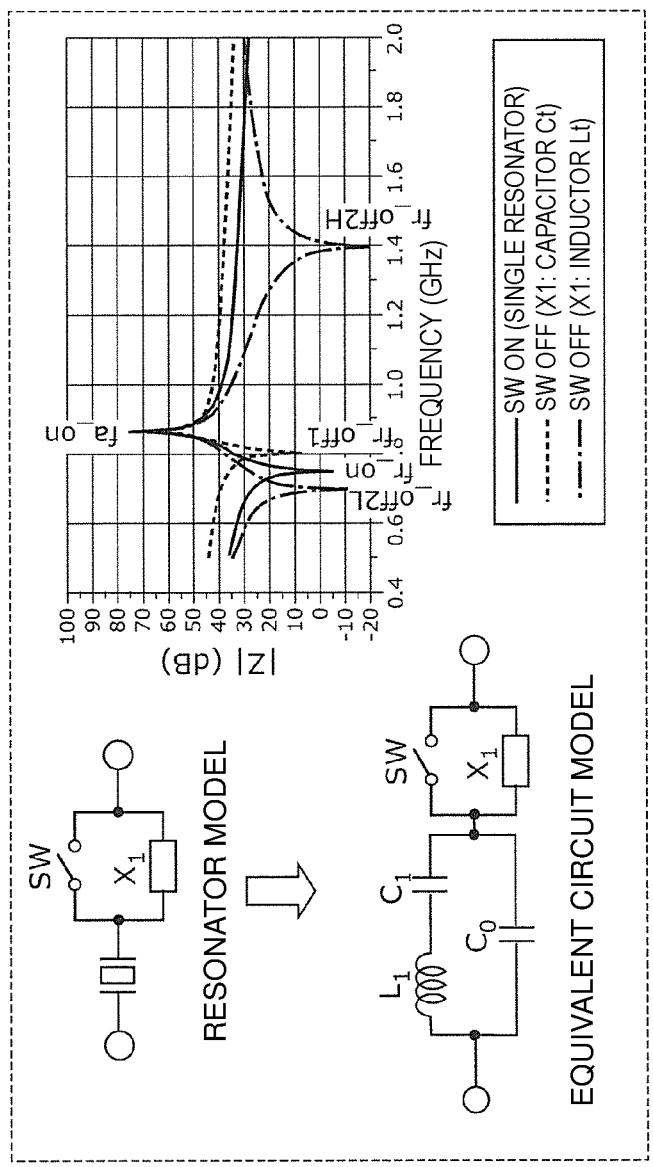
FIG. 13B illustrates an equivalent circuit model in which and an impedance element is connected in series with a resonator and also illustrates resonance characteristics thereof.

FIG. 13B illustrates an equivalent circuit model in which and an impedance element $X_1$ is connected in series with a resonator and also illustrates the resonance characteristics thereof. As shown in FIG. 13B, the resonator is represented by a series circuit of a capacitor $C_1$ and an inductor $L_1$ and a circuit including a capacitor $C_0$ connected in parallel with this series circuit. A parallel circuit of an impedance element $X_1$ and a switch SW is connected to this resonator.

The resonance characteristics of the above-described equivalent circuit when the switch SW is ON will first be discussed. When the switch SW is ON, the impedance element $X_1$ is short-circuited. Accordingly, the resonant frequency fr_on and the anti-resonant frequency fa_on respectively become equal to the resonant frequency fr and the anti-resonant frequency fa shown in FIG. 13A, and are expressed by equations 6 and 7, respectively.

$$f_r\_on = \frac{1}{2\pi\sqrt{L_1 C_1}} \quad \text{Equation 6}$$

$$f_a\_on = \frac{\sqrt{1 + \frac{C_1}{C_0}}}{2\pi\sqrt{L_1 C_1}} = f_r\_on \sqrt{1 + \frac{C_1}{C_0}} \quad \text{Equation 7}$$

The resonance characteristics of the above-described equivalent circuit when the switch SW is OFF will now be discussed. In this case, (1) the resonance characteristics when the impedance element $X_1$ is a capacitor $C_t$ and (2) the resonance characteristics when the impedance element $X_1$ is an inductor $L_t$ will be described.

(1) When the Impedance Element $X_1$ is a Capacitor $C_t$

The resonant frequency fr_off1 when the switch SW is OFF is the frequency at which the impedance Z of the above-described equivalent circuit is 0. Accordingly, the resonant frequency fr_off1 is expressed by equation 9 as a result of solving equation 8.

$$Z = 0 = \frac{1}{\frac{1}{j\omega C_0} + \frac{1}{j\omega L_1 + \frac{1}{j\omega C_1}}} + \frac{1}{j\omega C_t} \quad \text{Equation 8}$$

$$f_r\_off1 = \frac{\sqrt{\frac{C_0 + C_1 + C_t}{L_1 C_1 C_t + L_1 C_0 C_t}}}{2\pi} \quad \text{Equation 9}$$

The anti-resonant frequency fa_off1 when the switch SW is OFF is the same as the anti-resonant frequency fa_on when the switch SW is ON, and is expressed by equation 10.

$$f_a\_off1 = \frac{\sqrt{1 + \frac{C_1}{C_0}}}{2\pi\sqrt{L_1 C_1}} \quad \text{Equation 10}$$

According to equations 6, 7, 9, and 10, the graph on the right side of FIG. 13B shows that, when the impedance element $X_1$ is the capacitor $C_t$, the anti-resonant frequencies fa_on and fa_off1 coincide with each other regardless of whether the switch SW is ON or OFF, and the resonant frequency fr_off1 when the switch SW is OFF is positioned on the higher-frequency side than the resonant frequency fr_on when the switch SW is ON.

(2) When the Impedance Element $X_1$ is an Inductor $L_t$

The resonant frequency fr_off2 when the switch SW is OFF is the frequency at which the impedance Z of the above-described equivalent circuit is 0. Accordingly, the resonant frequency fr_off2 is expressed by equation 12 as a result of solving equation 11.

$$Z = 0 = \frac{1}{\frac{1}{j\omega C_0} + \frac{1}{j\omega L_1 + \frac{1}{j\omega C_1}}} + j\omega L_t \quad \text{Equation 11}$$

$$f_r\_off2L = \frac{\sqrt{\frac{-b - \sqrt{b^2 - 4ac}}{2a}}}{2\pi} \quad \text{Equation 12}$$

$$f_r\_off2H = \frac{\sqrt{\frac{-b + \sqrt{b^2 - 4ac}}{2a}}}{2\pi}$$

$a = L_1 L_t C_0 C_1$
$b = -L_1 C_1 - L_t C_0 - L_t C_1$
$c = 1$

In equation 12, fr_off2L is the lower resonant frequency when the switch SW is OFF, and fr_off2H is the higher resonant frequency when the switch SW is OFF.

The anti-resonant frequency fa_off2 when the switch SW is OFF is the same as the anti-resonant frequency fa_on when the switch SW is ON, and is expressed by equation 13.

$$f_a\_off2 = \frac{\sqrt{1 + \frac{C_1}{C_0}}}{2\pi\sqrt{L_1 C_1}} \quad \text{Equation 13}$$

According to equations 6, 7, 12, and 13, the graph on the right side of FIG. 13B shows that, when the impedance element $X_1$ is the inductor $L_t$, the anti-resonant frequencies fa_on and fa_off2 coincide with each other regardless of whether the switch SW is ON or OFF. The graph on the right side of FIG. 13B also shows that the resonant frequency fr_off2L when the switch SW is OFF is positioned on the lower-frequency side than the resonant frequency fr_on when the switch SW is ON and that the resonant frequency fr_off2H is added when the switch SW is OFF.

The resonance characteristics of a resonator when an impedance element is connected in parallel with the resonator will now be discussed below. In this case, the resonance characteristics when the impedance element is a capacitor $C_t$ will be discussed, and a description of the resonance characteristics when the impedance element is an inductor will not be given. The equivalent circuit model of this configuration is different from that shown in FIG. 13A merely in that a capacitor $C_t$ is connected in parallel with the equivalent circuit model shown in FIG. 13A, and an explanation thereof will thus be simplified.

When the impedance element is a capacitor $C_t$, the capacitor $C_t$ is connected in parallel with the capacitor $C_0$ in the equivalent circuit model shown in FIG. 13A. The resonant frequency of such an equivalent circuit is found to be the same as that of a single resonator. It is seen from equation 7 that the anti-resonant frequency of this equivalent circuit is shifted to the lower-frequency side and becomes lower than that of the single resonator.

The characteristics of parallel-connected resonators will now be explained below by using an equivalent circuit model.

Figure 13C:
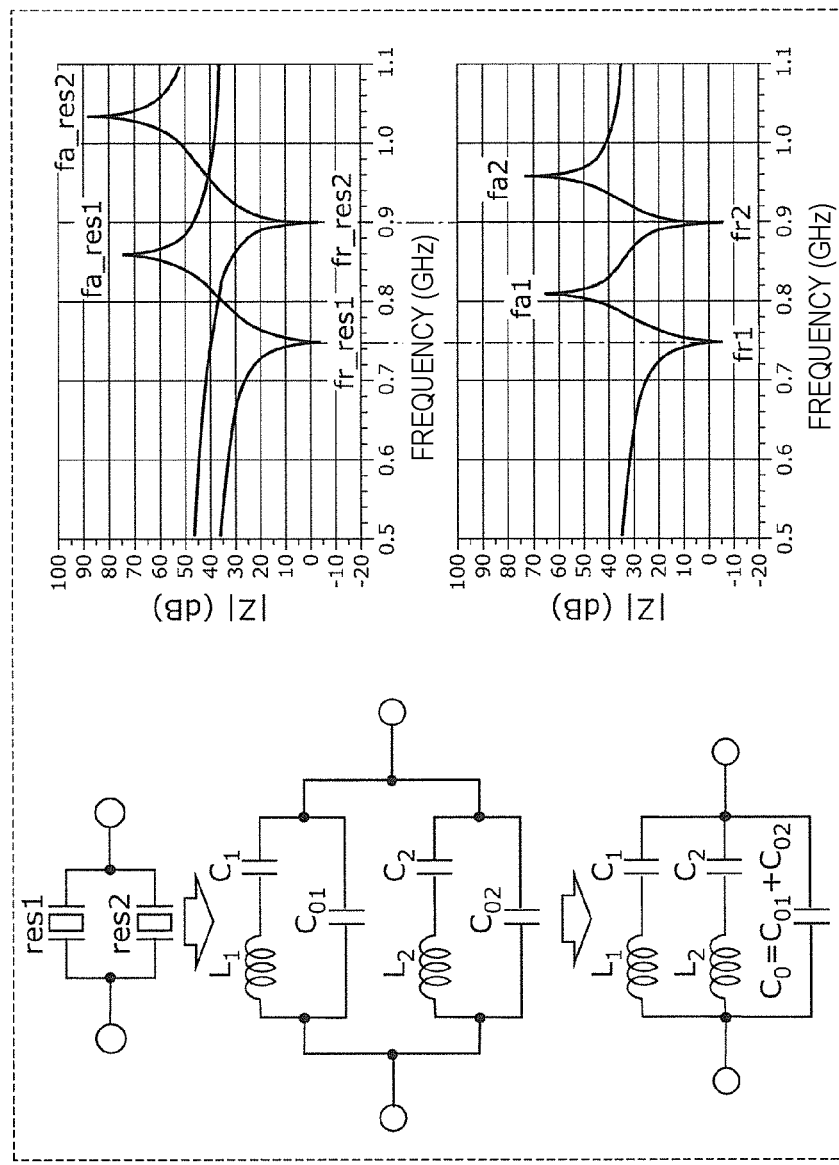
FIG. 13C illustrates an equivalent circuit model of two resonators connected in parallel with each other and also illustrates resonance characteristics thereof.

FIG. 13C illustrates an equivalent circuit model of two resonators connected in parallel with each other and also illustrates the resonance characteristics of the parallel-connected resonators. In FIG. 13C, a model of resonators res1 and res2 connected in parallel with each other is shown. The resonator res1 is represented by a series circuit of a capacitor $C_1$ and an inductor $L_1$ and a circuit including a capacitor $C_{01}$ connected in parallel with this series circuit. The resonator res2 is represented by a series circuit of a capacitor $C_2$ and an inductor $L_2$ and a circuit including a capacitor $C_{02}$ connected in parallel with this series circuit. The capacitor $C_{01}$ is the electrostatic capacity of the resonator res1, while the capacitor $C_{02}$ is the electrostatic capacity of the resonator res2. The circuit including the resonators res1 and res2 connected in parallel with each other can be represented by the equivalent circuit shown on the bottom left side of FIG. 13C. That is, the circuit including the parallel-connected resonators res1 and res2 can be represented by a parallel circuit of a series circuit of the capacitor $C_1$ and the inductor $L_1$, a series circuit of the capacitor $C_2$ and the inductor $L_2$, and the capacitor $C_0$ (=$C_{01}$+$C_{02}$).

In the above-described equivalent circuit, the resonant frequency fr of the resonator is defined by the series circuit of the capacitor $C_1$ and the inductor $L_1$ and is expressed by equation 3.

In the above-described equivalent circuit, two resonant frequencies are defined. The resonant frequency fr1 is defined by the series circuit of the capacitor $C_1$ and the inductor $L_1$ and the resonant frequency fr2 is defined by the series circuit of the capacitor $C_2$ and the inductor $L_2$. The resonant frequencies fr1 and fr2 are expressed by equation 14.

$$f_r1 = \frac{1}{2\pi\sqrt{L_1 C_1}} \quad \text{Equation 14}$$

$$f_r2 = \frac{1}{2\pi\sqrt{L_2 C_2}}$$

That is, the two resonant frequencies fr1 and fr2 represented by the above-described equivalent circuit are equal to the resonant frequency fr_res1 of the resonator res1 and the resonant frequency fr_res2 of the resonator res2, respectively.

The anti-resonant frequency of this equivalent circuit is the frequency at which the admittance Y of the equivalent circuit is 0. Accordingly, by solving equation 15, this equivalent circuit is found to have two anti-resonant frequencies (fa1, fa2), as expressed by equation 16.

$$Y = \frac{1}{Z} = 0 = j\omega C_0 + \frac{1}{j\omega L_1 + \frac{1}{j\omega C_1}} + \frac{1}{j\omega L_2 + \frac{1}{j\omega C_2}} \quad \text{Equation 15}$$

$$f_a1 = \frac{\sqrt{\frac{-b - \sqrt{b^2 - 4ac}}{2a}}}{2\pi} \quad \text{Equation 16}$$

$$f_a2 = \frac{\sqrt{\frac{-b + \sqrt{b^2 - 4ac}}{2a}}}{2\pi}$$

$$a = L_1 L_2 C_0 C_1 C_2$$
$$b = -L_1 C_0 C_1 - L_2 C_0 C_2 - L_1 C_1 C_2 - L_2 C_1 C_2$$
$$c = C_0 + C_1 + C_2$$

The anti-resonant frequencies fa1 and fa2 determined from equation 15 are different from the anti-resonant frequencies of the single resonators (indicated by fa_res1 and fa_res2 in the graph of FIG. 13C) determined from equation 4. More specifically, the anti-resonant frequency fa1 determined from equation 15 is lower than the anti-resonant frequency fa_res1 of the single resonator res1, and the anti-resonant frequency fa2 determined from equation 15 is lower than the anti-resonant frequency fa_res2 of the single resonator res2.

A model in which a capacitor is connected in series with the resonators res1 and res2 will be analyzed.

The configuration in which the capacitor Cx is connected in series with the resonator res2, that is, a circuit (circuit A) in which the resonator res1 and a series circuit of the resonator res2 and the capacitor Cx are connected in parallel with each other, is now considered.

(i) A case in which the resonant frequency $fr_{res1}$ of the resonator res1 is lower than the resonant frequency $fr_{res2}$ of the resonator res2 will be discussed. The two resonant frequencies FrL (lower-frequency side) and FrH (higher-frequency side) of the circuit A are the frequency at which the impedance of the circuit A is 0. Accordingly, the resonant frequencies FrL and FrH are expressed by equations 19 and 20 as a result of solving equations 17 and 18, respectively.

$$Z_{rL} = 0 = j\omega_{rL} L_1 + \frac{1}{j\omega_{rL} C_1} \quad \text{Equation 17}$$

$$Z_{rH} = 0 = \frac{1}{\frac{1}{j\omega_{rH} C_{02}} + \frac{1}{j\omega_{rH} L_2 + \frac{1}{j\omega_{rH} C_2}}} + \frac{1}{j\omega_{rH} C_x} \quad \text{Equation 18}$$

$$F_{rL} = \frac{1}{2\pi\sqrt{L_1 C_1}} \quad \text{Equation 19}$$

$$F_{rH} = \frac{\sqrt{\frac{C_{02} + C_2 + C_x}{L_2 C_2 C_x + L_2 C_{02} C_2}}}{2\pi} \quad \text{Equation 20}$$

(ii) A case in which the resonant frequency $fr_{res1}$ is higher than the resonant frequency $fr_{res2}$ will be discussed. The two resonant frequencies FrL (lower-frequency side) and FrH (higher-frequency side) of the circuit A are the frequency at which the impedance of the circuit A is 0. Accordingly, the resonant frequencies FrL and FrH are expressed by equations 23 and 24 as a result of solving equations 21 and 22, respectively.

$$Z_{rL} = 0 = \cfrac{1}{\cfrac{1}{\cfrac{1}{j\omega_{rL}C_{02}} + \cfrac{1}{j\omega_{rL}L_2 + \cfrac{1}{j\omega_{rL}C_2}}}} + \cfrac{1}{j\omega_{rL}C_x} \quad \text{Equation 21}$$

$$Z_{rH} = 0 = j\omega_{rH}L_1 + \cfrac{1}{j\omega_{rH}C_1} \quad \text{Equation 22}$$

$$F_{rL} = \cfrac{\sqrt{\cfrac{C_{02} + C_2 + C_x}{L_2 C_2 C_x + L_2 C_{02} C_2}}}{2\pi} \quad \text{Equation 23}$$

$$F_{rH} = \cfrac{1}{2\pi\sqrt{L_1 C_1}} \quad \text{Equation 24}$$

(iii) The two anti-resonant frequencies FaL (lower-frequency side) and FaH (higher-frequency side) of the circuit A are the frequency at which the admittance Ya of the circuit A is 0. Accordingly, the anti-resonant frequencies FaL and FaH are expressed by equation 26 as a result of solving equation 25.

$$Y_a = 0 = \cfrac{1}{\cfrac{1}{j\omega_a C_{01}} + \cfrac{1}{j\omega_a L_1 + \cfrac{1}{j\omega_a C_1}}} + \quad \text{Equation 25}$$

$$\cfrac{1}{\cfrac{1}{\cfrac{1}{\cfrac{1}{j\omega_a C_{02}} + \cfrac{1}{j\omega_a L_2 + \cfrac{1}{j\omega_a C_2}}}} + \cfrac{1}{j\omega_a C_x}}$$

$$F_{aL} = \cfrac{\sqrt{\cfrac{-B - \sqrt{B^2 - 4AC}}{2A}}}{2\pi} \quad \text{Equation 26}$$

$$F_{aH} = \cfrac{\sqrt{\cfrac{-B + \sqrt{B^2 - 4AC}}{2A}}}{2\pi}$$

$A = L_1 L_2 C_1 C_2 (C_{01} C_{02} + C_{01} C_x + C_{02} C_x)$ $B = -C_{01} C_{02}(L_1 C_1 + L_2 C_2) - C_1 C_2(L_1 C_{01} + L_2 C_{02} + L_1 C_x + L_2 C_x) - C_x(L_1 C_{01} C_1 + L_1 C_{02} C_1 + L_2 C_{01} C_2 + L_2 C_{02} C_2)$ $C = C_{01} C_x + C_{01} C_{02} + C_{02} C_x + C_{02} C_1 + C_{01} C_2 + C_1 C_2 + C_1 C_x + C_2 C_x$

The configuration in which the capacitor Cx is connected in series with the resonator res2 and the capacitor Cy is connected in series with the resonator res1, that is, a circuit (circuit B) in which a series circuit of the resonator res1 and the capacitor Cy and a series circuit of the resonator res2 and the capacitor Cx are connected in parallel with each other, is now considered.

(iv) A case in which the resonant frequency $fr_{res1}$ is lower than the resonant frequency $fr_{res2}$ will be discussed. The two resonant frequencies FrL (lower-frequency side) and FrH (higher-frequency side) of the circuit B are the frequency at which the impedance of the circuit B is 0. Accordingly, the resonant frequencies FrL and FrH are expressed by equations 29 and 30 as a result of solving equations 27 and 28, respectively.

$$Z_{rL} = 0 = \cfrac{1}{\cfrac{1}{j\omega_{rL}C_{01}} + \cfrac{1}{j\omega_{rL}L_1 + \cfrac{1}{j\omega_{rL}C_1}}} + \cfrac{1}{j\omega_{rL}C_y} \quad \text{Equation 27}$$

$$Z_{rH} = 0 = \cfrac{1}{\cfrac{1}{j\omega_{rH}C_{02}} + \cfrac{1}{j\omega_{rH}L_2 + \cfrac{1}{j\omega_{rH}C_2}}} + \cfrac{1}{j\omega_{rH}C_x} \quad \text{Equation 28}$$

$$F_{rL} = \cfrac{\sqrt{\cfrac{C_{01} + C_1 + C_y}{L_1 C_1 C_y + L_1 C_{01} C_1}}}{2\pi} \quad \text{Equation 29}$$

$$F_{rH} = \cfrac{\sqrt{\cfrac{C_{02} + C_2 + C_x}{L_2 C_2 C_x + L_2 C_{02} C_2}}}{2\pi} \quad \text{Equation 30}$$

(v) A case in which the resonant frequency $fr_{res1}$ is higher than the resonant frequency $fr_{res2}$ will be discussed. The two resonant frequencies FrL (lower-frequency side) and FrH (higher-frequency side) of the circuit B are the frequency at which the impedance of the circuit B is 0. Accordingly, the resonant frequencies FrL and FrH are expressed by equations 33 and 34 as a result of solving equations 31 and 32, respectively.

$$Z_{rL} = 0 = \cfrac{1}{\cfrac{1}{j\omega_{rL}C_{02}} + \cfrac{1}{j\omega_{rL}L_2 + \cfrac{1}{j\omega_{rL}C_2}}} + \cfrac{1}{j\omega_{rL}C_x} \quad \text{Equation 31}$$

$$Z_{rH} = 0 = \cfrac{1}{\cfrac{1}{j\omega_{rH}C_{01}} + \cfrac{1}{j\omega_{rH}L_1 + \cfrac{1}{j\omega_{rH}C_1}}} + \cfrac{1}{j\omega_{rH}C_y} \quad \text{Equation 32}$$

$$F_{rL} = \cfrac{\sqrt{\cfrac{C_{02} + C_2 + C_x}{L_2 C_2 C_x + L_2 C_{02} C_2}}}{2\pi} \quad \text{Equation 33}$$

$$F_{rH} = \cfrac{\sqrt{\cfrac{C_{01} + C_1 + C_y}{L_1 C_1 C_y + L_1 C_{01} C_1}}}{2\pi} \quad \text{Equation 34}$$

(vi) The two anti-resonant frequencies FaL (lower-frequency side) and FaH (higher-frequency side) of the circuit B are the frequency at which the admittance Ya of the circuit B is 0. Accordingly, the anti-resonant frequencies FaL and FaH are expressed by equation 36 as a result of solving equation 35.

$$Y_a = 0 = \cfrac{1}{\cfrac{1}{\cfrac{1}{j\omega_a C_{01}} + \cfrac{1}{j\omega_a L_1 + \cfrac{1}{j\omega_a C_1}}} + \cfrac{1}{j\omega_a C_y}} + \quad \text{Equation 35}$$

-continued $$F_{aL} = \frac{\sqrt{\dfrac{-B - \sqrt{B^2 - 4AC}}{2A}}}{2\pi}$$

$$F_{aH} = \frac{\sqrt{\dfrac{-B + \sqrt{B^2 - 4AC}}{2A}}}{2\pi}$$

Equation 36: $\dfrac{1}{\dfrac{1}{\dfrac{1}{\dfrac{1}{j\omega_a C_{02}} + \dfrac{1}{j\omega_a L_2 + \dfrac{1}{j\omega_a C_2}}} + \dfrac{1}{j\omega_a C_x}}}$ $A = L_1 L_2 C_{01} C_{02} C_1 C_2 (C_y + C_x) + L_1 L_2 C_1 C_2 C_x C_y (C_{01} + C_{02})$ $B = C_x C_y (L_1 C_{01} C_1 + L_2 C_{02} C_2 + L_2 C_{01} C_2 + L_1 C_{02} C_1) +$
$C_{01} C_{02} (L_1 C_1 C_y + L_2 C_2 C_x + L_2 C_2 C_y + L_1 C_1 C_x) + C_1 C_2 (L_1 C_{01} C_y +$
$L_2 C_{02} C_x + L_2 C_x C_y + L_2 C_{02} C_y + L_1 C_x C_y + L_1 C_{01} C_x)$ $C = C_x C_y (L_2 C_{01} C_2 + L_1 C_{02} C_1) + C_{01} C_{02} (L_2 C_2 C_y + L_1 C_1 C_x) +$
$C_1 C_2 (L_2 C_x C_y + L_2 C_{02} C_y + L_1 C_x C_y + L_1 C_{01} C_x)$ Based on the above-described resonance analysis, it is validated that, in the radio-frequency filters of the first preferred embodiment and the modified examples thereof, the resonant frequency or the anti-resonant frequency of the series arm resonance circuit or the parallel arm resonance circuit is shifted as a result of the switch SW being switched between ON and OFF.

For example, in the first preferred embodiment, as a result of the switch SW being switched from ON to OFF, the parallel arm resonance circuit 21 is switched from the circuit only defined by the parallel arm resonator p1 to the circuit including the parallel arm resonator p1 and the interdigital capacitor C1 connected in series with each other. Hence, the resonant frequency of the parallel arm resonance circuit 21 shifts from the frequency expressed by equation 3 to that by equation 9. The attenuation pole on the low-frequency side of the pass band thus shifts to a higher-frequency range.

In the first modified example of the first preferred embodiment, for example, as a result of the switch SW being switched from ON to OFF, the parallel arm resonance circuit 21A is switched from the circuit including the parallel arm resonator p1 and the interdigital capacitor C1 connected in series with each other to the circuit in which a parallel circuit of the interdigital capacitor C1 and the inductor L are connected in series with the parallel arm resonator p1. Accordingly, the resonant frequency of the parallel arm resonance circuit 21A shifts from the frequency expressed by equation 38, which will be discussed later, to that by equation 9. The frequency of the attenuation pole on the low-frequency side of the pass band shifts to a higher-frequency range by a considerable amount.

The resonance characteristics of the parallel arm resonance circuit 21A when the switch SW is ON will be described below by using an equivalent circuit model.

An equivalent circuit model in which a parallel circuit of the capacitor $C_t$ and the inductor $L_t$ is connected in series with the resonator is a circuit in which the capacitor $C_t$ and the inductor $L_t$ are connected in parallel with the equivalent circuit model of the resonator shown in FIG. 13A.

The resonant frequency $f_{rmL}$ (lower-frequency side) and the resonant frequency $f_{rmH}$ (higher-frequency side) of this equivalent circuit are the frequency at which the impedance $Z_{rm}$ of this equivalent circuit is 0. Accordingly, the resonant frequencies $f_{rmL}$ and $f_{rmH}$ are expressed by equation 38 as a result of solving equation 37.

$$Z_{rm} = \qquad\qquad\qquad\qquad\qquad\qquad \text{Equation 37}$$

$$0 = \dfrac{1}{\dfrac{1}{j\omega_{rm} C_0} + \dfrac{1}{j\omega_{rm} L_1 + \dfrac{1}{j\omega_{rm} C_1}}} + \dfrac{1}{\dfrac{1}{j\omega_{rm} L_t} + \dfrac{1}{j\omega_{rm} C_t}}$$

$$f_{rmL} = \frac{\sqrt{\dfrac{-b - \sqrt{b^2 - 4ac}}{2a}}}{2\pi} \qquad \text{Equation 38}$$

$$f_{rmH} = \frac{\sqrt{\dfrac{-b + \sqrt{b^2 - 4ac}}{2a}}}{2\pi}$$

$a = L_1 L_t C_0 C_1 + L_1 L_t C_1 C_t$
$b = -L_1 C_1 - L_t C_0 - L_t C_1 - L_t C_t$
$c = 1$

The lower anti-resonant frequency $f_{amL}$ of this equivalent circuit is the frequency at which the lower admittance $Y_{amL}$ of the equivalent circuit is 0. Accordingly, the anti-resonant frequency $f_{amL}$ is expressed by equation 40 as a result of solving equation 39. The higher anti-resonant frequency $f_{amH}$ of the equivalent circuit is the frequency at which the higher admittance $Y_{amH}$ of the equivalent circuit is 0. Accordingly, the anti-resonant frequency $f_{amH}$ is expressed by equation 42 as a result of solving equation 41.

$$Y_{amL} = \frac{1}{Z_{amL}} = 0 = \dfrac{1}{\dfrac{1}{j\omega_{amL} C_0}} + \dfrac{1}{j\omega_{amL} L_1 + \dfrac{1}{j\omega_{amL} C_1}} \qquad \text{Equation 39}$$

$$f_{amL} = \frac{\sqrt{1 + \dfrac{C_1}{C_0}}}{2\pi \sqrt{L_1 C_1}} = f_{amL} \sqrt{1 + \dfrac{C_1}{C_0}} \qquad \text{Equation 40}$$

$$Y_{amH} = \frac{1}{Z_{amH}} = 0 = \frac{1}{j\omega_{amH} L_t} + j\omega_{amH} C_t \qquad \text{Equation 41}$$

$$f_{amH} = \frac{1}{2\pi \sqrt{L_t C_t}} \qquad \text{Equation 42}$$

In the second and third modified examples of the first preferred embodiment, for example, as a result of the switch SW being switched from ON to OFF, the parallel arm resonance circuit is switched from the circuit in which the parallel arm resonators p1 and p2 are connected in parallel with each other to the circuit in which a series circuit of one of the parallel arm resonators (the parallel arm resonator p1 in the second modified example of the first preferred embodiment, for example) and the interdigital capacitor C1 is connected in parallel with the other one of the parallel arm resonators (the parallel arm resonator p2 in the second modified example of the first preferred embodiment, for example). Accordingly, the resonant frequency of the parallel arm resonance circuit shifts from the frequency expressed by equation 14 to that by equations 23 and 24. The anti-resonant frequency of the parallel arm resonance circuit shifts from the frequency expressed by equation 16 to that by equation 26. The frequency of the attenuation pole and the pass band thus shift to the higher-frequency side.

In the fourth modified example of the first preferred embodiment, for example, as a result of both of the switches SW1 and SW2 being switched from ON to OFF, the parallel arm resonance circuit 21D is switched from the circuit in which the parallel arm resonators p1 and p2 are connected in parallel with each other to the circuit in which a series circuit of the parallel arm resonator p1 and the interdigital capacitor C1 and a series circuit of the parallel arm resonator p2 and the interdigital capacitor C2 are connected in parallel with each other. Accordingly, the resonant frequency of the parallel arm resonance circuit 21D shifts from the frequency expressed by equation 14 to that by equations 29 and (or equations 33 and 34). The anti-resonant frequency of the parallel arm resonance circuit 21D shifts from the frequency expressed by equation 16 to that by equation 36. The frequencies of the attenuation poles on both sides of the pass band and the pass band thus shift to a higher-frequency range.

In the fifth modified example of the first preferred embodiment, for example, as a result of the switch SW being switched from ON to OFF, the parallel arm resonance circuit 21E is switched from the circuit in which the parallel arm resonators p1 and p2 are connected in parallel with each other to the circuit in which one capacitor is connected in series with the parallel circuit of the parallel arm resonators p1 and p2. Accordingly, the resonant frequency of the parallel arm resonance circuit 21E shifts from the frequency expressed by equation 14. The frequencies of the attenuation poles on both sides of the pass band thus shift to a higher-frequency range.

The resonant frequency and the anti-resonant frequency of the parallel arm resonance circuit 21E when the switch SW is OFF have not been explained above based on resonance analysis. However, the resonant frequency and the anti-resonant frequency of the parallel arm resonance circuit 21E may be explained by using an equivalent circuit model of the parallel arm resonance circuit 21E when the switch SW is OFF. More specifically, the resonant frequency and the anti-resonant frequency of the parallel arm resonance circuit 21E may be explained by using an equivalent circuit model in which one capacitor is connected in series with a parallel circuit of two resonators. Each of the frequencies at which the impedance of this equivalent circuit model (equivalent circuit) is 0 is the resonant frequency of the parallel arm resonance circuit 21E, while each of the frequencies at which the admittance of this equivalent circuit model is 0 is the anti-resonant frequency of the parallel arm resonance circuit 21E.

In the sixth modified example of the first preferred embodiment, for example, as a result of the switch SW being switched from ON to OFF, the series arm resonance circuit 21F is switched from the circuit only defined by the series arm resonator s1 to the circuit in which the series arm resonator s1 and the interdigital capacitor C1 are connected in parallel with each other. Accordingly, the anti-resonant frequency of the series arm resonance circuit 21F shifts from the frequency expressed by equation 5 to that expressed by an equation in which $C_0$ in equation 7 is replaced by the combined capacitance of $C_0$ and the interdigital capacitor C1. The frequency of the attenuation pole on the high-frequency side of the pass band thus shifts to a higher-frequency range.

Second Preferred Embodiment

The above-described configuration of a filter including an interdigital capacitor is not restricted to a one-stage ladder filter structure and may be applicable to a multiple-stage ladder filter structure, for example. In this preferred embodiment, a filter having such a multiple-stage ladder filter structure will be described below through illustration of a tunable filter.

Figure 14A:
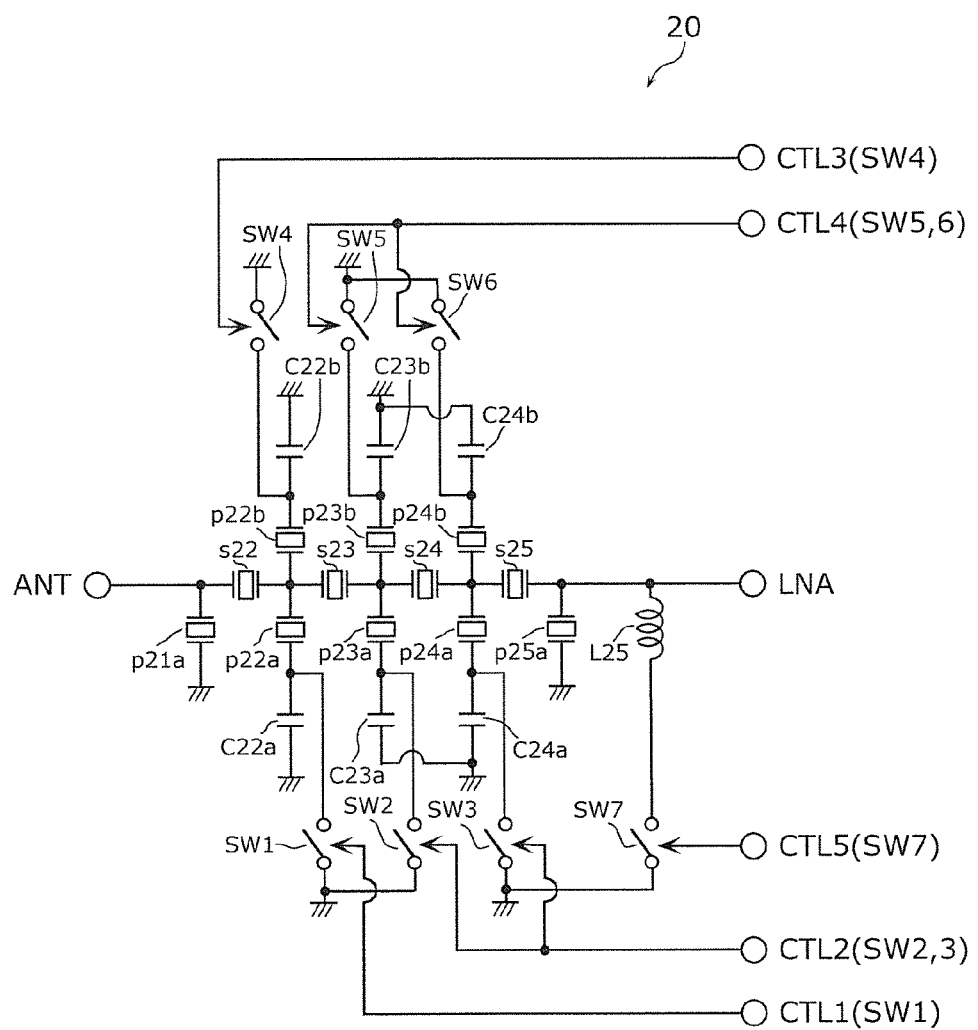
FIG. 14A is a circuit diagram of a filter according to a second preferred embodiment of the present invention.

FIG. 14A is a circuit diagram of a filter 20 according to a second preferred embodiment of the present invention.

Figure 27:
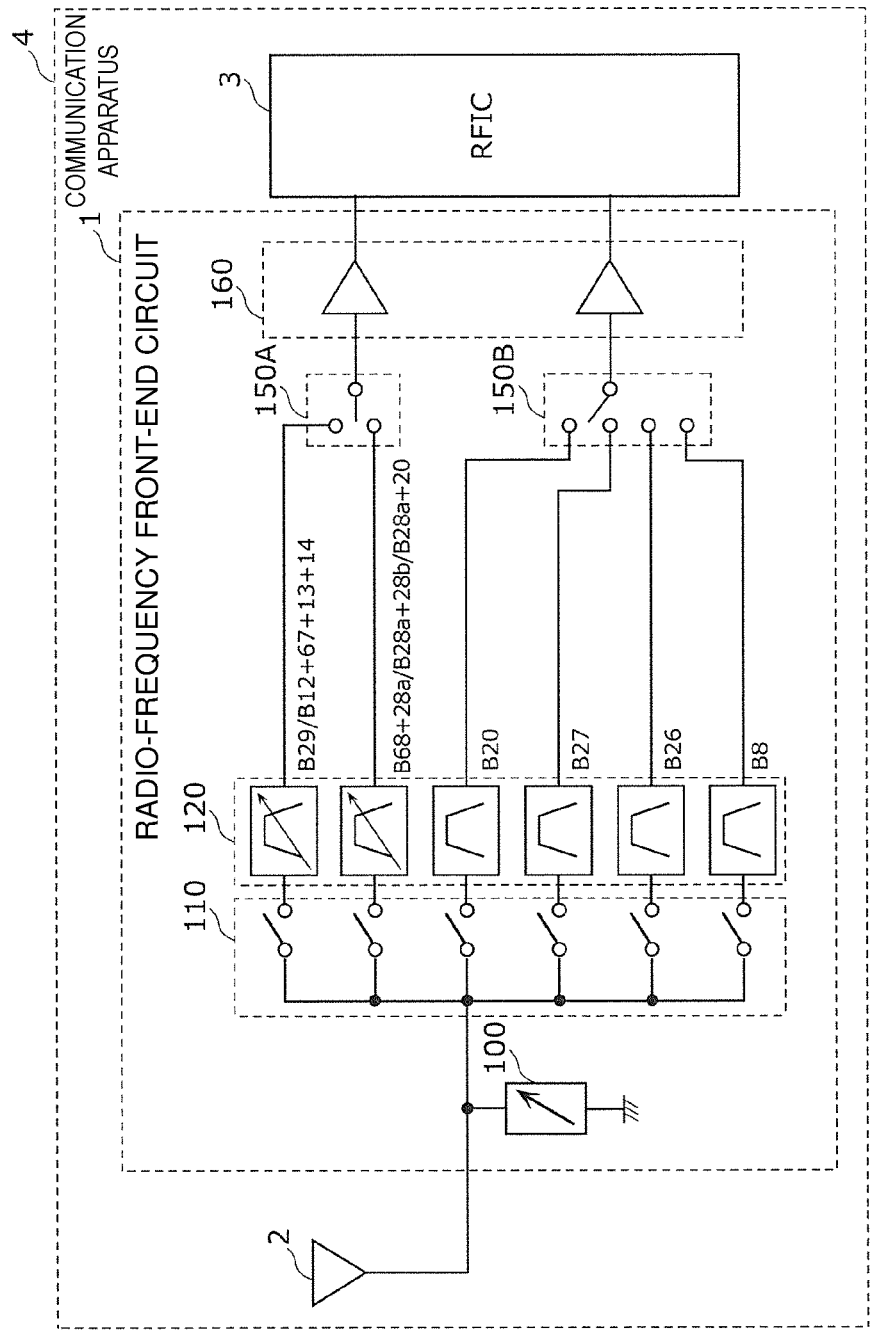
FIG. 27 is a circuit diagram of a radio-frequency front-end circuit according to a fourth preferred embodiment of the present invention and its surrounding circuits.

The filter 20 shown in FIG. 14A preferably causes a radio-frequency signal of a predetermined band input from an antenna terminal 2 (see FIG. 27) into an ANT terminal (first input-output terminal) to selectively pass through the filter 20 and outputs the radio-frequency signal from an LNA terminal (second input-output terminal) connected to a low-noise amplifier (see FIG. 27). In this case, the filter 20 switches the predetermined band in accordance with control signals input into control terminals CTL1 through CTL5 from a controller, such as an RFIC 3 (see FIG. 27).

More specifically, the filter 20 is preferably an acoustic wave filter device having a ladder filter structure including series arm resonators s22 through s25, parallel arm resonators p21a through p25a, and parallel arm resonators p22b through p24b. The filter 20 also includes interdigital capacitors C22a through C24a respectively connected to the parallel arm resonators p22a through p24a and interdigital capacitors C22b through C24b respectively connected to the parallel arm resonators p22b through p24b. The filter 20 also includes switches SW1 through SW3 which are respectively connected in parallel with the interdigital capacitors C22a through C24a and which form variable frequency circuits together with the interdigital capacitors C22a through C24a. The filter 20 also includes switches SW4 through SW6 which are respectively connected in parallel with the interdigital capacitors C22b through C24b and which form variable frequency circuits together with the interdigital capacitors C22b through C24b. The filter 20 also includes a series circuit of an inductor L25 and a switch SW7 which connects the LNA terminal and a ground.

The switch SW1 is switched between ON and OFF in accordance with a control signal input into the control terminal CTL1. The switches SW2 and SW3 are switched between ON and OFF in accordance with a control signal input into the control terminal CTL2. The switch SW4 is switched between ON and OFF in accordance with a control signal input into the control terminal CTL3. The switches SW5 and SW6 are switched between ON and OFF in accordance with a control signal input into the control terminal CTL4. The switch SW7 is switched between ON and OFF in accordance with a control signal input into the control terminal CTL5.

Table 2 shows the details of the desired parameters (wavelength of acoustic waves, electrode finger pitch, number of pairs of electrode fingers, and interdigital width) of the individual resonators defining the filter 20 of this preferred embodiment. The structure and film thickness of the electrode fingers of the resonators are those (see Table 1) discussed in the first preferred embodiment with reference to FIG. 3A. The ratio of the film thickness to the electrode finger pitch in the resonators is preferably about 13.2 to about 15.2%, for example. The electrode duty of the resonators is preferably about 0.50, for example.

TABLE 2

|  | Parallel arm resonator p22b | Parallel arm resonator p23b | Parallel arm resonator p24b |
| --- | --- | --- | --- |
| Wavelength of acoustic waves (μm) | 4.2214 | 4.2425 | 4.1598 |
| Electrode finger pitch (μm) | 2.1107 | 2.1213 | 2.0799 |

TABLE 2-continued

| Number of pairs of electrode fingers | 18.0 | 18.0 | 18.0 |
|---|---|---|---|
| Interdigital width (μm) | 55.56 | 55.56 | 55.56 |

|  | Series arm resonator s22 | Series arm resonator s23 | Series arm resonator s24 | Series arm resonator s25 |
|---|---|---|---|---|
| Wavelength of acoustic waves (μm) | 4.3298 | 4.4479 | 4.3623 | 4.3206 |
| Electrode finger pitch (μm) | 2.1649 | 2.2240 | 2.1812 | 2.1603 |
| Number of pairs of electrode fingers | 100.0 | 105.0 | 160.0 | 140.0 |
| Interdigital width (μm) | 44.40 | 46.67 | 75.88 | 52.00 |

|  | Parallel arm resonator p21a | Parallel arm resonator p22a | Parallel arm resonator p23a | Parallel arm resonator p24a | Parallel arm resonator p25a |
|---|---|---|---|---|---|
| Wavelength of acoustic waves (μm) | 4.7046 | 4.7371 | 4.7354 | 4.7234 | 4.7742 |
| Electrode finger pitch (μm) | 2.3523 | 2.3686 | 2.3677 | 2.3617 | 2.3871 |
| Number of pairs of electrode fingers | 21.0 | 55.0 | 65.0 | 60.0 | 147.0 |
| Interdigital width (μm) | 47.62 | 254.40 | 168.62 | 201.67 | 85.99 |

Table 3 shows the details of the desired parameters (electrode finger pitch, number of pairs of electrode fingers, and interdigital width) of the interdigital capacitors defining the filter 20 of this preferred embodiment. The structure and film thickness of the electrode fingers of the interdigital capacitors are those (see Table 1) discussed in the first preferred embodiment with reference to FIG. 3A. The ratio of the film thickness to the electrode finger pitch in the interdigital capacitors is preferably about 16.9%. The electrode duty of the interdigital capacitors is preferably about 0.55, for example.

TABLE 3

|  | Interdigital capacitor C22b | Interdigital capacitor C23b | Interdigital capacitor C24b |
|---|---|---|---|
| Electrode finger pitch (μm) | 0.6500 | 0.6500 | 0.6500 |
| Number of pairs of electrode fingers | 50.0 | 50.0 | 50.0 |
| Interdigital width (μm) | 62.00 | 20.80 | 18.40 |

|  | Interdigital capacitor C22a | Interdigital capacitor C23a | Interdigital capacitor C24a |
|---|---|---|---|
| Electrode finger pitch (μm) | 0.6500 | 0.6500 | 0.6500 |
| Number of pairs of electrode fingers | 190.0 | 130.0 | 170.0 |
| Interdigital width (μm) | 231.90 | 164.93 | 200.00 |

As indicated in Tables 2 and 3, the electrode finger pitches of the interdigital capacitors C22a through C24a and C22b through C24b are preferably smaller than those of the parallel arm resonators p22a through p24a and p22b through p24b respectively connected to the interdigital capacitors C22a through C24a and C22b through C24b without another acoustic wave resonator interposed therebetween. The film thickness of the electrode fingers of the interdigital capacitors C22a through C24a and C22b through C24b is smaller than that of the parallel arm resonators p22a through p24a and p22b through p24b (see Table 1).

In the filter 20, it is possible to achieve both of the required Q factor of the parallel arm resonators p22a through p24a and p22b through p24b and that of the interdigital capacitors C22a through C24a and C22b through C24b. That is, in two or more stages (preferably, for example, three stages in this preferred embodiment) of the multiple-stage ladder filter structure of the filter 20, both of the required Q factor of the acoustic wave resonators and that of the interdigital capacitors are achieved. It is thus possible to reduce the loss within the pass band while increasing the attenuation in the attenuation band.

Figure 14B:
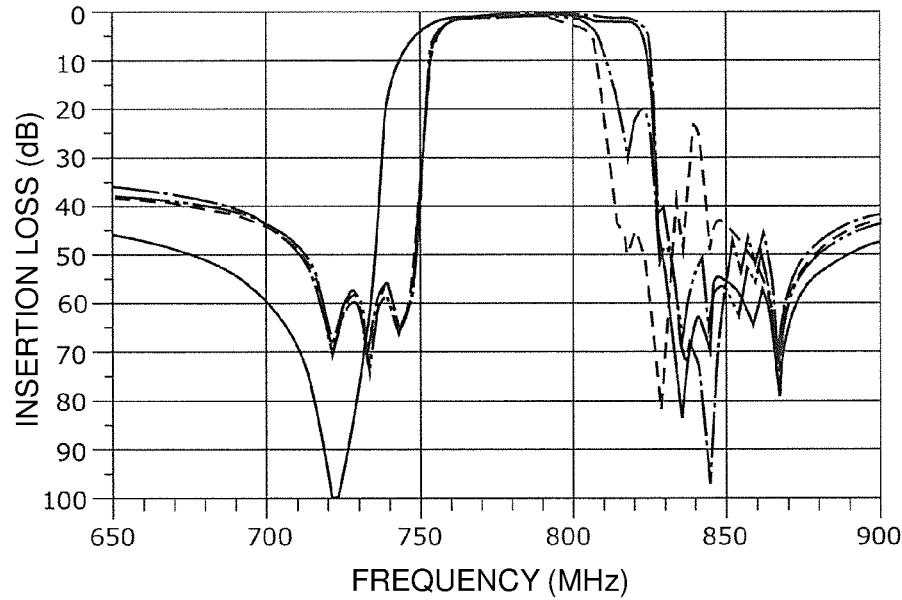
FIG. 14B is a graph illustrating filter characteristics of the filter according to the second preferred embodiment of the present invention.

FIG. 14B is a graph illustrating the filter characteristics (bandpass characteristics) of the filter 20 according to the second preferred embodiment. More specifically, FIG. 14B is a graph illustrating the comparison result between the filter characteristics when the switches SW1 through SW7 are ON and those when the switches SW1 through SW7 are OFF. Above the graph illustrating the filter characteristics, FIG. 14B also illustrates the pass bands corresponding to the individual filter characteristics and the corresponding states of the switches SW1 through SW7.

As shown in FIG. 14B, as a result of the switches SW1 through SW7 being switched between ON and OFF in accordance with the control signals input into the control terminals CTL1 through CTL5, the filter 20 is able to switch the pass band to a desired one of the frequency bands allocated to the following Bands (i) through (iv).

The frequency bands allocated to the following Bands are determined by 3GPP, and a detailed explanation thereof will be omitted. The following Bands (i) through (iv) include a combination of multiple Bands used in CA (carrier aggregation) in which the multiple Bands are transmitted or received at the same time. In this case, the pass band of the filter 20 is a frequency band including multiple frequency bands allocated to multiple Bands used in CA.

(i) Band 68 (or CA of Band 68 and Band 28a)
(ii) Band 28a
(iii) Band 28b (or CA of Band 28b and Band 19)
(iv) CA of Band 28a and Band 20 (or Band 20)

In the filter 20 according to this preferred embodiment, variable frequency circuits are provided in two or more stages (three stages in this preferred embodiment) of the multiple-stage ladder filter structure. This makes it possible to more finely adjust the bandpass characteristics of the filter 20 as a whole. As a result of the switches SW1 through SW7 being suitably changed between ON and OFF, the pass band can be switched to an appropriate band. Additionally, the multiple-stage filter structure of the filter 20 makes it possible to increase the attenuation in the attenuation band.

Third Preferred Embodiment

As a filter including an interdigital capacitor connected to a resonator, a variable frequency filter including a switch element which provides a variable frequency circuit together with the interdigital capacitor has been discussed by way of example. However, a filter including an interdigital capacitor connected to a resonator may not necessarily include such a switch element. In this preferred embodiment, a filter without a switch element will be described below.

Figure 15A:
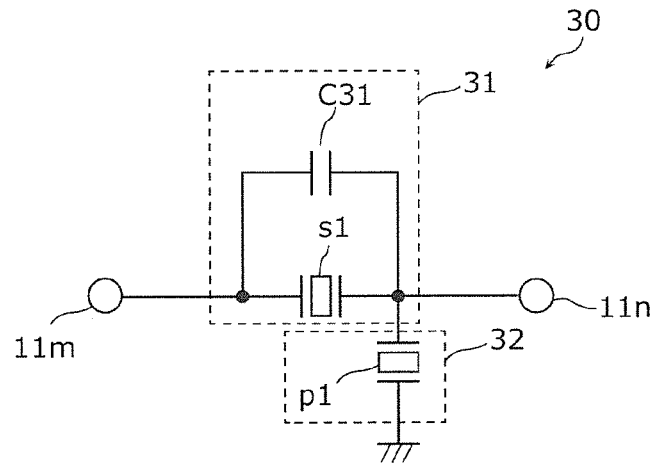
FIG. 15A is a circuit diagram of a filter according to a third preferred embodiment of the present invention.

FIG. 15A is a circuit diagram of a filter 30 according to a third preferred embodiment of the present invention.

As shown in FIG. 15A, the filter 30 preferably includes a series arm resonance circuit 31 defined by a series arm resonator s1 and an interdigital capacitor C31 and a parallel arm resonance circuit 32 defined by a parallel arm resonator p1. In this preferred embodiment, the series arm resonator s1 and the interdigital capacitor C31 are connected in parallel with each other. That is, the filter 30 of this preferred embodiment corresponds to the configuration in which the switch SW is removed from the filter 10F according to the sixth modified example of the first preferred embodiment.

The interdigital capacitor C31 corresponds to the interdigital capacitor C1 in the sixth modified example of the first preferred embodiment. Hereinafter, the interdigital capacitor C31 will be described by referring to points different from the interdigital capacitor C1 while omitting an explanation of similar points.

Figure 15B:
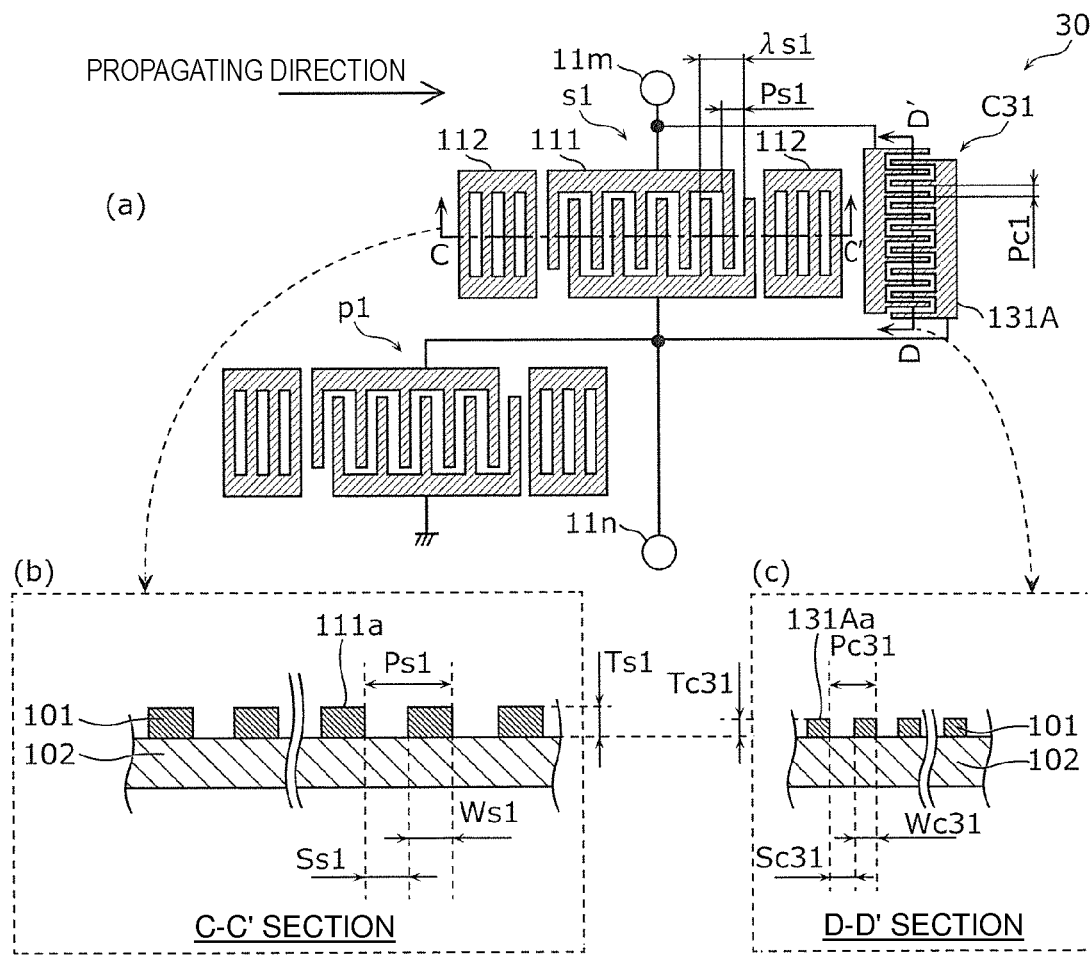
FIG. 15B schematically illustrates the electrode structure of the filter according to the third preferred embodiment of the present invention.

FIG. 15B schematically illustrates the electrode structure of the filter 30 according to the third preferred embodiment. More specifically, (a) of FIG. 15B is a plan view of the electrode structure, (b) of FIG. 15B is a sectional view taken along line C-C' of (a), and (c) of FIG. 15 is a sectional view taken along line D-D' of (a) of FIG. 15B. As in FIG. 2, the electrode structure shown in FIG. 15B is illustrated to explain the typical structure.

The desired parameters of an interdigital electrode 131A defining the interdigital capacitor C31 and those of an IDT electrode of the first acoustic wave resonator (IDT electrode 111 defining the series arm resonator s1 in this preferred embodiment) connected to the interdigital capacitor C31 will be discussed below in comparison with each other.

As shown in FIG. 15B, in this preferred embodiment, the electrode finger pitch of the interdigital capacitor C31 is preferably narrower than that of the series arm resonator s1. That is, Pc31<Ps1 is satisfied. The pitch of the plural electrode fingers 131Aa of the interdigital capacitor C31 is preferably about 80% or smaller of the pitch of the plural electrode fingers 111a of the series arm resonator s1 (that is, Pc31≤0.8×Ps1=0.4×λs1).

The film thickness of the plural electrode fingers 131Aa of the interdigital capacitor C31 is preferably smaller than that of the plural electrode fingers 111a of the series arm resonator s1. That is, Tc31<Ts1 is satisfied. Because of the manufacturing requirements, the film thickness Tc31 of the electrode fingers 131Aa of the interdigital capacitor C31 is preferably about 40% or smaller of the electrode finger pitch Pc31 (that is, Tc31≤0.40×Pc31). For a similar reason, the film thickness Ts1 of the electrode fingers 111a of the series arm resonator s1 is preferably about 40% or smaller of the electrode finger pitch Ps1 (that is, Ts1≤0.40×Ps1). Although the minimum value of the film thickness Tc31 of the electrode fingers 131Aa is not particularly restricted, it may be about 15% or greater of the electrode finger pitch Pc31 (that is, 0.15×Pc31≤Tc31). Likewise, although the minimum value of the film thickness Ts1 of the electrode fingers 111a is not particularly restricted, it may be about 15% or greater of the electrode finger pitch Ps1 (that is, 0.15×Ps1≤Ts1).

The electrode duty of the interdigital capacitor C31 is preferably greater than that of the series arm resonator s1. That is, the interdigital capacitor C31 and the series arm resonator s1 preferably satisfy Wc31/Pc31>Ws1>Ps1. With this configuration, the capacitance per unit area of the interdigital capacitor C31 is increased, thus making it possible to reduce the size of the filter and also to enhance space-saving characteristics.

As discussed above, in each of the elements (such as series arm resonator s1 and interdigital capacitor C31), each of the electrode finger pitch, film thickness, electrode duty is not necessarily uniform due to variations in the manufacturing process or adjustments made to the characteristics, for example. The interdigital electrode 131A defining the interdigital capacitor C31 and the IDT electrode 111 defining the series arm resonator s1 may not entirely satisfy the above-described relationships regarding the electrode finger pitch, film thickness, and electrode duty. However, it is sufficient if the above-described relationships regarding the electrode finger pitch, film thickness, and electrode duty between the interdigital capacitor C31 and the series arm resonator s1 are substantially satisfied. For example, it is sufficient if the above-described relationships between the average of each of the electrode finger pitch, film thickness, and electrode duty of the interdigital capacitor C31 and that of the series arm resonator s1 are satisfied.

A description will be given of the influence on the characteristics produced by connecting the interdigital capacitor C31 in parallel with the series arm resonator s1.

Figure 16:
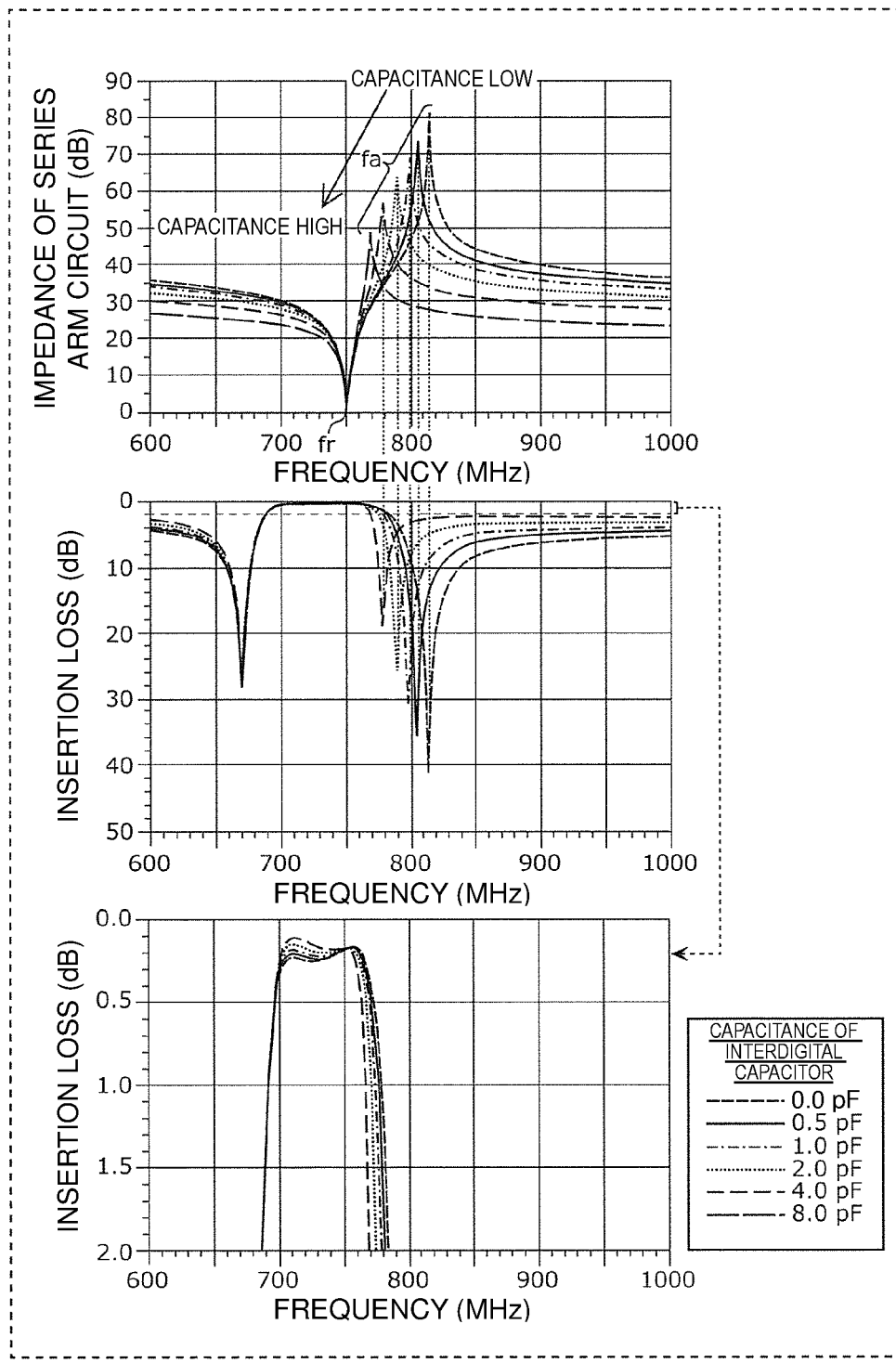
FIG. 16 shows graphs illustrating the relationships between the capacitance of an interdigital capacitor and various characteristics of the filter in the third preferred embodiment of the present invention.
Figure 17A:
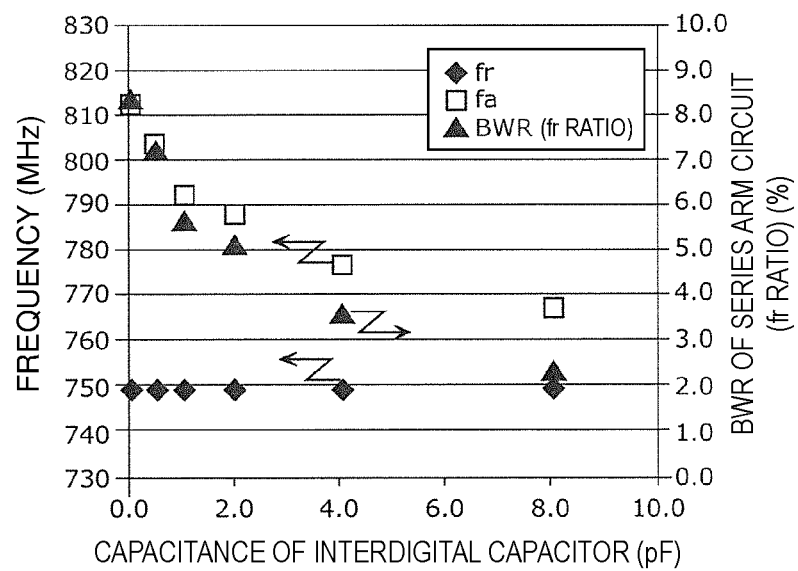
FIG. 17A is a graph illustrating the relationships of the resonant frequency, anti-resonant frequency, and bandwidth ratio of a series arm resonance circuit to the capacitance of the interdigital capacitor in the third preferred embodiment of the present invention.
Figure 17B:
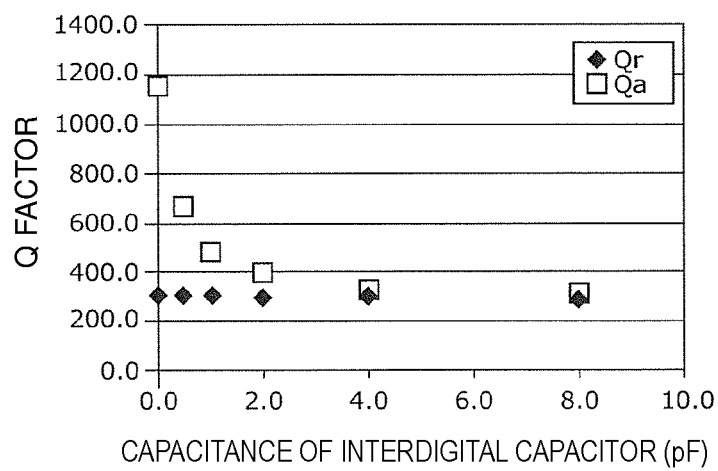
FIG. 17B is a graph illustrating the relationships of the Q factors of the resonant frequency and the anti-resonant frequency of the series arm resonance circuit to the capacitance of the interdigital capacitor in the third preferred embodiment of the present invention.

FIG. 16 shows graphs illustrating the relationships between the capacitance of the interdigital capacitor C31 and various characteristics of the filter 30. More specifically, FIG. 16 illustrates various characteristics of the filter 30 when the interdigital capacitor C31 is not provided and when the capacitance of the interdigital capacitor C31 is varied among about 0.5 to about 8.0 pF. In this case, the circuit constants of the series arm resonator s1 and the parallel arm resonator p1 are maintained at fixed values. In FIG. 16, the top section shows the impedance characteristics of the series arm resonance circuit 31 (indicated by "series arm circuit" in FIG. 16), the middle section shows the filter characteristics thereof, and the bottom section shows an enlarged portion of a portion of the graph in the middle section. If the interdigital capacitor C31 has a capacitance of 0.0, it means that the interdigital capacitor C31 is not provided (not connected). FIG. 17A is a graph illustrating the relationships of the resonant frequency (fr), anti-resonant frequency (fa), and bandwidth ratio (BWR) of the series arm resonance circuit 31 to the capacitance of the interdigital capacitor C31. FIG. 17B is a graph illustrating the relationships of the Q factor (Qr) of the resonant frequency and the Q factor (Qa) of the anti-resonant frequency of the series arm resonance circuit 31 to the capacitance of the interdigital capacitor C31.

The bandwidth ratio of a resonance circuit or a resonator is defined as the value (or the percentage) obtained by dividing the frequency difference (fa−fr) between the anti-resonant frequency fa and the resonant frequency fr by the resonant frequency fr, that is, it is defined as the value (fa−fr)/fr.

Preferred examples of the desired parameters of the filter 30 are shown in Table 4 and Table 5. Concerning the series arm resonator s1, the resonant frequency (fr) is about 750 MHz and the electrostatic capacity is about 3.0 pF. Concerning the parallel arm resonator p1, the resonant frequency (fr) is about 670 MHz, and the electrostatic capacity is about 3.0 pF. The film thicknesses of the protection layers 104 and 103 are each uniform in the filter 30, though they are not shown.

TABLE 4

|  | Series arm resonator s1 | Parallel arm resonator p1 | Interdigital capacitor C31 |
| --- | --- | --- | --- |
| Wavelength of acoustic waves (μm) | 4.620 | 5.172 | — |
| Electrode finger pitch (μm) | 2.310 | 2.586 | 0.800 |
| Number of pairs of electrode fingers | 80 | 80 | (See Table 5) |
| Interdigital width (μm) | 53.6 | 53.6 | (See Table 5) |
| Duty ratio | 0.55 | 0.55 | 0.60 |
| Resonant frequency fr (MHz) | 750 | 670 | — |

TABLE 4-continued

|  |  | Series arm resonator s1 | Parallel arm resonator p1 | Interdigital capacitor C31 |
|---|---|---|---|---|
| Capacitance (pF) | | 3.0 | 3.0 | (See Table 5) |
| Film thickness of electrode film 101 (nm) | Metal film 215 (Ti) | 10.0 | 10.0 | 10.0 |
|  | Metal film 214 (Al) | 180.0 | 180.0 | 100.0 |
|  | Metal film 213 (Ti) | 30.0 | 30.0 | 10.0 |
|  | Metal film 212 (Pt) | 120.0 | 120.0 | 10.0 |
|  | Metal film 211 (NiCr) | 10.0 | 10.0 | 10.0 |
| Film thickness of electrode fingers (Film thickness of electrode film 101) | | 350.0 | 350.0 | 140.0 |

TABLE 5

| | Capacitance of interdigital capacitor C31 (pF) | | | | | |
|---|---|---|---|---|---|---|
| | 0.0 | 0.5 | 1.0 | 2.0 | 4.0 | 8.0 |
| Number of pairs of electrode fingers | 0.0 | 68.0 | 96.0 | 135.0 | 191.0 | 269.0 |
| Interdigital width (μm) | 0.0 | 13.3 | 18.8 | 26.8 | 37.8 | 53.7 |

As shown in the top section of FIG. 16, when the capacitance of the interdigital capacitor C31 connected in parallel with the series arm resonator s1 is increased, in the series arm resonance circuit 31, the anti-resonant frequency (fa) shifts to the lower-frequency side while the resonant frequency (fr) remains the same. That is, as shown in FIG. 17A, as the capacitance increases, the bandwidth ratio of the series arm resonance circuit 31 decreases.

As shown in the middle section of FIG. 16, as the capacitance increases, the frequency of the attenuation pole on the high-frequency side of the pass band, which is provided by the anti-resonant frequency of the series arm resonance circuit 31, shifts to the lower-frequency side. Hence, the sharpness on the high-frequency side of the pass band is enhanced.

As shown in FIG. 17B, in the series arm resonance circuit 31, even when the capacitance increases, the Q factor (Qr) of the resonant frequency remains the same although the Q factor (Qa) of the anti-resonant frequency significantly deteriorates. In the series arm resonance circuit 31, the resonant frequency defines the pass band, while the anti-resonant frequency defines the attenuation pole on the high-frequency side of the pass band. Accordingly, a decrease in the Q factor of the anti-resonant frequency does not increase the loss within the pass band. As shown in the bottom section of FIG. 16, the loss within the pass band is not likely to increase even though the capacitance of the interdigital capacitor C31 increases.

Advantages obtained by connecting an interdigital capacitor in parallel with a series arm resonator have been discussed by using the configuration of a ladder circuit defined by one series arm resonator and one parallel arm resonator. However, the above-described advantages may be obtained, not only by this configuration, but also by the configuration of a ladder filter including plural series arm resonators. The circuit configuration in which an interdigital capacitor is connected in parallel with one series arm resonator in a ladder circuit including two series arm resonators, for example, and advantages in such a ladder circuit will now be described below by using an example and first and second comparative examples.

Figure 18:
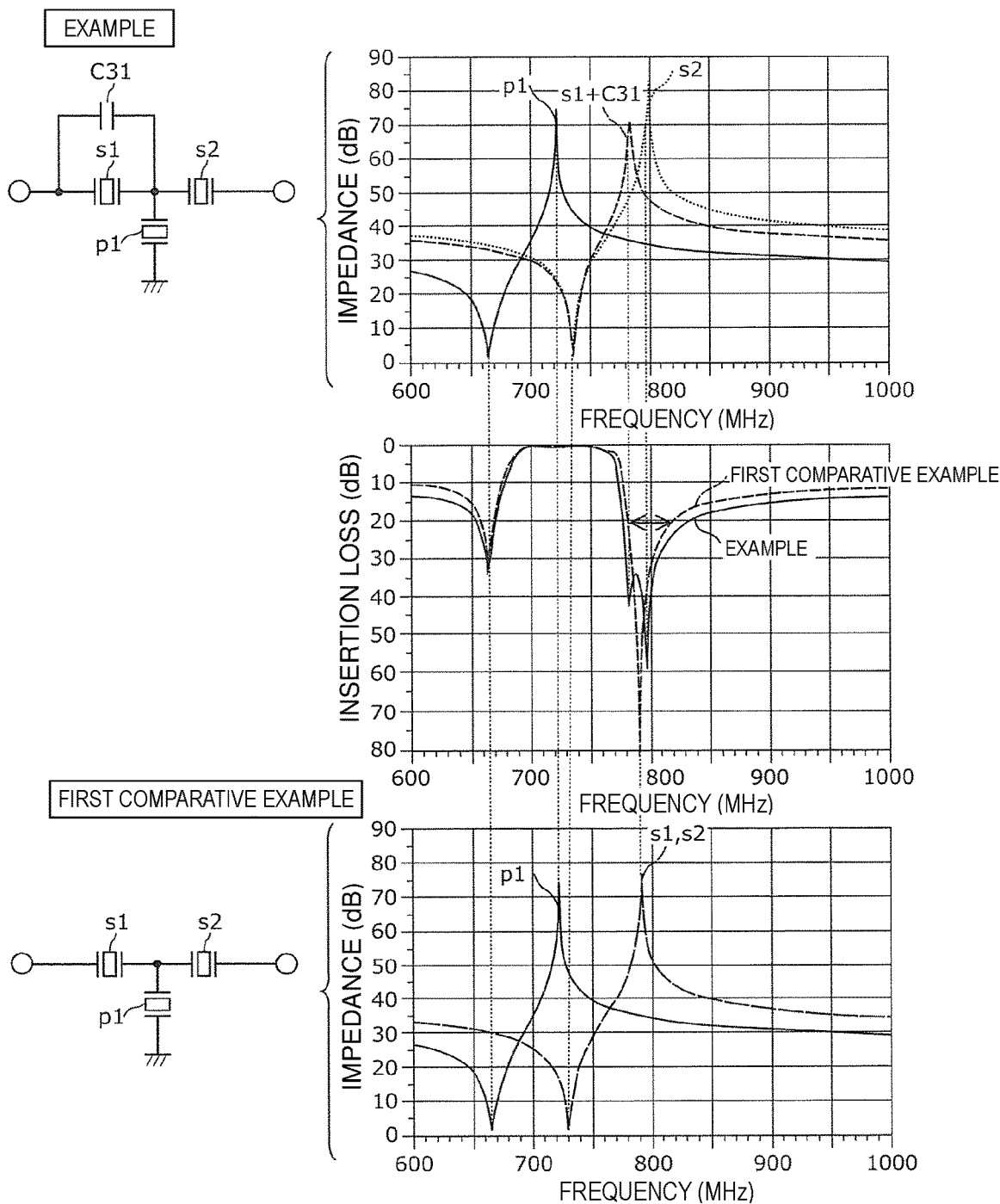
FIG. 18 shows circuit diagrams and graphs illustrating an example and a comparative example of the third preferred embodiment of the present invention.

FIG. 18 shows circuit diagrams and graphs illustrating an example and a comparative example (first comparative example) of this preferred embodiment. More specifically, FIG. 18 illustrates the circuit configuration of the example and that of the first comparative example and the impedance characteristics and filter characteristics thereof. In FIG. 18, the top section illustrates the impedance characteristics of the example, while the bottom section illustrates the impedance characteristics of the first comparative example.

As shown in FIG. 18, the filter of the example and that of the first comparative example each include two series arm resonators s1 and s2 having the same resonant frequency and the same anti-resonant frequency. A parallel arm resonator p1 is connected between a node of the two series arm resonators s1 and s2 and a ground. In the filter of the example, an interdigital capacitor C31 is connected in parallel with the series arm resonator s1, while an interdigital capacitor is not connected to the series arm resonator s2. In the first comparative example, an interdigital capacitor is connected to neither of the series arm resonators s1 and s2.

In the example, as a result of connecting the interdigital capacitor C31 in parallel with the series arm resonator s1, the sharpness on the high-frequency side of the pass band can be enhanced without increasing the loss within the pass band, in comparison with the first comparative example.

In the example, as a result of connecting the interdigital capacitor C31 in parallel with the series arm resonator s1, the bandwidth ratio of the combined characteristics of the series arm resonator s1 and the interdigital capacitor C31 (indicated by "s1+C31" in FIG. 18) (bandwidth ratio of a series arm resonance circuit defined by the series arm resonator s1 and the interdigital capacitor C31) becomes smaller than that of the series arm resonator s1. Accordingly, the resonant frequency of this series arm resonance circuit is different from that of the series arm resonator s2. The series arm resonance circuit thus exhibits two resonant frequencies defining the attenuation pole on the high-frequency side of the pass band. In the example, therefore, the attenuation band on the high-frequency side of the pass band becomes wider than that of the first comparative example. For example, FIG. 18 shows that the attenuation band is increased to a range of about 780 MHZ to about 820 MHz so as to improve the attenuation on the high-frequency side of the pass band.

Typically, a capacitor may be added to a series arm resonator by thinning out some of the electrode fingers forming an IDT electrode. A second comparative example in which a capacitor is added by thinning out some electrode fingers will be discussed below, and advantages obtained by the above-described example will further be explained below in comparison with the second comparative example.

The desired parameters, such as the resonant frequency and anti-resonant frequency, of the series arm resonator s1 and the parallel arm resonator p1 of the example and the second comparative example are different from those discussed with reference to FIGS. 16 through 18. Accordingly, the characteristics, such as the filter characteristics, are not the same as those discussed with reference to FIGS. 16 through 18. However, the relations regarding the desired parameters between the example and the comparative example are similar to those discussed with reference to FIGS. 16 through 18. Accordingly, the relations regarding the filter characteristics are also similar to those discussed with reference to FIGS. 16 through 18, and advantages obtained in terms of the relations concerning the filter characteristics are also similar to those discussed with reference to FIGS. 16 through 18.

Figure 19A:
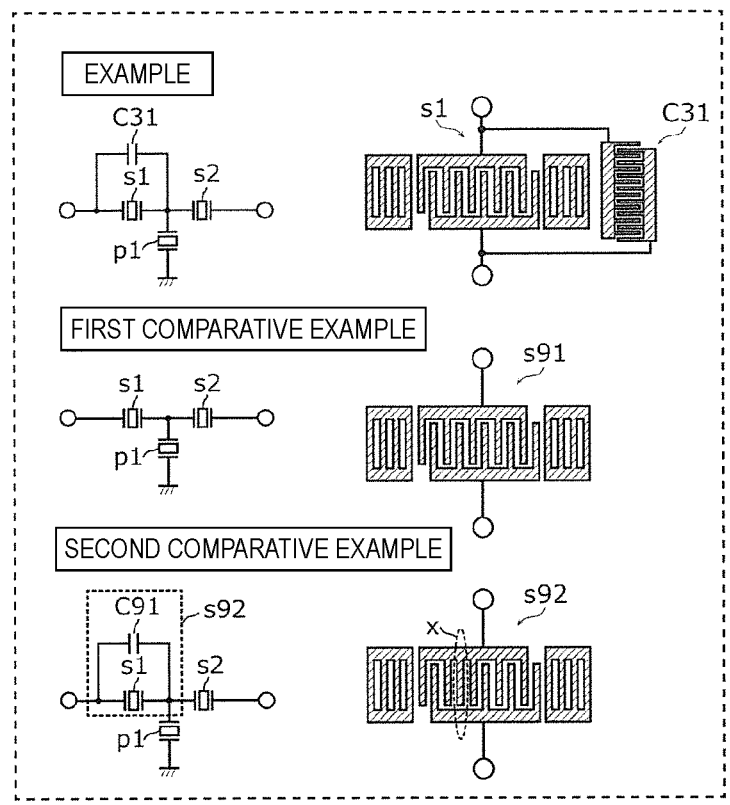
FIG. 19A illustrates the configurations of the example and comparative examples of the third preferred embodiment of the present invention.
Figure 19B:
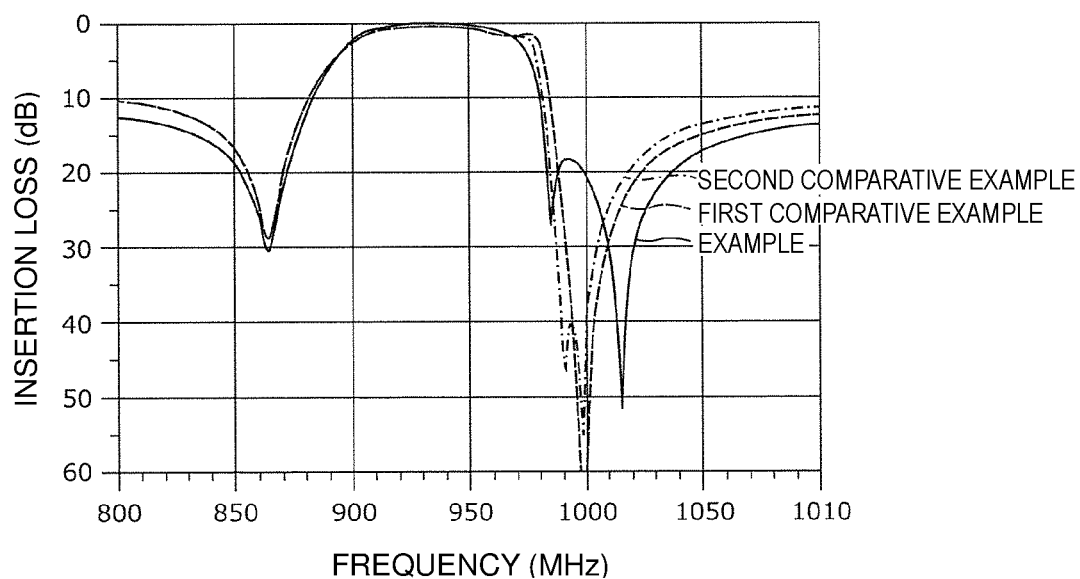
FIG. 19B is a graph illustrating filter characteristics of the example and the comparative examples of the third preferred embodiment of the present invention.

FIG. 19A illustrates the configurations of the example and the comparative examples (first and second comparative examples) of this preferred embodiment. More specifically, FIG. 19A illustrates the configurations of the example, the first comparative example, and the second comparative example in this order from the top side. In each of the example and the first and second comparative examples, the circuit configuration is shown on the left side, and a schematic plan view of part of the electrode structure is shown on the right side. FIG. 19B is a graph illustrating the filter characteristics of the example and the comparative examples (first and second comparative examples) of the preferred embodiment.

As shown in the bottom section of FIG. 19A, the second comparative example uses a series arm resonator s92 obtained by thinning out some of the electrode fingers defining the IDT electrode of the series arm resonator s1 (that is, the weighted portion indicated by x in FIG. 19A). The second comparative example thus has the circuit configuration equivalent to that in which a capacitor C91 is connected in parallel with the series arm resonator s1.

As is seen from FIG. 19B, the configuration in which the capacitor C91 is connected in parallel with the series arm resonator s1 by thinning out some electrode fingers of the IDT electrode has the following problems.

It is difficult to design the capacitor C91 configured by thinning out electrode fingers to have a large capacitance. There are thus limitations on decreasing the bandwidth ratio of the combined characteristics of the series arm resonator s1 and the capacitor C91. The attenuation band on the high-frequency side of the pass band is thus less likely to increase, thus making it difficult to improve the attenuation.

In contrast, in the example, the interdigital capacitor C31 can be designed to have a large capacitance by suitably adjusting the desired parameters, such as the number of pairs of electrode fingers and the interdigital width. As is seen from FIG. 19B, in the example, the sharpness on the high-frequency side of the pass band can be enhanced without increasing the loss within the pass band, in comparison with, not only the first comparative example, but also the second comparative example.

As described above, in the filter 30 according to this preferred embodiment, the interdigital capacitor C31 is connected in parallel with the series arm resonator s1. The electrode finger pitch Pc31 of the plural electrode fingers 131Aa of the interdigital capacitor C31 is smaller than the electrode finger pitch Ps1 of the plural finger electrodes 111a of the series arm resonator s1. The film thickness of the plural electrode fingers 131Aa of the interdigital capacitor C31 is also smaller than the film thickness Ts1 of the plural electrode fingers 111a of the series arm resonator s1. The self-resonant frequency of the interdigital capacitor C31 is provided on the higher-frequency side than the pass band of the filter 30.

In the filter 30 according to this preferred embodiment, both of the required Q factor of the series arm resonator s1 and that of the interdigital capacitor C31 are able to be obtained. It is thus possible to enhance the sharpness on the high-frequency side of the pass band without increasing the loss in the pass band.

This is due to the fact that the characteristics of the interdigital capacitor C31 are preferably determined by the desired parameters. The reason why the above-described advantages are achieved will be explained below in detail.

The relations between the electrode finger pitch and the characteristics of the interdigital capacitor C31 will first be discussed.

Figure 20A:
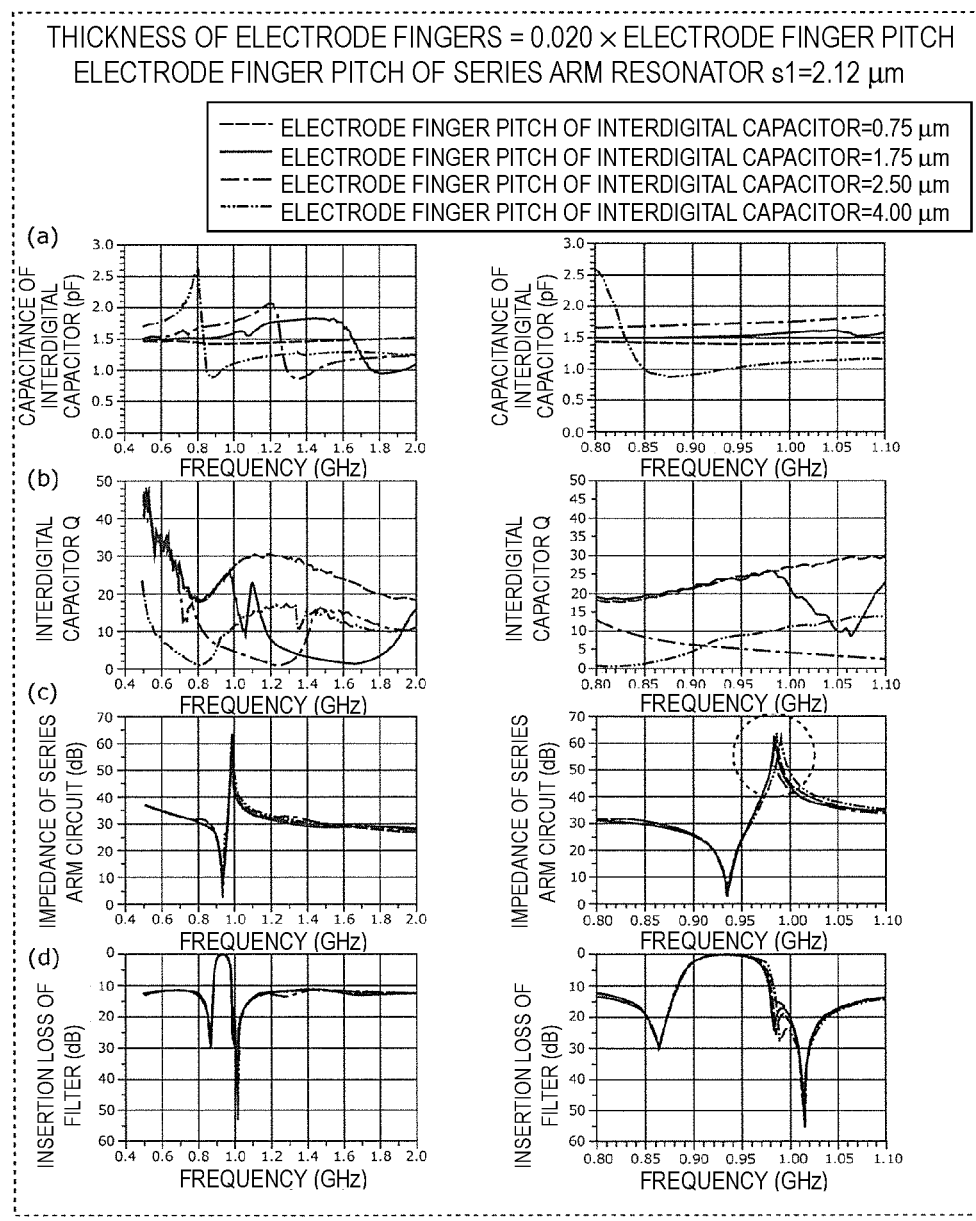
FIG. 20A shows graphs illustrating the relations of the capacitance, capacitor Q, impedance of the series arm resonance circuit, and filter characteristics to the electrode finger pitch of the interdigital capacitor in the third preferred embodiment of the present invention.

FIG. 20A shows graphs illustrating the relations of the capacitance, capacitor Q, impedance of the series arm resonance circuit 31 (indicated by "series arm circuit" in FIG. 20A), and filter characteristics to the electrode finger pitch of the interdigital capacitor C31. More specifically, FIG. 20A illustrates the frequency characteristics when the electrode finger pitch Pc31 is varied among about 0.75, about 1.75, about 2.50, and about 4.00 (unit is μm), for example. The desired parameters other than the electrode finger pitch are fixed. The ratio of the film thickness to the electrode finger pitch preferably is about 0.20 (that is, Tc31=0.20× Pc31), for example. The electrode finger pitch of the series arm resonator s1 is about 2.12 μm, for example.

As shown in (a) of FIG. 20A, the capacitance remains almost the same even though the electrode finger pitch Pc31 is varied. In this case, the capacitance is the capacitance (electrostatic capacity) in a low-frequency range where influences caused by the self-resonance of the interdigital capacitor are almost negligible. The self-resonant frequency of the interdigital capacitor C31 shifts to the higher-frequency side as the electrode finger pitch Pc31 becomes smaller.

As shown in (b) of FIG. 20A, although the Q factor (capacitor Q) of the interdigital capacitor C31 is roughly progressively decreased as the frequency becomes greater, it is locally decreased at the self-resonant frequency. Accordingly, if the electrode finger pitch Pc31 is set to be small to shift the self-resonant frequency of the interdigital capacitor to the higher-frequency side than the pass band of the filter 30, the Q factor of the interdigital capacitor in the pass band is able to be increased.

In other words, as the electrode finger pitch Pc31 is wider, the self-resonant frequency of the interdigital capacitor C31 shifts to the lower-frequency side. This may cause the self-resonant frequency to coincide with the resonant frequency or the anti-resonant frequency of the series arm resonator s1 which is connected to the interdigital capacitor C31 without another acoustic wave resonator being interposed therebetween. That is, the resonant frequency or the anti-resonant frequency of the series arm resonator s1 may coincide with the frequency at which the capacitor Q is locally decreased. In this case, the Q factor obtained by the combined characteristics of the series arm resonator s1 and the interdigital capacitor C31 at the resonant frequency or the anti-resonant frequency is decreased due to the locally decreased Q factor of the interdigital capacitor C31. This makes it difficult to achieve the required Q factor. Because of this reason, the electrode finger pitch Pc31 is decreased so as to shift the self-resonant frequency of the interdigital capacitor C31 to the higher-frequency side than the resonant frequency or the anti-resonant frequency of the series arm resonator s1. This makes it less likely to reduce the Q factor of the combined characteristics of the series arm resonator s1 and the interdigital capacitor C31. As a result, the required Q factor can be obtained.

As the electrode finger pitch Pc31 is smaller, the size of the interdigital capacitor can be reduced while maintaining the capacitance. It is thus possible to reduce the size of a radio-frequency filter including the interdigital capacitor C31 and also to enhance the space-saving characteristics.

Figure 20B:
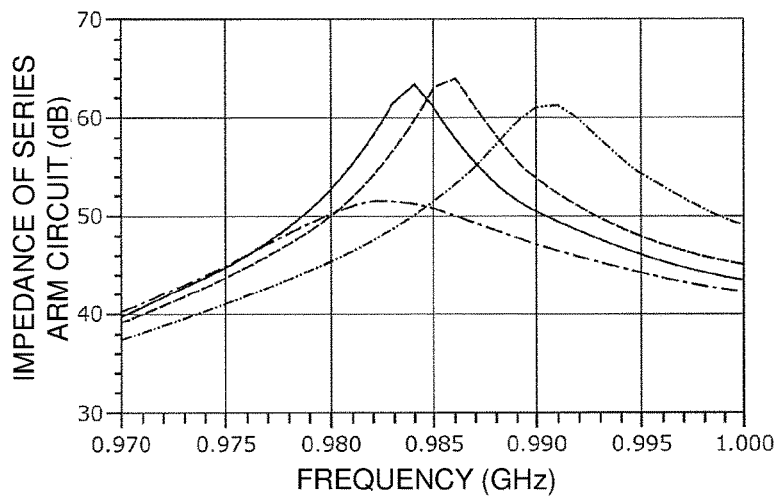
FIG. 20B is a graph illustrating an enlarged portion of the graph of (c) of FIG. 20A indicated by the broken-line circle.

FIG. 20B is a graph illustrating the enlarged portion of the graph of (c) of FIG. 20A indicated by the broken-line circle.

More specifically, FIG. 20B illustrates the impedance characteristics at and around the anti-resonant frequency of the series arm resonance circuit 31.

As shown in FIG. 20A, as the electrode finger pitch of the interdigital capacitor C31 increases, the self-resonant frequency shifts to the lower-frequency side, thus decreasing the capacitor Q. Table 6 shows the relationships between the electrode finger pitch Pc31 of the interdigital capacitor C31 and the Q factor of the anti-resonant frequency (Qa) of the series arm resonance circuit 31.

TABLE 6

| Electrode finger pitch Pc31 of interdigital capacitor C31 (μm) | Q factor of anti-resonant frequency of series arm circuit |
|---|---|
| 0.75 | 379 |
| 1.75 | 364 |
| 2.50 | 101 |
| 4.00 | 235 |

As is seen from this table and FIG. 20A, as the electrode finger pitch of the interdigital capacitor C31 approaches that of the series arm resonator s1, the Q factor of the anti-resonant frequency of the series arm resonance circuit 31 is likely to deteriorate due to a decrease in the capacitor Q. This increases the loss on the high edge of the pass band and decreases the attenuation characteristics (see (c) and (d) of FIG. 20A). It is thus necessary that the electrode finger pitch of the interdigital capacitor C31 be set to be smaller than that of the series arm resonator s1 and the film thickness of the interdigital capacitor C31 be set to be smaller than that of the series arm resonator s1.

As described above, as the electrode finger pitch of the interdigital capacitor C31 is smaller, the self-resonant frequency shifts to the higher-frequency side. Because of this, in this preferred embodiment, the pitch of the electrode fingers of the interdigital capacitor C31 is set to be smaller than that of the electrode fingers 111a of the series arm resonator s1 so as to shift the self-resonant frequency of the interdigital capacitor C31 to the higher-frequency side than the pass band of the filter 30. This makes it possible to raise the Q factor of the interdigital capacitor C31 within the pass band and on and near the high-frequency side of the pass band. It is thus possible to reduce the loss within the pass band and also to enhance the sharpness of the attenuation slope on the high-frequency side of the pass band.

Because of the manufacturing requirements, the pitch of the electrode fingers is restricted by the film thickness of the electrode fingers. Accordingly, the film thickness of the electrode fingers of the interdigital capacitor C31 is made smaller than that of the series arm resonator s1. This reduces the pitch of the electrode fingers of the interdigital capacitor C31 to be even smaller. This makes it easier to achieve both of the required Q factor of the series arm resonator s1 and that of the capacitor.

Achieving both of the required Q factor of the series arm resonator s1 and that of the interdigital capacitor C31 further reduces the loss within the pass band and further enhance the sharpness of the attenuation slope on the high-frequency side of the pass band.

First Modified Example of Third Preferred Embodiment

A description will now be given of how the reflection characteristics are influenced as a result of connecting the interdigital capacitor C31 in parallel with the series arm resonator s1.

Figure 21:
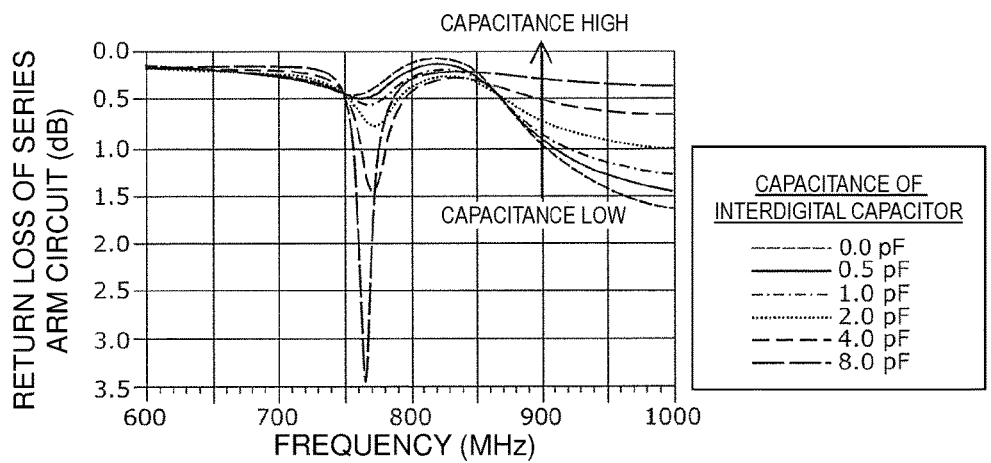
FIG. 21 is a graph illustrating the relationships between the capacitance of the interdigital capacitor and the reflection characteristics of the series arm resonance circuit.

FIG. 21 is a graph illustrating the relationships between the capacitance of the interdigital capacitor C31 and the reflection characteristics of the series arm resonance circuit 31 (indicated by "series arm circuit" in FIG. 21). More specifically, FIG. 21 illustrates the reflection characteristics of the series arm resonance circuit 31 when the interdigital capacitor C31 is not provided and when the capacitance of the interdigital capacitor C31 is varied among about 0.5 pF to about 8.0 pF, for example. In this case, the circuit constants of the series arm resonator s1 and the parallel arm resonator p1 are maintained at fixed values.

As shown in FIG. 21, as the capacitance of the interdigital capacitor C31 increases, the return loss of the series arm resonance circuit 31 decreases in the frequency band (about 850 MHz or higher in FIG. 21) higher than the pass band. A bulk wave loss occurs in an acoustic wave resonator in a frequency range higher than the anti-resonant frequency, thus decreasing the Q factor of the capacitance components in this frequency range. In terms of such properties of an acoustic wave resonator, in the series arm resonance circuit 31, the interdigital capacitor C31 which does not cause a bulk wave loss in the frequency range higher than the anti-resonant frequency is connected in parallel with the series arm resonator s1. With this configuration, a radio-frequency signal input into the series arm resonance circuit 31 is distributed between the series arm resonator s1 and the interdigital capacitor C31, thus reducing the bulk wave loss in the series arm resonance circuit 31 as a whole.

In a multiplexer including plural filters in which one of the input-output terminals of each filter is connected to a common terminal, the series arm resonance circuit 31 is applied to a filter having a lower center frequency of a pass band than at least one of the other filters. This reduces the loss within the pass band of the filter having a higher center frequency than the filter including the series arm resonance circuit 31.

The loss within the pass band of a filter having a higher center frequency is increased due to the bulk wave loss of a filter having a lower center frequency. Such an increase in the loss is mainly due to the influence of the bulk wave loss in the series arm resonance circuit in the filter having a lower center frequency that is connected and positioned most closely to the common terminal. Accordingly, in the filter having a lower center frequency, the series arm resonance circuit 31 is connected and positioned most closely to the common terminal, thus effectively reducing the loss within the pass band of the filter having a higher center frequency.

In this modified example of the third preferred embodiment, a multiplexer configured in this manner will be described below.

Figure 22A:
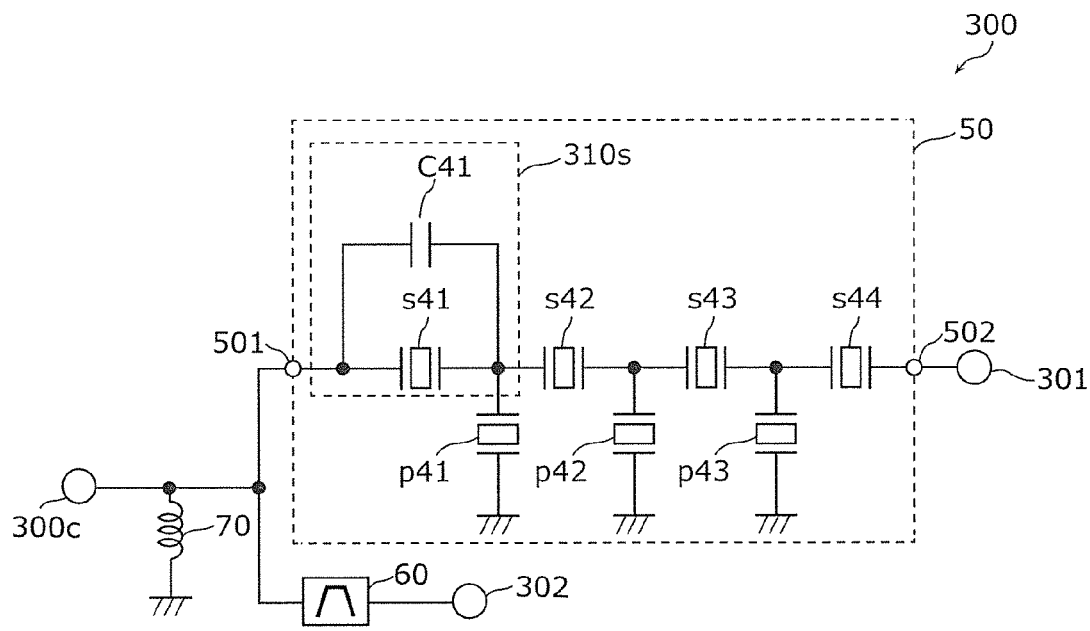
FIG. 22A is a circuit diagram of a multiplexer according to a first modified example of the third preferred embodiment of the present invention.

Circuit Configuration of Multiplexer According to First Modified Example of Third Preferred Embodiment FIG. 22A is a circuit diagram of a multiplexer 300 according to a first modified example of the third preferred embodiment. The multiplexer 300 shown in FIG. 22A is a receive multiplexer corresponding to Band 28Rx and Band 8Rx of the LTE standards. The multiplexer 300 preferably includes a filter 50, a filter 60, and a matching inductor 70.

The multiplexer 300 is not restricted to a receive multiplexer, and may be a transmit multiplexer or a duplexer including a receive filter and a transmit filter. Accordingly, the matching inductor 70 may be omitted. In this modified example, the filters 50 and 60 are directly connected to a common terminal 300c. That is, in this modified example, an input-output terminal (input terminal in this modified example) of the filter 50 positioned closer to the common terminal 300c and an input-output terminal (input terminal in this modified example) of the filter 60 positioned closer to the common terminal 300c are preferably directly connected to the common terminal 300c. However, these input-output terminals may also be connected to the common terminal 300c via a phase shifter, a switch that selects at least one of the filters 50 and 60, or a circulator, for example. That is, one of the input-output terminals of each of the filters 50 and 60 is directly or indirectly connected to the common terminal 300.

The filter 50 is preferably a Band-28Rx receive filter. An input-output terminal 501 is connected to the common terminal 300c of the multiplexer 300, while an input-output terminal 502 is connected to an input-output terminal 301 of the multiplexer 300. The filter 50 is a ladder filter circuit defined by plural series arm resonance circuits (in this modified example, a series arm resonance circuit 310s and a single circuit defined by each of three series arm resonators s42 through s44) provided on a series arm and one or more parallel arm resonance circuits (in this preferred embodiment, a single circuit defined by each of three parallel arm resonators p41, p42, and p43). The number of series arm resonance circuits and that of parallel arm resonance circuits are not limited to those described above.

The series arm resonance circuit 310s corresponds to the series arm resonance circuit 31 of the filter 30 according to the third preferred embodiment. The series arm resonance circuit 310s preferably includes a series arm resonator s41 corresponding to the series arm resonator s1 of the series arm resonance circuit 31 and an interdigital capacitor C41 corresponding to the interdigital capacitor C31 of the series arm resonance circuit 31. The series arm resonance circuit 310s is connected to the input-output terminal 501 of the filter 50 without another resonance circuit interposed therebetween. That is, among the plural series arm resonance circuits (four series arm resonance circuits in this modified example) of the filter 50, the series arm resonance circuit 310s is connected and positioned most closely to the common terminal 300c.

The filter 60 is preferably a Band-8Rx receive filter. One of the input-output terminals of the filter 60 is preferably connected to the common terminal 300c of the multiplexer 300, while the other input-output terminal is connected to the input-output terminal 302 of the multiplexer 300. That is, the center frequency of the pass band (center frequency of band 8Rx in this modified example) of the filter 60 is higher than that (center frequency of band 28Rx in this modified example) of the filter 50.

Advantages achieved by the multiplexer 300 configured as described above will be discussed below by using a comparative example of this modified example.

Circuit Configuration of Multiplexer According to Comparative Example

Figure 22B:
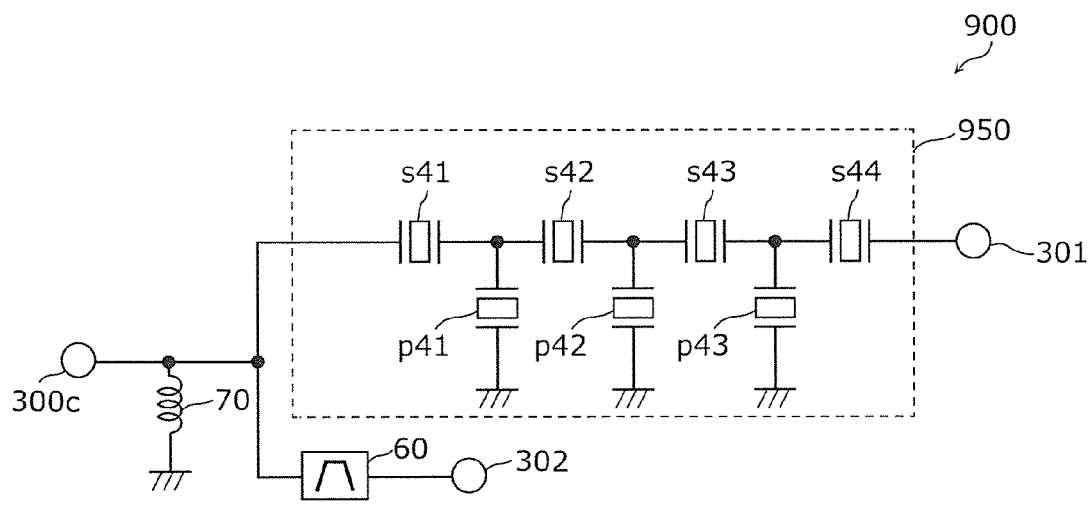
FIG. 22B is a circuit diagram of a multiplexer according to a comparative example of the first modified example of the third preferred embodiment of the present invention.

FIG. 22B is a circuit diagram of a multiplexer 900 according to a comparative example of this modified example. As shown in FIG. 22B, the multiplexer 900 of the comparative example is different from the multiplexer 300 only in that it includes a filter 950 without the interdigital capacitor C41, instead of the filter 50 of the multiplexer 300.

Comparison of Characteristics of Multiplexers

To compare the characteristics of the multiplexer 300 according to the first modified example of the third preferred embodiment and those of the multiplexer 900 according to the comparative example, an example having the configuration of the multiplexer 300 (hereinafter called "the multiplexer of the example") will be used.

The desired parameters and circuit constants of the multiplexer of the example are shown in Table 7 and Table 8. More specifically, Table 7 shows the desired parameters and circuit constants of the series arm resonator s41 and the interdigital capacitor C41, while Table 8 shows the desired parameters and circuit constants of the resonators other than the series arm resonator s41. The structure and film thickness of the electrode fingers of the resonators other than the series arm resonator s41 are similar to those of the series arm resonator s41. The inductance of the matching inductor 70 is 12 nH.

TABLE 7

|  |  | Series arm resonator s41 | Interdigital capacitor C41 |
|---|---|---|---|
| Wavelength of acoustic waves (μm) | | 4.437 | — |
| Electrode finger pitch (μm) | | 2.219 | 0.800 |
| Number of pairs of electrode fingers | | 60 | 70 |
| Interdigital width (μm) | | 53.6 | 102 |
| Duty ratio | | 0.55 | 0.60 |
| Resonant frequency fr (MHz) | | 781 | — |
| Capacitance (pF) | | 1.57 | 0.5 |
| Film thickness of electrode film 101 (nm) | Metal film 215 (Ti) | 10.0 | 10.0 |
| | Metal film 214 (Al) | 120.0 | 100.0 |
| | Metal film 213 (Ti) | 30.0 | 10.0 |
| | Metal film 212 (Pt) | 120.0 | 10.0 |
| | Metal film 211 (NiCr) | 10.0 | 10.0 |
| Film thickness of electrode fingers (Film thickness of electrode film 101) | | 290.0 | 140.0 |

TABLE 8

|  | Series arm resonator s42 | Series arm resonator s43 | Series arm resonator s44 | Parallel arm resonator p41 | Parallel arm resonator p42 | Parallel arm resonator p43 |
|---|---|---|---|---|---|---|
| Wavelength of acoustic waves (μm) | 4.583 | 4.381 | 4.386 | 4.936 | 4.986 | 4.839 |
| Number of pairs of electrode fingers | 140 | 50 | 110 | 100 | 120 | 70 |
| Interdigital width (μm) | 102.0 | 35.7 | 49.4 | 84.9 | 116.5 | 37.6 |
| Duty ratio | 0.55 | 0.55 | 0.55 | 0.55 | 0.55 | 0.55 |
| Resonant frequency fr (MHz) | 756 | 791 | 790 | 702 | 723 | 745 |
| Capacitance (pF) | 10.0 | 1.25 | 3.80 | 5.94 | 9.79 | 1.84 |

The desired parameters and circuit constants of the multiplexer 900 of the comparative example, which will be discussed later, are shown in Table 9. The structure and film thickness of each resonator are similar to those of each resonator of the filter 50. The inductance of the matching inductor 70 is 11.5 nH.

TABLE 9

|  | Series arm resonator s41 | Series arm resonator s42 | Series arm resonator s43 | Series arm resonator s44 | Parallel arm resonator p41 | Parallel arm resonator p42 | Parallel arm resonator p43 |
|---|---|---|---|---|---|---|---|
| Wavelength of acoustic waves (μm) | 4.488 | 4.589 | 4.382 | 4.364 | 4.943 | 4.983 | 4.832 |
| Number of pairs of electrode fingers | 60 | 140 | 50 | 110 | 100 | 120 | 70 |
| Interdigital width (μm) | 59.3 | 102.0 | 37.1 | 60.9 | 100.3 | 116.1 | 39.8 |
| Duty ratio | 0.55 | 0.55 | 0.55 | 0.55 | 0.55 | 0.55 | 0.55 |
| Resonant frequency fr (MHz) | 722 | 755 | 789 | 794 | 701 | 722 | 746 |
| Capacitance (pF) | 10.0 | 10.0 | 1.30 | 4.69 | 7.02 | 9.75 | 1.95 |

Figure 23:
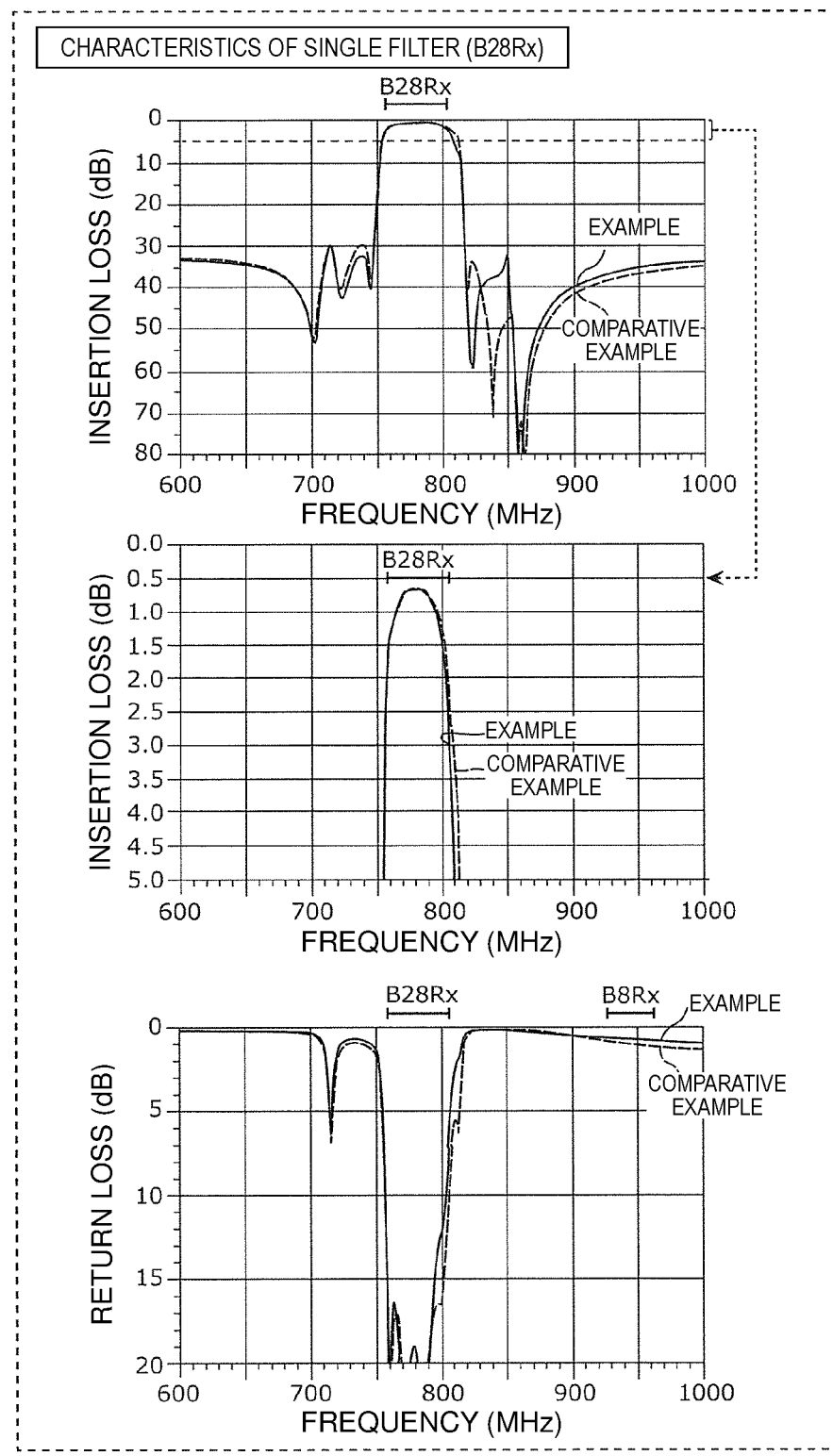
FIG. 23 shows graphs illustrating the comparison results of bandpass characteristics and reflection characteristics of a single filter of an example of the first modified example of the third preferred embodiment of the present invention and those of the comparative example of the first modified example.

FIG. 23 shows graphs illustrating the comparison results of the bandpass characteristics and reflection characteristics of the single filter 50 of the example and those of the single filter 950 of the comparative example. More specifically, in FIG. 23, the top section shows the bandpass characteristics of these two filters, the middle section shows the enlarged portion of the bandpass characteristics in and near the pass band shown in the top section, and the bottom section shows the reflection characteristics of these two filters at the common terminals 300c.

The characteristics of these single filters have been obtained on the conditions that the filters other than the above-described single filters in the multiplexers are disconnected from the common terminals 300c (that is, the filters other than the above-described single filters are removed) and that impedance matching is provided so that impedance mismatching caused by disconnecting the filters from the common terminals 300c is eliminated.

As shown in the top and middle sections of FIG. 23, in comparison with the filter 950 of the comparative example, the filter 50 of the example can enhance the sharpness on the high-frequency side of the pass band (B28Rx) without increasing the loss in the pass band. The reason for this is that the interdigital capacitor (interdigital capacitor C41) is connected in parallel with the series arm resonator (series arm resonator s41), as discussed in the third preferred embodiment.

As shown in the bottom section of FIG. 23, the return loss in the frequency band higher than the pass band (B28Rx) is reduced to be smaller in the filter 50 of the example than in the filter 950 of the comparative example. That is, the return loss is reduced within the pass band (B8Rx) of the filter 60 connected to the common terminal 300c together with the filter 50. The reason for this is that the bulk wave loss of the filter 50 viewed from the common terminal 300c is reduced as a result of connecting the interdigital capacitor (interdigital capacitor C41) in parallel with the series arm resonator (series arm resonator s41), as discussed with reference to FIG. 21. In particular, the bulk wave loss is reduced because the series arm resonance circuit (series arm resonance circuit 310s) defined by the above-described series arm resonator and interdigital capacitor is connected and positioned most closely to the common terminal 300c in the filter 50.

Figure 24:
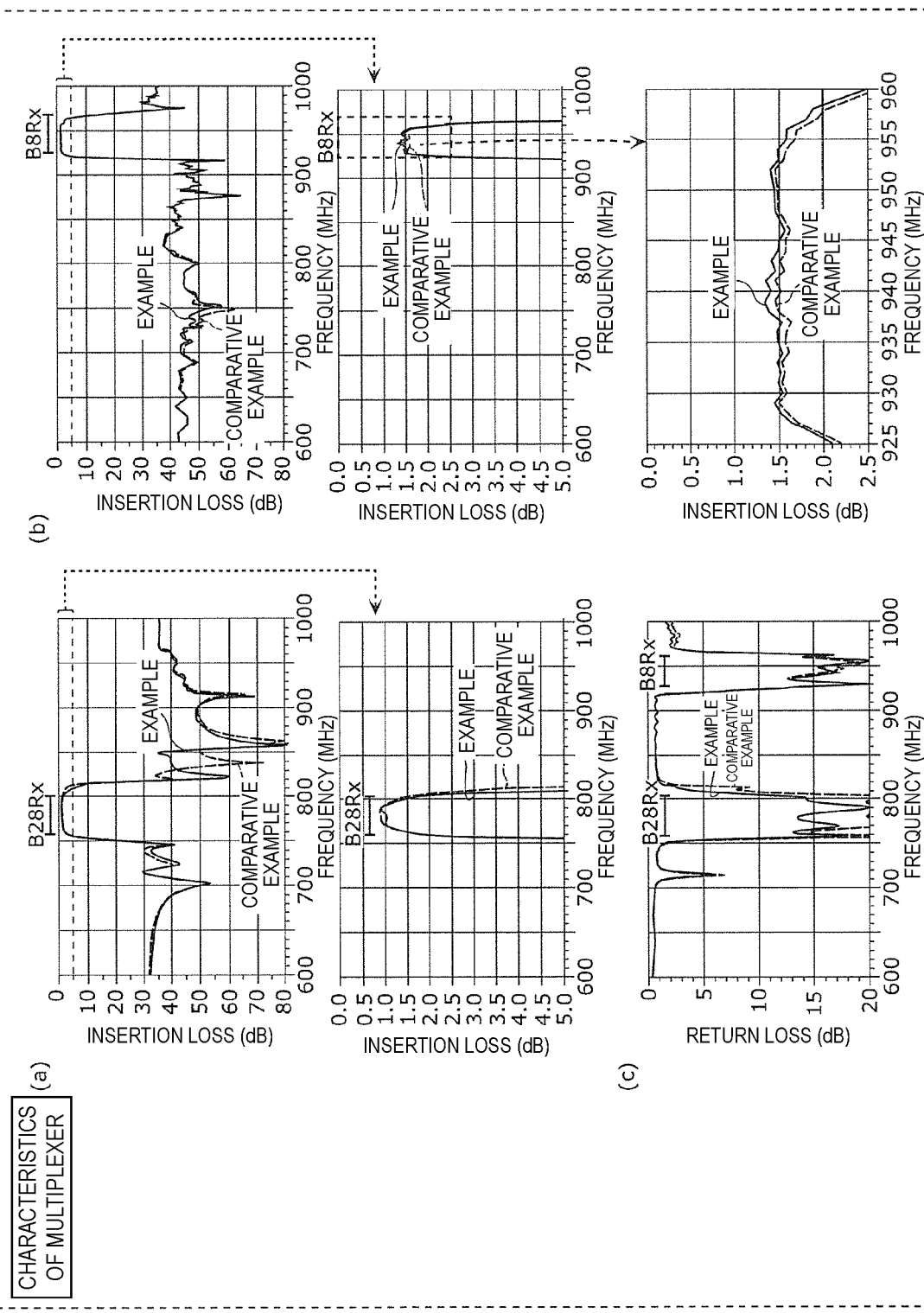
FIG. 24 shows graphs illustrating the comparison results of bandpass characteristics and reflection characteristics of a multiplexer of the example and those of the comparative example.

FIG. 24 shows graphs illustrating the comparison results of the bandpass characteristics and reflection characteristics of the multiplexer 300 of the example and those of the multiplexer 900 of the comparative example. More specifically, the top section of (a) of FIG. 24 shows the insertion loss in the path in which the B28Rx filter (filter 50 in the example and filter 950 in the comparative example) is provided (that is, the insertion loss between the common terminal 300c and the input-output terminal 301). The bottom section of (a) of FIG. 24 shows the enlarged portion of the bandpass characteristics in and near the pass band shown in the top section. The top section of (b) FIG. 24 shows the insertion loss in the path in which the B8Rx filter 60 is provided (that is, the insertion loss between the common terminal 300c and the input-output terminal 302). The middle section of (b) of FIG. 24 shows the enlarged portion of the bandpass characteristics in and near the pass band shown in the top section. The bottom section of (b) of FIG. 24 shows the enlarged portion of the bandpass characteristics within the pass band shown in the middle section. (c) of FIG. 24 shows the reflection characteristics at the common terminal 300c.

As shown in (a) of FIG. 24, in comparison with the multiplexer 900, the multiplexer 300 including the above-described filter 50 enhances the sharpness on the high-frequency side of the pass band (B28Rx) of the filter 50 without increasing the loss in the pass band.

As shown in (b) of FIG. 24, the loss within the pass band (B8Rx) of the filter 60 is reduced to be smaller in the multiplexer 300 including the above-described filter 50 than in the multiplexer 900.

As shown in (c) of FIG. 24, the return loss within the pass band of the filter 60 at the common terminal 300c of the example is similar to that of the comparative example. This indicates that the loss within the pass band of the filter 60 is reduced due to a decrease in the bulk wave loss in the filter 50.

Second Modified Example of Third Preferred Embodiment

Instead of the configuration of the filter 30, the configuration of the filter 10F according to the sixth modified example of the first preferred embodiment may be applied to a multiplexer.

Figure 25A:
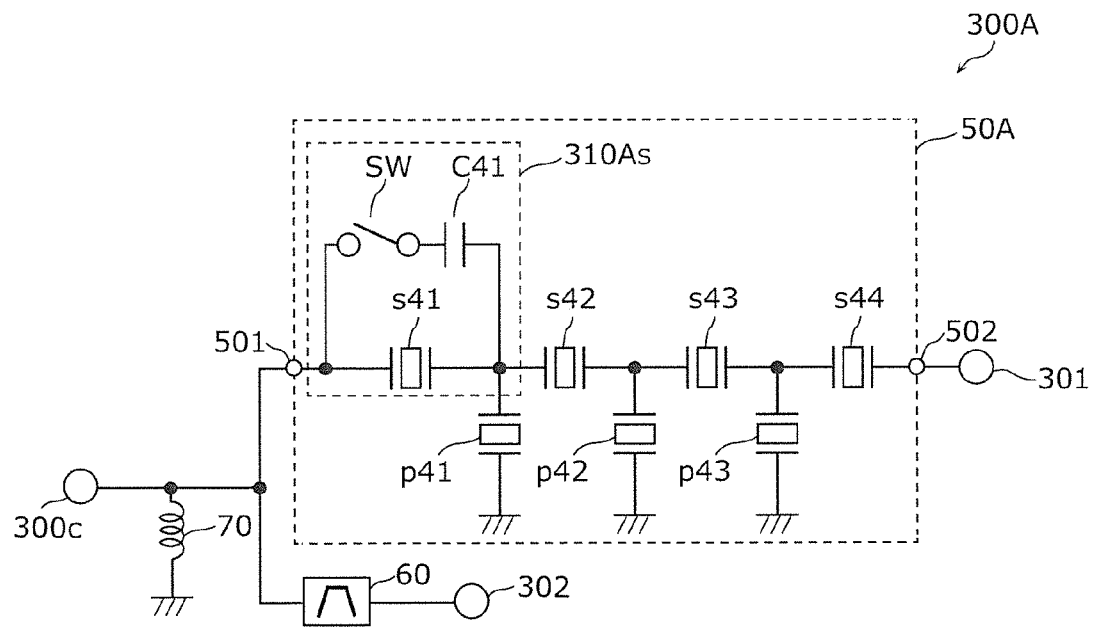
FIG. 25A is a circuit diagram of a multiplexer according to a second modified example of the third preferred embodiment of the present invention.

FIG. 25A is a circuit diagram of a multiplexer 300A according to a second modified example of the third preferred embodiment. As shown in FIG. 25A, the multiplexer 300A of this modified example is different from the multiplexer 300 of the first modified example of the third preferred embodiment only in that it preferably includes a filter 50A instead of the filter 50. In the filter 50A, the series arm resonance circuit 310s is replaced by a series arm resonance circuit 310As.

The series arm resonance circuit 310As preferably corresponds to the series arm resonance circuit 21F in the sixth modified example of the first preferred embodiment.

That is, the filter 50A of this modified example corresponds to the configuration of the filter 50 of the first modified example of the third preferred embodiment in which a series circuit of the interdigital capacitor C41 and a switch SW is connected in parallel with the series arm resonator s41.

Figure 25B:
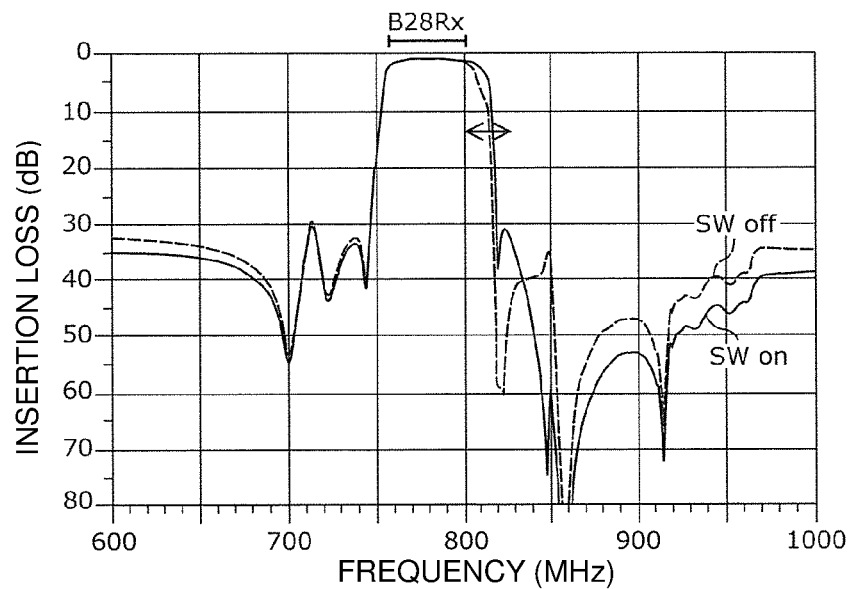
FIG. 25B is a graph illustrating bandpass characteristics of the multiplexer according to the second modified example of the third preferred embodiment of the present invention.

FIG. 25B is a graph illustrating the bandpass characteristics of the multiplexer 300A according to the second modified example of the third preferred embodiment. More specifically, FIG. 25B illustrates the insertion loss in the path in which the B28Rx filter (filter 50A) is provided (that is, the insertion loss between the common terminal 300c and the input-output terminal 301). The circuit constants are similar to those of the multiplexer 300.

As shown in FIG. 25B, in the multiplexer 300A according to this modified example, it is possible to vary the frequency of the attenuation pole on the high-frequency side of the pass band of the filter 50A as a result of the switch SW being switched between ON and OFF.

As a result of the switch SW being changed to ON, the multiplexer 300A configured as described above is changed to the same circuit configuration as the above-described multiplexer 300. Accordingly, when the switch SW is ON, advantages similar to those of the multiplexer 300 can be obtained by the multiplexer 300A.

Third Modified Example of Third Preferred Embodiment

Figure 26A:
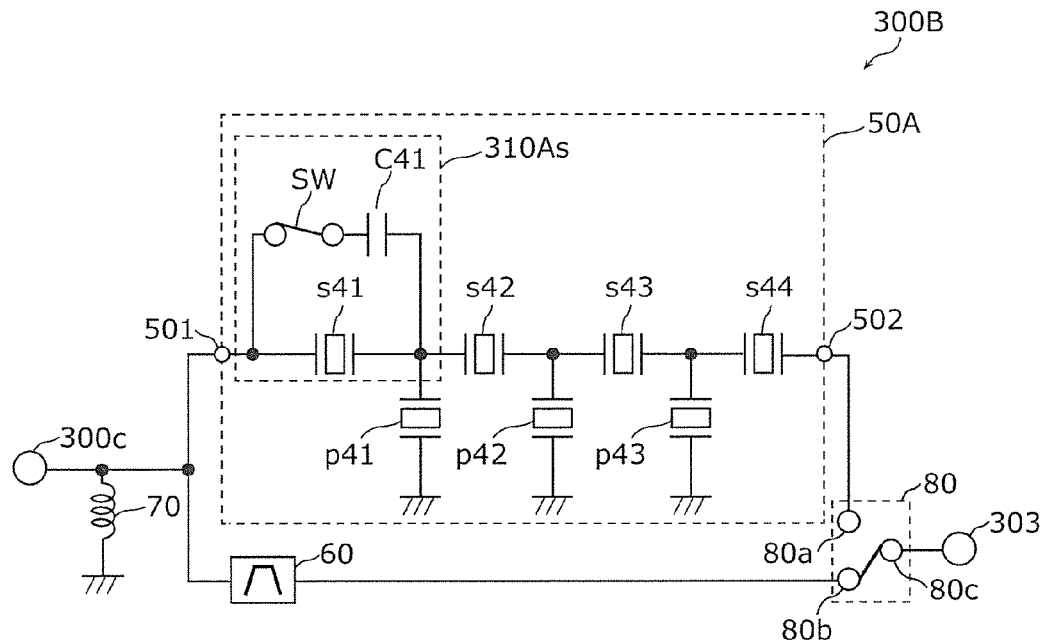
FIG. 26A is a circuit diagram of a multiplexer according to a third modified example of the third preferred embodiment of the present invention.

FIG. 26A is a circuit diagram of a multiplexer 300B according to a third modified example of the third preferred embodiment. The multiplexer 300B shown in FIG. 26A is different from the multiplexer 300A according to the second modified example of the third preferred embodiment in that it preferably also includes a switch circuit 80 that selects the filter 50A or the filter 60. Concerning this point, the multiplexer 300B is different from the multiplexer 300A in that it includes an input-output terminal 303 which serves both as the input-output terminals 301 and 302, which are individually provided in the multiplexer 300A.

The switch circuit 80 includes a common terminal 80c, a selection terminal 80a, and a selection terminal 80b. The switch circuit 80 is preferably a SPDT (Single Pole Double Throw) switch circuit that switches the connection between the common terminal 80c and one of the selection terminals 80a and 80b. The selection terminal 80a is connected to the input-output terminal 502 of the filter 50A. The selection terminal 80b is connected to the input-output terminal of the filter 60 (one of the two input-output terminals of the filter 60 which is not connected to the common terminal 300c). The common terminal 80c is connected to the input-output terminal 303 in this preferred embodiment.

In the above-described configuration, when the common terminal 80c is not connected to the selection terminal 80a, that is, when the filter 50A is not selected, the switch SW is ON. In other words, as shown in FIG. 26A, when the common terminal 80c and the selection terminal 80b are connected to each other, that is, when the filter 60 is selected, the switch SW is ON.

Figure 26B:
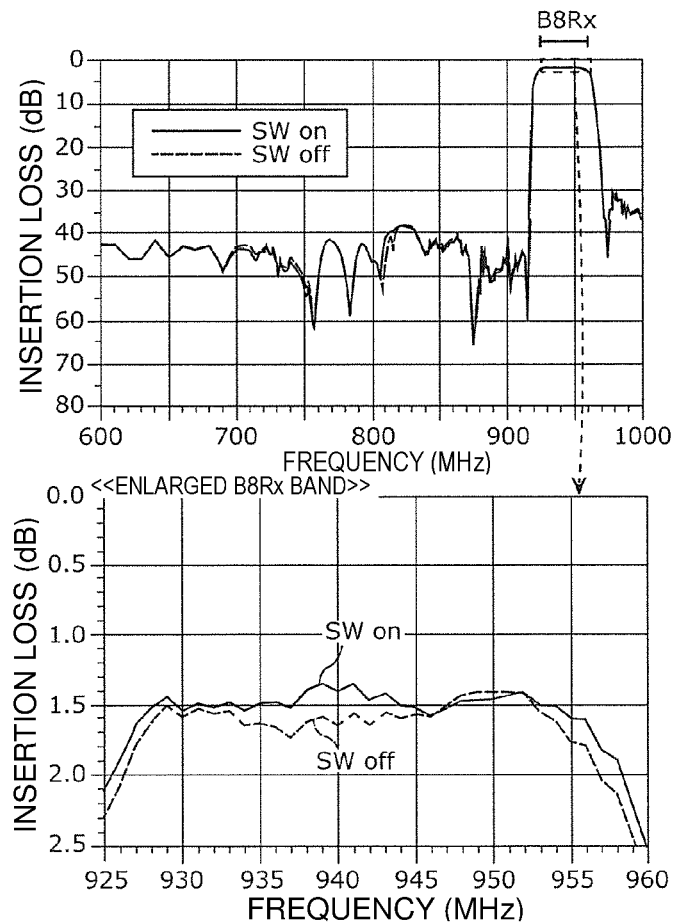
FIG. 26B shows graphs illustrating bandpass characteristics of the multiplexer according to the third modified example of the third preferred embodiment of the present invention.

FIG. 26B shows graphs illustrating the bandpass characteristics of the multiplexer 300B according to the third modified example of the third preferred embodiment. More specifically, the top section of FIG. 26B shows the insertion loss in the path in which the B8Rx filter (filter 60) is provided when the common terminal 80c and the selection terminal 80b are connected to each other. The circuit constants are similar to those of the multiplexers 300 and 300A.

When the filter 60 is selected, the switch SW of the filter 50A is ON. As shown in FIG. 26B, the loss within the pass band of the filter 60 when the switch SW is ON is smaller than that when the switch SW is OFF.

With this configuration, when the common terminal 80c and the selection terminal 80b are connected to each other in the switch circuit 80, the switch SW is ON. That is, when the filter 60 is selected, the bulk wave loss caused by the filter 50A is able to be reduced. As a result, the loss within the pass band of the filter 60 is able to be reduced when the filter 60 is selected.

Fourth Preferred Embodiment

The filters (which are preferably acoustic wave filter devices) described in the first through third preferred embodiments and modified examples thereof are applicable to a radio-frequency front-end circuit, for example. In a fourth preferred embodiment of the present invention, a radio-frequency front-end circuit including the filter 20 according to the second preferred embodiment will be described.

FIG. 27 is a circuit diagram of a radio-frequency front-end circuit 1 according to the fourth preferred embodiment and its surrounding circuits. In FIG. 27, the radio-frequency front-end circuit 1, an antenna device 2, and an RF signal processing circuit (RFIC) 3 are shown. The radio-frequency front-end circuit 1 and the RFIC 3 define a communication apparatus 4. The antenna device 2, the radio-frequency front-end circuit 1, and the RFIC 3 are preferably disposed in a front-end portion of a multimode/multiband-support cellular phone, for example.

The antenna device 2 is preferably a multiband-support antenna which sends and receives radio-frequency signals. The antenna device 2 is preferably compliant with the communication standards, such as LTE. Alternatively, the antenna device 2 may not necessarily support all the bands of the communication apparatus 4, and may only support bands of a low-frequency band group or those of a high-frequency band group. The antenna device 2 may be integrated in the communication apparatus 4.

The RFIC 3 is an RF signal processing circuit which processes radio-frequency signals received by the antenna device 2 and those to be sent by the antenna device 2. More specifically, the RFIC 3 performs signal processing, such as down-conversion, on a radio-frequency received signal input from the antenna device 2 via a receive signal path of the radio-frequency front-end circuit 1. The RFIC 3 then outputs a received signal generated by performing signal processing to a baseband signal processing circuit (not shown). The RFIC 3 also preferably performs signal processing, such as up-conversion, on a transmit signal input from the baseband signal processing circuit. The RFIC 3 then outputs a radio-frequency transmit signal generated by performing signal processing to a transmit signal path (not shown) of the radio-frequency front-end circuit 1.

The radio-frequency front-end circuit 1 is a circuit that transfers radio-frequency signals between the antenna device 2 and the RFIC 3. More specifically, the radio-frequency front-end circuit 1 transfers a radio-frequency transmit signal output from the RFIC 3 to the antenna device 2 via the transmit signal path (not shown). The radio-frequency front-end circuit 1 also transfers a radio-frequency received signal received by the antenna device 2 to the RFIC 3 via the receive signal path.

The radio-frequency front-end circuit 1 preferably includes a variable impedance matching circuit 100, a switch group 110, a filter group 120, switch groups 150A and 150B, and a receive amplifier circuit group 160 in this order from the antenna device 2.

The switch group 110 is defined by one or more switches (plural switches in this preferred embodiment) which connect the antenna device 2 and a filter corresponding to a predetermined band in accordance with a control signal input from a controller (not shown). The switch group 110 may not necessarily connect the antenna device 2 to only one filter and may connect it to multiple filters.

The filter group 120 is defined by one or more filters, and is defined by the following first through sixth filters, for example, in this preferred embodiment. More specifically, the first filter is a tunable filter that supports Band 29 and CA of Bands 12, 67, and 13. The second filter is a tunable filter that supports CA of Band 68 and Band 28a, CA of Band 28a and Band 28b, and CA of Band 28a and Band 20. As the second filter, the filter of the second preferred embodiment may be used. The third through sixth filters are filters each having a fixed pass band. The third filter corresponds to Band 20, the fourth filter corresponds to Band 27, the fifth filter corresponds to Band 26, and the sixth filter corresponds to Band 8.

Each of the switch groups 150A and 150B is defined by one or more switches (preferably a plurality of switches in this preferred embodiment) that connect a filter corresponding to a predetermined band and a receive amplifier circuit of the receive amplifier circuit group 160 corresponding to this band in accordance with a control signal input from a controller (not shown). The switch groups 150A and 150B may not necessarily connect a receive amplifier circuit to only one filter and may connect it to multiple filters.

The receive amplifier circuit group 160 preferably is defined by one or more low-noise amplifiers (a plurality of low-noise amplifiers in this preferred embodiment) that amplify power of radio-frequency received signals input from the switch groups 150A and 150B.

The radio-frequency front-end circuit 1 configured as described above causes a radio-frequency received signal input from the antenna device 2 to selectively pass through a predetermined filter, amplifies the radio-frequency received signal by using a predetermined low-noise amplifier, and outputs it to the RFIC 3. As the RFIC 3, a low-band RFIC and a high-band RFIC may individually be provided.

The radio-frequency front-end circuit 1 preferably includes the filter 20 of the second preferred embodiment as the second filter. As discussed in the second preferred embodiment, the filter 20 achieves both of the required Q factor of the first acoustic wave resonator (parallel arm resonators p22a through p24a and p22b through p24b in the filter 20) and the required Q factor of the interdigital capacitor (interdigital capacitors C22a through C24a and C22b through C24b in the filter 20). The filter 20 can thus reduce the loss within the pass band and enhance the sharpness of the attenuation slope. The radio-frequency front-end circuit 1 including such a filter 20 achieves small-loss, high-selectivity characteristics.

By including the filter 20 of the second preferred embodiment, the radio-frequency front-end circuit 1 requires fewer filters than when fixed-band filters are used. The size of the radio-frequency front-end circuit 1 can accordingly be reduced.

The radio-frequency front-end circuit 1 may include the filter of the first preferred embodiment or one of the modified examples thereof as the first filter.

In this preferred embodiment, the radio-frequency front-end circuit 1 preferably has a receive diversity configuration in which plural filters are disposed on the receive signal path. However, the configuration of the radio-frequency front-end circuit 1 is not restricted to such a configuration, and may have a transmit diversity configuration in which plural filters are disposed on the transmit signal path. The configuration of the radio-frequency front-end circuit 1 is not restricted to a diversity configuration including plural receive filters or plural transmit filters. The radio-frequency front-end circuit 1 may include only one receive filter or only one transmit filter, or may be configured as a transmit-and-receive circuit including at least one transmit filter and at least one receive filter.

Other Preferred Embodiments

The acoustic wave filter devices, the multiplexers, and the radio-frequency front-end circuits according to preferred embodiments of the present invention have been discussed above through illustration of the first through fourth preferred embodiments and modifications thereof. However, the present invention is not restricted to the above-described preferred embodiments. Other preferred embodiments implemented by combining certain elements in the above-described preferred embodiments, and modified examples obtained by making various modifications to the above-described preferred embodiments by those skilled in the art without departing from the scope and spirit of the present invention are also encompassed in the invention. Various devices integrating some of the acoustic wave filter devices, the multiplexers, and the radio-frequency front-end circuits according to various preferred embodiments of the present invention and modifications thereof are also encompassed in the present invention.

For example, the communication apparatus 4 including the above-described radio-frequency front-end circuit and RFIC 3 is also encompassed in the present invention. Such a communication apparatus 4 achieves small-loss, high-selectivity characteristics.

A multiplexer, such as a duplexer, including the above-described filter, is also encompassed in the present invention. That is, in a multiplexer including plural filters connected to a common terminal, one of the above-described filters may be used as at least one of the filters of the multiplexer.

Among acoustic wave resonators defining a filter, at least one of one or more of the acoustic wave resonators other than the acoustic wave resonator connected to an interdigital capacitor without another acoustic wave resonator being interposed therebetween may be an acoustic wave resonator using bulk waves or boundary acoustic waves.

The interdigital capacitor and the first acoustic wave resonator are connected to each other without another acoustic wave resonator interposed therebetween. However, this configuration is only an example. The interdigital capacitor and the first acoustic wave resonator may be connected to each other with another acoustic wave resonator interposed therebetween. With this configuration, too, advantages similar to those described above are achieved.

In the multiplexer, the radio-frequency front-end circuit, or the communication apparatus, an inductor or a capacitor may be connected between the components of the multiplexer, the radio-frequency front-end circuit, or the communication apparatus. In this case, a wiring inductor defined by wiring for connecting the components may be an example of the inductor.

Preferred embodiments of the present invention and modifications thereof can widely be used in communication apparatuses, such as cellular phones, as small-loss filters, multiplexers, front-end circuits, and communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
a first acoustic wave resonator including an InterDigital Transducer (IDT) electrode defined by a plurality of first electrode fingers; and
an interdigital capacitor that is defined by a plurality of second electrode fingers and is connected to the first acoustic wave resonator; wherein
a pitch of the plurality of second electrode fingers is smaller than a pitch of the plurality of first electrode fingers;
a film thickness of the plurality of second electrode fingers is smaller than a film thickness of the plurality of first electrode fingers; and
a self-resonant frequency of the interdigital capacitor is higher than a pass band of the acoustic wave filter device.

2. The acoustic wave filter device according to claim 1, wherein the interdigital capacitor is connected to the first acoustic wave resonator without another acoustic wave resonator being interposed therebetween.

3. The acoustic wave filter device according to claim 1, wherein a duty ratio of the interdigital capacitor is greater than a duty ratio of the first acoustic wave resonator, the duty ratio of the interdigital capacitor being a ratio of a width of each of the plurality of second electrode fingers to a pitch of the plurality of second electrode fingers, the duty ratio of the first acoustic wave resonator being a ratio of a width of each of the plurality of first electrode fingers to a pitch of the plurality of first electrode fingers.

4. The acoustic wave filter device according to claim 1, wherein the first acoustic wave resonator and the interdigital capacitor define a first resonance circuit disposed on one of first and second paths, the first path connecting first and second input-output terminals, the second path connecting a ground and a node provided on the first path;
the acoustic wave filter device further comprising:
a second resonance circuit;
the second resonance circuit including: one or more second acoustic wave resonators; wherein
the second resonance circuit is disposed on the other one of the first and second paths and determines the pass band together with the first resonance circuit.

5. The acoustic wave filter device according to claim 4, wherein
the first resonance circuit is disposed on the second path;
the second resonance circuit is disposed on the first path;
the first resonance circuit further includes a switch element;
the switch element is connected in parallel with the interdigital capacitor and defines a variable frequency circuit together with the interdigital capacitor, the variable frequency circuit being used to vary a frequency of the first acoustic wave resonator; and
the variable frequency circuit is connected in series with the first acoustic wave resonator between the node and the ground.

6. The acoustic wave filter device according to claim 5, wherein
the first resonance circuit further includes a third acoustic wave resonator;
the third acoustic wave resonator is connected in parallel with a series circuit of the first acoustic wave resonator and the variable frequency circuit; and
a resonant frequency of the third acoustic wave resonator is different from a resonant frequency of the first acoustic wave resonator, and an anti-resonant frequency of the third acoustic wave resonator is different from an anti-resonant frequency of the first acoustic wave resonator.

7. The acoustic wave filter device according to claim 6, wherein
the resonant frequency of the third acoustic wave resonator is lower than the resonant frequency of the first acoustic wave resonator;
the anti-resonant frequency of the third acoustic wave resonator is lower than the anti-resonant frequency of the first acoustic wave resonator; and
the variable frequency circuit is connected in series with only the first acoustic wave resonator of the first and third acoustic wave resonators.

8. The acoustic wave filter device according to claim 6, wherein
the resonant frequency of the third acoustic wave resonator is higher than the resonant frequency of the first acoustic wave resonator;
the anti-resonant frequency of the third acoustic wave resonator is higher than the anti-resonant frequency of the first acoustic wave resonator; and
the variable frequency circuit is connected in series with only the first acoustic wave resonator of the first and third acoustic wave resonators.

9. The acoustic wave filter device according to claim 5, wherein
the first resonance circuit further includes a third acoustic wave resonator;
the variable frequency circuit is connected in series with a parallel circuit including the first and third acoustic wave resonators; and
a resonant frequency of the third acoustic wave resonator is different from a resonant frequency of the first acoustic wave resonator, and an anti-resonant frequency of the third acoustic wave resonator is different from an anti-resonant frequency of the first acoustic wave resonator.

10. The acoustic wave filter device according to claim 5, wherein
the first resonance circuit further includes a third acoustic wave resonator and a different variable frequency circuit connected in series with the third acoustic wave resonator; and
a series circuit of the third acoustic wave resonator and the different variable frequency circuit is connected in parallel with a series circuit of the first acoustic wave resonator and the variable frequency circuit.

11. The acoustic wave filter device according to claim 5, wherein
the variable frequency circuit further includes an inductor connected in series with the switch element; and
a series circuit including the switch element and the inductor is connected in parallel with the interdigital capacitor.

12. The acoustic wave filter device according to claim 4, wherein
the first resonance circuit is disposed on the first path;
the second resonance circuit is disposed on the second path; and
the first acoustic wave resonator and the interdigital capacitor are connected in parallel with each other.

13. The acoustic wave filter device according to claim 12, wherein
the first resonance circuit further includes a switch element;
the switch element is connected in series with the interdigital capacitor and defines a variable frequency circuit together with the interdigital capacitor; and
the variable frequency circuit is connected in parallel with the first acoustic wave resonator.

14. The acoustic wave filter device according to claim 1, wherein the film thickness of the plurality of second electrode fingers is 40% or smaller than the pitch of the plurality of second electrode fingers.

15. The acoustic wave filter device according to claim 1, wherein the pitch of the plurality of second electrode fingers is 80% or smaller than the pitch of the plurality of first electrode fingers.

16. A multiplexer comprising:
a common terminal;
a first filter that is the acoustic wave filter device according to claim 12, the first input-output terminal of the first filter being directly or indirectly connected to the common terminal; and
at least one second filter, one of input-output terminals of the at least one second filter being directly or indirectly connected to the common terminal; wherein
a center frequency of a pass band of each of the at least one second filter is higher than a center frequency of a pass band of the first filter;
the first filter includes at least one resonance circuit disposed on the first path, the at least one resonance circuit including the first resonance circuit; and
in the first filter, the first resonance circuit is connected to the first input-output terminal without another resonance circuit being interposed therebetween.

17. A multiplexer comprising:
a common terminal;
a first filter that is the acoustic wave filter device according to claim 13, the first input-output terminal of the first filter being directly or indirectly connected to the common terminal; and
at least one second filter, one of input-output terminals of the at least one second filter being directly or indirectly connected to the common terminal; wherein
a center frequency of a pass band of each of the at least one second filter is higher than a center frequency of a pass band of the first filter;
the first filter includes at least one resonance circuit disposed on the first path, the at least one resonance circuit including the first resonance circuit; and
in the first filter, the first resonance circuit is connected to the first input-output terminal without another resonance circuit being interposed therebetween.

18. The multiplexer according to claim 17, further comprising:
a switch circuit including a switch common terminal and first and second selection terminals, the first selection terminal being connected to the second input-output terminal, the second selection terminal being connected to the other one of the input-output terminals of the second filter, the switch circuit switching between connection of the switch common terminal to the first selection terminal and connection of the switch common terminal to the second selection terminal; wherein
when the switch common terminal and the second selection terminal are connected to each other, the switch element is ON.

19. A radio-frequency front-end circuit comprising:
the acoustic wave filter device according to claim 1; and
an amplifier circuit connected to the acoustic wave filter device.

20. A communication apparatus comprising:
an RF signal processing circuit that processes a radio-frequency signal received by an antenna device and a radio-frequency signal to be transmitted by the antenna device; and
the radio-frequency front-end circuit according to claim 19 that transfers the radio-frequency signals between the antenna device and the RF signal processing circuit.

* * * * *